(12) United States Patent
Dai et al.

(10) Patent No.: US 11,699,397 B2
(45) Date of Patent: Jul. 11, 2023

(54) DISPLAY SUBSTRATE, MANUFACTURING METHOD THEREOF, AND DISPLAY DEVICE HAVING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jie Dai, Beijing (CN); Pengfei Yu, Beijing (CN); Shun Zhang, Beijing (CN); Lu Bai, Beijing (CN); Siyu Wang, Beijing (CN); Mengqi Wang, Beijing (CN); Hao Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/256,563

(22) PCT Filed: Mar. 16, 2020

(86) PCT No.: PCT/CN2020/079482
§ 371 (c)(1),
(2) Date: Dec. 28, 2020

(87) PCT Pub. No.: WO2021/184158
PCT Pub. Date: Sep. 23, 2021

(65) Prior Publication Data
US 2021/0312869 A1   Oct. 7, 2021

(51) Int. Cl.
G09G 3/3266     (2016.01)

(52) U.S. Cl.
CPC ... G09G 3/3266 (2013.01); *G09G 2300/0426* (2013.01); *G09G 2310/0286* (2013.01); *G09G 2310/08* (2013.01)

(58) Field of Classification Search
CPC ......... G09G 3/3266; G09G 2300/0426; G09G 2310/0286; G09G 2310/08
See application file for complete search history.

(56) References Cited

U.S. PATENT DOCUMENTS 10,177,172 B2   1/2019   Wu et al.
10,467,938 B1 * 11/2019  Xiang ................. G09G 3/3266
(Continued)

FOREIGN PATENT DOCUMENTS

CN   101925946 A   12/2010
CN   103098376 A   5/2013
(Continued)

OTHER PUBLICATIONS

Office Action dated Jan. 5, 2022 in U.S. Appl. No. 17/256,597, 15 pages.
(Continued)

*Primary Examiner* — Stacy Khoo
(74) *Attorney, Agent, or Firm* — Muncy, Geissler, Olds & Lowe, P.C.

(57) ABSTRACT

The present disclosure provides a display substrate, a manufacturing method and a display device. The display substrate comprises a scan driving circuit and a display area, wherein the scan driving circuit comprises a plurality of shift register units, a first voltage signal line, a second voltage signal line, a first clock signal line, and a second clock signal line, all of which extend in a first direction; and the display area comprises at least one driving transistor configured to drive a light-emitting element for display. At least one of the plurality of shift register units comprises an output circuit (Continued)

and a signal output line, wherein the output circuit is coupled to the first voltage signal line, the second voltage signal line, and the signal output line, and the signal output line extends in a second direction intersecting the first direction. The output circuit comprises a transistor that is provided between the first voltage signal line and the second voltage signal line.

20 Claims, 14 Drawing Sheets

(56) References Cited

U.S. PATENT DOCUMENTS

| | | | |
|---|---|---|---|
| 10,810,962 B2 | 10/2020 | Ono et al. | |
| 2006/0022201 A1* | 2/2006 | Kim | G02F 1/1339 257/72 |
| 2008/0079001 A1* | 4/2008 | Umezaki | G02F 1/1368 257/E27.111 |
| 2009/0224245 A1 | 9/2009 | Umezaki | |
| 2010/0295841 A1 | 11/2010 | Matsuda et al. | |
| 2013/0147524 A1 | 6/2013 | Hachida et al. | |
| 2015/0138466 A1 | 5/2015 | Mori | |
| 2016/0118409 A1 | 4/2016 | Jin et al. | |
| 2016/0247478 A1 | 8/2016 | Ishige | |
| 2016/0275902 A1 | 9/2016 | Xue et al. | |
| 2016/0351156 A1 | 12/2016 | Wu et al. | |
| 2017/0186376 A1 | 6/2017 | Kuang et al. | |
| 2019/0295472 A1 | 9/2019 | Yang et al. | |
| 2019/0304394 A1* | 10/2019 | Lin | G09G 3/3677 |
| 2019/0340969 A1* | 11/2019 | Hu | G09G 3/3266 |
| 2020/0052033 A1 | 2/2020 | Iguchi | |
| 2020/0066209 A1 | 2/2020 | Zhang et al. | |
| 2021/0092313 A1 | 3/2021 | Sakakibara | |
| 2021/0295780 A1 | 9/2021 | Ikeda et al. | |

FOREIGN PATENT DOCUMENTS

| | | |
|---|---|---|
| CN | 104318909 A | 1/2015 |
| CN | 104332126 A | 2/2015 |
| CN | 104658506 A | 5/2015 |
| CN | 105206225 A | 12/2015 |
| CN | 110095889 A | 8/2019 |
| CN | 110867158 A | 3/2020 |
| JP | 2019149713 A | 9/2019 |

OTHER PUBLICATIONS

Extended European Search Report application No. EP20897676 dated Feb. 1, 2023, 12 pages.

* cited by examiner

DISPLAY SUBSTRATE, MANUFACTURING METHOD THEREOF, AND DISPLAY DEVICE HAVING THE SAME

CROSS-REFERENCE TO RELATED APPLICATION

The present application is the U.S. national phase of PCT Application No. PCT/CN2020/079482 filed on Mar. 16, 2020, which is incorporated herein by reference in its entity.

TECHNICAL FIELD

The present disclosure relates to the field of display technology, in particular to a display substrate, a manufacturing method thereof, and a display device having the same.

BACKGROUND

Active Matrix Organic Light-Emitting Diode (hereinafter abbreviated to AMOLED) display panels are widely used in various fields due to their low power consumption, low production cost, and wide color gamut.

The AMOLED display panel includes a pixel circuit located in a display area and a scan driving circuit located in an edge area. The pixel circuit includes a plurality of sub-pixel circuits distributed in the form of an array, and the scan driving circuit includes a plurality of shift register units, each configured to provide a light emission control signal for the corresponding sub-pixel circuit. Since the scan driving circuit is arranged in the edge area of the AMOLED display panel, the arrangement of the scan driving circuit determines a bezel width of the AMOLED display panel.

SUMMARY

In an aspect, embodiments of the present disclosure provides a display substrate, including a scan driving circuit and a display area provided on a base substrate, the scan driving circuit comprising a plurality of shift register units and further comprising a first voltage signal line, a second voltage signal line, a first clock signal line, and a second clock signal line, all of which extend in a first direction, and the display area including at least one driving transistor configured to drive a light-emitting element for display. At least one of the plurality of shift register units includes an output circuit and a signal output line, wherein the output circuit is coupled to the first voltage signal line, the second voltage signal line, and the signal output line, and the signal output line extends in a second direction intersecting the first direction. The output circuit includes a transistor that is provided between the first voltage signal line and the second voltage signal line.

Optionally, the first voltage signal line provides a first voltage to the output circuit, and the second voltage signal line provides a second voltage which is lower than the first voltage to the output circuit.

Optionally, the signal output line is located between the output circuits in adjacent ones of the shift register units.

Optionally, the first voltage signal line is located on a side of the second voltage signal line distal to the display area.

Optionally, the output circuit includes an output transistor and an output reset transistor, which are arranged along the first direction. A first electrode of the output reset transistor is coupled to the first voltage signal line, and a first electrode of the output transistor is coupled to the second voltage signal line. A second electrode of the output transistor and a second electrode of the output reset transistor are both coupled to the signal output line.

Optionally, active layers of the output transistor and the output reset transistor are formed by one continuous first semiconductor layer. The first semiconductor layer and the signal output line are arranged along the first direction.

Optionally, a gate electrode of the output reset transistor includes at least one output reset gate pattern, the first electrode of the output reset transistor includes at least one first electrode pattern, and the second electrode of the output reset transistor includes at least one second electrode pattern. The output reset gate pattern is located between the first electrode pattern and the second electrode pattern, which are adjacent to each other. The second electrode pattern, the output reset gate pattern, and the first electrode pattern all extend in the second direction intersecting the first direction.

Optionally, a gate electrode of the output transistor includes at least one output gate pattern, a first electrode of the output transistor includes at least one third electrode pattern, and the second electrode of the output transistor includes at least one fourth electrode pattern. The output gate pattern is located between the third electrode pattern and the fourth electrode pattern, which are adjacent to each other. The fourth electrode pattern, the output gate pattern, and the third electrode pattern all extend in the second direction intersecting the first direction. The second electrode pattern in the output reset transistor that is closest to the gate electrode of the output transistor is multiplexed as the fourth electrode pattern of the output transistor.

Optionally, the active layer of the output reset transistor includes at least two first conductive portions which are spaced apart along the first direction, and at least one first channel portion each provided between two adjacent ones of the first conductive portions. The first channel portion(s) correspond to the output reset gate pattern(s) in a one-to-one relationship, and an orthogonal projection of each of the first channel portions on the base substrate falls inside an orthogonal projection of a corresponding one of the output reset gate patterns on the base substrate. A part of the first conductive portions in the output reset transistor corresponds to the first electrode patterns in a one-to-one relationship, and an orthogonal projection of the first electrode pattern on the base substrate has a first overlap area with an orthogonal projection of a corresponding one of the first conductive portions on the base substrate, and the first electrode pattern is coupled to the corresponding first conductive portion through at least one first via hole provided in the first overlap area. The other part of the first conductive portions in the output reset transistor corresponds to the second electrode patterns in a one-to-one relationship, and an orthogonal projection of the second electrode pattern on the base substrate has a second overlap area with an orthogonal projection of a corresponding one of the first conductive portions on the base substrate, and the second electrode pattern is coupled to the corresponding first conductive portion through at least one second via hole provided in the second overlap area.

Optionally, an active layer of the output transistor includes at least two second conductive portions which are spaced apart along the first direction, and at least one second channel portion each provided between two adjacent ones of the second conductive portions. The second channel portion(s) corresponds to the output gate pattern(s) in a one-to-one relationship, and an orthogonal projection of each of the second channel portions on the base substrate falls inside an orthogonal projection of a corresponding one of the output gate patterns on the base substrate. A part of the second conductive portions in the output transistor corresponds to the third electrode patterns in a one-to-one relationship, and an orthogonal projection of the third electrode pattern on the base substrate has a third overlap area with an orthogonal projection of a corresponding one of the second conductive portions on the base substrate, and the third electrode pattern is coupled to the corresponding second conductive portion through at least one third via hole provided in the third overlap area. The other part of the second conductive portions in the output transistor corresponds to the fourth electrode patterns in a one-to-one relationship, and an orthogonal projection of the fourth electrode pattern on the base substrate has a fourth overlap area with an orthogonal projection of a corresponding one of the second conductive portions on the base substrate, and the fourth electrode pattern is coupled to the corresponding second conductive portion through at least one fourth via hole in the fourth overlap area.

Optionally, the number of the first voltage signal line is one. The output circuit includes an output reset transistor, and the at least one shift register unit further includes an output capacitor, a first transistor, and a second capacitor connecting transistor. A first electrode of the output reset transistor, a first plate of the output capacitor, a first electrode of the first transistor, and a first electrode of the second capacitor connecting transistor are all coupled to the first voltage signal line.

Optionally, the display substrate further includes a third voltage signal line, wherein the first voltage signal line is located between the second voltage signal line and the third voltage signal line.

Optionally, the first electrode of the second capacitor connecting transistor is coupled to a signal line conductive connection portion through a fifth connection via hole, and the signal line conductive connection portion is coupled to the first voltage signal line so as to allow the first electrode of the second capacitor connecting transistor to be coupled to the first voltage signal line. The signal line conductive connection portion and the first voltage signal line are contained in a source-drain metal layer, and the first electrode of the second capacitor connecting transistor is contained in an active layer.

Optionally, the at least one shift register unit further includes a first capacitor. An orthogonal projection of the signal line conductive connection portion on the base substrate partially overlaps an orthogonal projection of a first plate of the first capacitor on the base substrate.

Optionally, an orthogonal projection of the first plate of the output capacitor on the base substrate has a signal line overlap area with an orthogonal projection of the first voltage signal line on the base substrate, and the first plate of the output capacitor is coupled to the first voltage signal line through at least one signal line via hole provided in the signal line overlap area.

Optionally, the at least one shift register unit further includes a first node control transistor and a second capacitor. A gate electrode of the first node control transistor is coupled to a second plate of the second capacitor. An orthogonal projection of a first plate of the second capacitor on the base substrate falls inside an orthogonal projection of the second plate of the second capacitor on the base substrate. The first plate of the second capacitor is L-shaped. The first plate of the second capacitor includes a second horizontal plate portion. An orthogonal projection of the gate electrode of the first node control transistor on the base substrate and an orthogonal projection of the second horizontal plate portion on the base substrate are arranged in the first direction.

Optionally, the scan driving circuit further includes a third voltage signal line, which extends in the first direction and located on a side of the first voltage signal line distal to the second voltage signal line; and the first node control transistor is located between the third voltage signal line and the first voltage signal line. The first plate of the second capacitor further includes a second vertical plate portion coupled with the second horizontal plate portion, and an orthogonal projection of the second vertical plate portion on the base substrate partially overlaps an orthogonal projection of the third voltage signal line on the base substrate.

Optionally, the first clock signal line is located on a side of the third voltage signal line distal to the first voltage signal line. The output circuit includes an output transistor, and the at least one shift register unit further includes a second conductive connection portion, which is provided between a gate electrode of the output transistor and the second plate of the second capacitor, and which is coupled to the gate electrode of the output transistor and the second plate of the second capacitor. The at least one shift register unit further includes a third conductive connection portion coupled with the second plate of the second capacitor. An orthogonal projection of the third conductive connection portion on the base substrate has a sixth overlap area with an orthogonal projection of the first clock signal line on the base substrate, and the first clock signal line is coupled to the first plate of the second capacitor through at least one sixth via hole provided in the sixth overlap area.

Optionally, the first node control transistor includes a second active pattern, which is U-shaped. The second active pattern includes a first first node control channel portion, a second first node control channel portion, a first first node control conductive portion coupled to the first first node control channel portion, and a second first node control conductive portion coupled to the second first node control channel portion. The gate electrode of the first node control transistor includes a first gate pattern and a second gate pattern that are coupled to each other. The first gate pattern corresponds to the first first node control channel portion, and the second gate pattern corresponds to the second first node control channel portion. The first first node control conductive portion corresponds to a second electrode of the first node control transistor, and the second first node control conductive portion corresponds to a first electrode of the first node control transistor.

Optionally, the at least one shift register unit further includes a second node control transistor and a second capacitor connecting transistor. A second electrode of the second node control transistor and a second electrode of the first node control transistor are coupled through a fourth conductive connection portion. The at least one shift register unit further includes a fifth conductive connection portion coupled to a gate electrode of the second capacitor connecting transistor, and an orthogonal projection of the fifth conductive connection portion on the base substrate has a seventh overlap area with an orthogonal projection of the fourth conductive connection portion on the base substrate. The fifth conductive connection portion is coupled to the fourth conductive connection portion through a seventh via hole provided in the seventh overlap area.

Optionally, the scan driving circuit further includes a third voltage signal line, which is located on a side of the first voltage signal line distal to the second voltage signal line. A first electrode of the first node control transistor is coupled to a sixth conductive connection portion, and a gate electrode of the second node control transistor is coupled to a seventh conductive connection portion. There is an eighth overlap area between an orthogonal projection of the sixth conductive connection portion on the base substrate and an orthogonal projection of the seventh conductive connection portion on the base substrate, and the sixth conductive connection portion is coupled to the seventh conductive connection portion through an eighth via hole provided in the eighth overlap area. A first electrode of the second node control transistor is coupled to the third voltage signal line.

Optionally, a gate electrode of the second node control transistor is further coupled to an eighth conductive connection portion, and there is a ninth overlap area between an orthogonal projection of the eighth conductive connection portion on the base substrate and an orthogonal projection of the second clock signal line on the base substrate, and the eighth conductive connection portion is coupled to the second clock signal line through a ninth via hole provided in the ninth overlap area.

Optionally, the scan driving circuit further includes a third voltage signal line which extends in the first direction. The second clock signal line is provided between the first clock signal line and the third voltage signal line; or, the first clock signal line is provided between the second clock signal line and the third voltage signal line.

Optionally, the at least one shift register unit further includes an input transistor. A first electrode of the input transistor is coupled to an input signal terminal. A second electrode of the input transistor is coupled to a ninth conductive connection portion, and there is a tenth overlap area between an orthogonal projection of the ninth conductive connection portion on the base substrate and an orthogonal projection of the second plate of the second capacitor on the base substrate, and the ninth conductive connection portion is coupled to the second plate of the second capacitor through a tenth via hole provided in the tenth overlap area.

Optionally, the at least one shift register unit further includes a third node control transistor, a second capacitor connecting transistor and an input transistor. A gate electrode of the third node control transistor is coupled to the first clock signal line. An active layer of the input transistor, an active layer of the third node control transistor, and an active layer of the second capacitor connecting transistor are formed by one continuous third semiconductor layer. The active layer of the input transistor includes a first fifth conductive portion, a fifth channel portion, and a second fifth conductive portion arranged in order along the first direction. The second fifth conductive portion is multiplexed as a first sixth conductive portion. The active layer of the third node control transistor includes the first sixth conductive portion, a sixth channel portion, and a second sixth conductive portion arranged in order along the first direction. The second sixth conductive portion is multiplexed as a first seventh conductive portion. The active layer of the second capacitor connecting transistor includes the first seventh conductive portion, a seventh channel portion, and a second seventh conductive portion arranged in order along the first direction.

Optionally, the scan driving circuit further includes a third voltage signal line, which extends in the first direction. An orthogonal projection of the third voltage signal line on the base substrate, an orthogonal projection of the first clock signal line on the base substrate, and an orthogonal projection of the second clock signal line on the base substrate are all located one a side of an orthogonal projection of the shift register unit on the base substrate distal to the display area of the display substrate.

Optionally, the scan driving circuit further includes a third voltage signal line, and the at least one shift register unit further comprises an output capacitor, a first capacitor, a second capacitor, a first transistor, a second transistor, a first capacitor connecting transistor, a second capacitor connecting transistor, a first node control transistor, a second node control transistor, an input transistor, and a third node control transistor. A second electrode of the first transistor is coupled to a second plate of the output capacitor, a first electrode of the first transistor is coupled to the first voltage signal line, and a gate electrode of the first transistor is coupled to a second electrode of the third node control transistor. A first electrode of the second transistor is coupled to a first plate of the first capacitor, a second electrode of the second transistor is coupled to a second electrode of the first capacitor connecting transistor, and a gate electrode of the second transistor is coupled to a gate electrode of the third node control transistor. A gate electrode of the first capacitor connecting transistor and a gate electrode of the second capacitor connecting transistor are coupled to a second plate of the first capacitor, a second electrode of the first capacitor connecting transistor is coupled to the first plate of the first capacitor, and a first electrode of the first capacitor connecting transistor is coupled to the gate electrode of the second transistor. A first electrode of the second capacitor connecting transistor is coupled to the first voltage signal line, the gate electrode of the second capacitor connecting transistor is coupled to a second electrode of the second node control transistor, and a second electrode of the second capacitor connecting transistor is coupled to the first electrode of the third node control transistor. A first electrode of the first node control transistor is coupled to a gate electrode of the second node control transistor, and a gate electrode of the first node control transistor is coupled to a second plate of the second capacitor. A second electrode of the second node control transistor is coupled to a second electrode of the first node control transistor, the gate electrode of the second node control transistor is coupled to the second clock signal line, and a first electrode of the second node control transistor is coupled to the third voltage signal line. A gate electrode of the input transistor is coupled to a gate electrode of the second node control transistor, a first electrode of the input transistor is coupled to an input signal terminal, and a second electrode of the input transistor is coupled to the second plate of the second capacitor. The gate electrode of the third node control transistor is coupled to the first clock signal line. A first plate of the output capacitor is coupled to the first voltage signal line, and the second plate of the output capacitor is coupled to a gate electrode of the output reset transistor. The second plate of the second capacitor is coupled to a gate electrode of the output transistor, and a first plate of the second capacitor is coupled to the first clock signal line. A second electrode of the output transistor and a second electrode of the output reset transistor are both coupled to the signal output line.

Optionally, the first clock signal line, the second clock signal line, and the third voltage signal line are arranged in order along a direction getting closer to the display area; or, the second clock signal line, the first clock signal line, and the third voltage signal line are arranged in order along the direction getting closer to the display area.

Optionally, the first plate of the first capacitor includes a first horizontal plate portion and a first vertical plate portion. The output transistor and the output reset transistor are provided between the first voltage signal line and the second voltage signal line, and the output reset transistor, the output transistor and the signal output lines are arranged in order along the first direction. The third voltage signal line is provided on a side of the first voltage signal line distal to the second voltage signal line. The first capacitor, the first transistor, the second transistor, the first capacitor connecting transistor, the second capacitor connecting transistor, the first node control transistor, the second node control transistor, the input transistor and the third node control transistor are all provided between the first voltage signal line and the third voltage signal line. The first transistor, the second transistor, and the first vertical plate portion are arranged in order along the first direction. The input transistor, the third node control transistor, the second capacitor connecting transistor, and the first horizontal plate portion are arranged in order along the first direction. The second node control transistor and the first node control transistor are arranged in order along the first direction. An orthogonal projection of the gate electrode of the first capacitor connecting transistor on the base substrate is located between an orthogonal projection of the second plate of the first capacitor on the base substrate and an orthogonal projection of the first voltage signal line on the base substrate. An orthogonal projection of the gate electrode of the second transistor on the base substrate is located between an orthogonal projection of the gate electrode of the third node control transistor on the base substrate and an orthogonal projection of the first voltage signal line on the base substrate. An orthogonal projection of the gate electrode of the first node control transistor on the base substrate is located between an orthogonal projection of the third voltage signal line on the base substrate and an orthogonal projection of the first plate of the first capacitor on the base substrate. A minimum distance in the second direction between the orthogonal projection of the gate electrode of the first node control transistor on the base substrate and the orthogonal projection of the third voltage signal line on the base substrate is greater than a minimum distance in the second direction between the orthogonal projection of the gate electrode of the second capacitor connecting transistor on the base substrate and the orthogonal projection of the third voltage signal line on the base substrate.

Optionally, an orthogonal projection of the first plate of the output capacitor on the base substrate has a signal line overlap area with the orthogonal projection of the first voltage signal line on the base substrate, and an orthogonal projection of the output capacitor on the base substrate partially overlaps the orthogonal projection of the first voltage signal line on the base substrate. An orthogonal projection of the first plate of the second capacitor on the base substrate falls inside an orthogonal projection of the second plate of the second capacitor on the base substrate, and the first plate of the second capacitor is L-shaped. The first plate of the second capacitor includes a second horizontal plate portion and a second vertical plate portion. The gate electrode of the first node control transistor and the second horizontal plate portion are arranged along the first direction. An orthogonal projection of the second vertical plate portion on the base substrate partially overlaps the orthogonal projection of the third voltage signal line on the base substrate.

Optionally, the display substrate further includes a plurality of row pixel circuits provided on the base substrate, the pixel circuit including a light emission control terminal. The shift register units that the scan driving circuit includes correspond to the row pixel circuits in one-to-one relationship. The signal output line of the shift register unit is coupled to the light emission control terminal of a corresponding one of the row pixel circuits, and is configured to provide a light emission control signal to the light emission control terminal of the corresponding row pixel circuit.

In a second aspect, embodiments of the present disclosure further provide a method manufacturing of a display substrate, including making a scan driving circuit on a base substrate, and making at least one driving transistor, which is configured to drive a light-emitting element for display, in a display area contained in the display substrate. The scan driving circuit includes a plurality of shift register units, a first voltage signal line, a second voltage signal line, a first clock signal line, and a second clock signal line, and at least one of the plurality of shift register units comprises an output circuit and a signal output line. The manufacturing method of the display substrate further includes: making a transistor contained in the output circuit between the first voltage signal line and the second voltage signal line; providing the first voltage signal line, the second voltage signal line, the first clock signal line, and the second clock signal line to extend in a first direction, and providing a signal output line to extend in a second direction intersecting the first direction.

Optionally, the manufacturing method of a display substrate according to at least embodiments of the present disclosure further includes providing the signal output line between the output circuits in adjacent ones of the shift register units.

Optionally, the first voltage signal line is located on a side of the second voltage signal line distal to the display area.

Optionally, the output circuit includes an output transistor and an output reset transistor, and the making the transistor contained in the output circuit includes: forming a first semiconductor layer between the first voltage signal line and the second voltage signal line; making a first gate metal layer on a side of the first semiconductor layer facing away from the base substrate, and subjecting the first gate metal layer to a patterning process to form a gate electrode of the output transistor and a gate electrode of the output reset transistor; doping a portion of the first semiconductor layer that is not covered by the gate electrodes by using the gate electrode of the output transistor and the gate electrode of the output reset transistor as a mask, so that the portion of the first semiconductor layer that is not covered by the gate electrodes forms a conductive portion, and a portion of the first semiconductor layer that is covered by the gate electrodes forms a channel portion.

Optionally, the manufacturing method of a display substrate according to at least embodiments of the present disclosure further includes: providing a second gate metal layer on a side of the first gate metal layer facing away from the first semiconductor layer, and subjecting the second gate metal layer to a patterning process to form a signal output line extending in the second direction. An orthogonal projection of the first semiconductor layer on the base substrate and an orthogonal projection of the signal output line on the base substrate are arranged along the first direction intersecting the second direction.

Optionally, making the first voltage signal line, the second voltage signal line, the first clock signal line, and the second clock signal line includes: making a source-drain metal layer on a side of the second gate metal layer facing away from the first gate metal layer, and subjecting the source-drain metal layer to a patterning process to form the first voltage signal line, the second voltage signal line, the first clock signal line, and the second clock signal line.

Optionally, the number of the first voltage signal line is one. The output circuit includes an output reset transistor. The at least one shift register unit further includes an output capacitor, a first plate and a second capacitor connecting transistor. The manufacturing method of the display substrate further includes: providing a first electrode of the output reset transistor, a first plate of the output capacitor, a first electrode of the first transistor, and a first electrode of the second capacitor connecting transistor to be all coupled to the first voltage signal line.

In a third aspect, embodiments of the present disclosure further provide a display device including the display substrate as described above.

DETAILED DESCRIPTION

The technical solutions of the embodiments of the present disclosure will be clearly and completely described below in conjunction with the drawings in the embodiments of the present disclosure. Obviously, the described embodiments are only a part, rather than all, of the embodiments of the present disclosure. Based on the embodiments in the present disclosure, all other embodiments obtained by those of ordinary skill in the art without exercising any inventive work shall fall within the protection scope of the present disclosure.

Figure 1:
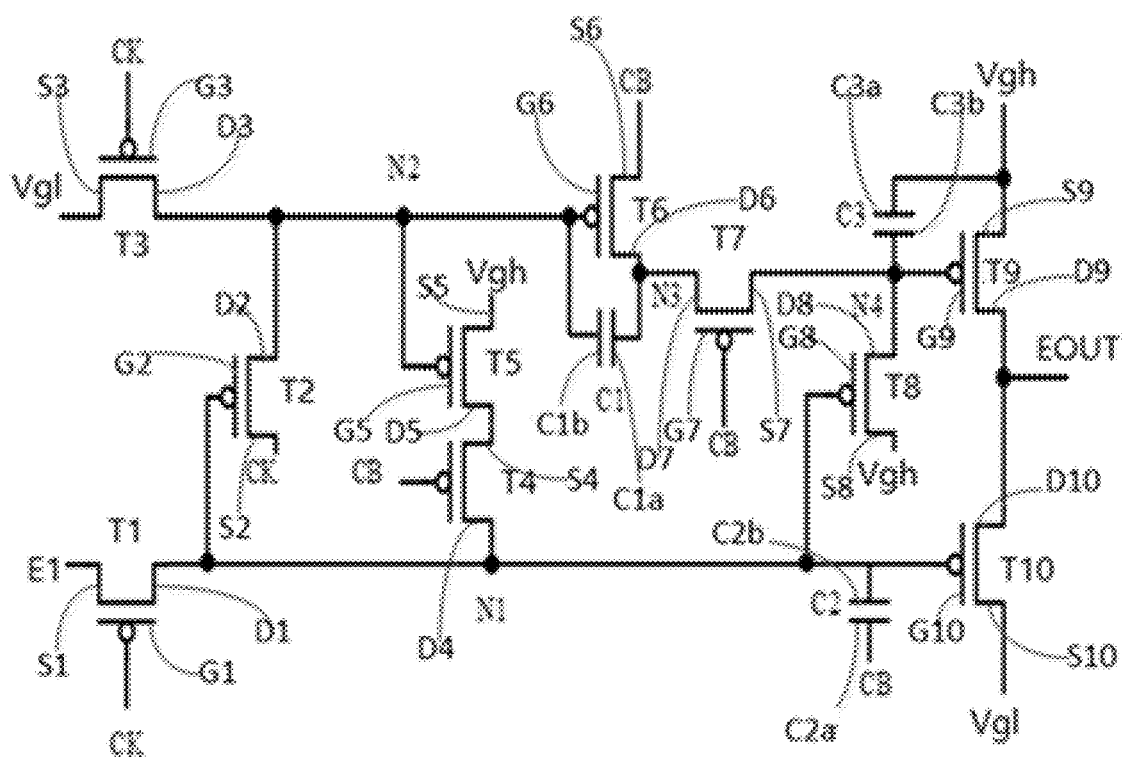
FIG. 1 is a circuit diagram of at least one embodiment of at least one shift register unit included in a display substrate according to an embodiment of the present disclosure.

As shown in FIG. 1, the present disclosure provides a display substrate, which includes a scan driving circuit located in an edge area of a display substrate. The scan driving circuit includes a first voltage signal line VGH, a second voltage signal line VGL1, a third voltage signal line VGL2, a first clock signal line CB, a second clock signal line CK and a signal output line EOUT. The scan driving circuit further includes a plurality of shift register units.

As shown in FIG. 1, at least one embodiment of at least one of the plurality of shift register units includes an output reset transistor T9, an output transistor T10, an output capacitor C3, a first capacitor C1, a second capacitor C2, a first transistor T8, a second transistor T7, a first capacitor connecting transistor T6, a second capacitor connecting transistor T5, a first node control transistor T2, a second node control transistor T3, an input transistor T1, and a third node control transistor T4.

A gate electrode G9 of the output reset transistor T9 is coupled to a second plate C3b of the output capacitor C3, and a high voltage signal Vgh is input into a first electrode S9 of the output reset transistor T9.

A gate electrode G10 of the output transistor T10 is coupled to a second plate C2b of the second capacitor C2, and a low voltage signal Vgl is input into a first electrode S10 of the output transistor T10.

A second electrode D9 of the output reset transistor T9 and a second electrode D10 of the output transistor T10 are both coupled to the signal output line EOUT.

A second electrode D8 of the first transistor T8 is coupled to a second plate C3b of the output capacitor C3, the high voltage signal Vgh is input into a first electrode S8 of the first transistor T8, and a gate electrode G8 of the transistor T8 is coupled to a second electrode D4 of the third node control transistor T4.

A second electrode D7 of the second transistor T7 is coupled to a first plate C1a of the first capacitor C1, a first electrode S7 of the second transistor T7 is coupled to the second plate C3b of the output capacitor C3, and a gate electrode G7 of the second transistor T7 is coupled to a gate electrode G4 of the third node control transistor T4.

A gate electrode G6 of the first capacitor connecting transistor T6 and a gate electrode G5 of the second capacitor connecting transistor T5 are coupled to a second plate C1b of the first capacitor C1, a second electrode D6 of the first capacitor connecting transistor T6 is coupled to the first plate C1a of the first capacitor C1, and a first electrode S6 of the first capacitor connecting transistor T6 is coupled to the gate electrode G7 of the second transistor T7.

A first electrode S5 of the second capacitor connecting transistor T5 is coupled to the first voltage signal line VGH, a gate electrode G5 of the second capacitor connecting transistor T5 is coupled to a second electrode D3 of the second node control transistor T3, and a second electrode D5 of the second capacitor connecting transistor T5 is coupled to a first electrode S4 of the third node control transistor T4.

A first electrode S2 of the first node control transistor T2 is coupled to a gate electrode G3 of the second node control transistor T3, and a gate electrode G2 of the first node control transistor T2 is coupled to a second plate C2b of the second capacitor C2.

A second electrode D3 of the second node control transistor T3 is coupled to a second electrode D2 of the first node control transistor T2, a gate electrode G3 of the second node control transistor T3 is coupled to the second clock signal line CK, and the low voltage signal Vgl is input into a first electrode S3 of the second node control transistor T3.

A gate electrode G1 of the input transistor T1 is coupled to the gate electrode G3 of the second node control transistor T3, a first electrode S1 of the input transistor T1 is coupled to an input signal terminal E1, and a second electrodes D1 of the input transistor T1 is coupled to the second plate C2b of the second capacitor C2.

The gate electrode G4 of the third node control transistor T4 is coupled to the first clock signal line CB.

The high voltage signal Vgh is input into a first plate C3a of the output capacitor C3, and the second plate C3b of the output capacitor C3 is coupled to the gate electrode G9 of the output reset transistor T9.

The second plate C2b of the second capacitor C2 is coupled to the gate electrode G10 of the output transistor T10, and the first plate C2a of the second capacitor C2 is coupled to the first clock signal line CB.

In at least one embodiment of the shift register unit shown in FIG. 1, all the transistors are P-type transistors, but they are not limited thereto.

In the embodiment of the present disclosure, the at least one embodiment of the shift register unit shown in FIG. 1 may be a light emission control scanning driving circuit, but it is not limited thereto.

In at least one embodiment of the present disclosure, a first electrode of the transistor may be a source electrode, and a second electrode of the transistor may be a drain electrode; or alternatively, the first electrode of the transistor may be a drain electrode, and the second electrode of the transistor may be a source electrode.

In FIG. 1, a reference sign N1 represents a first node, a reference sign N2 represents a second node, a reference sign N3 represents a third node, and a reference sign N4 represents a fourth node.

Figure 2A:
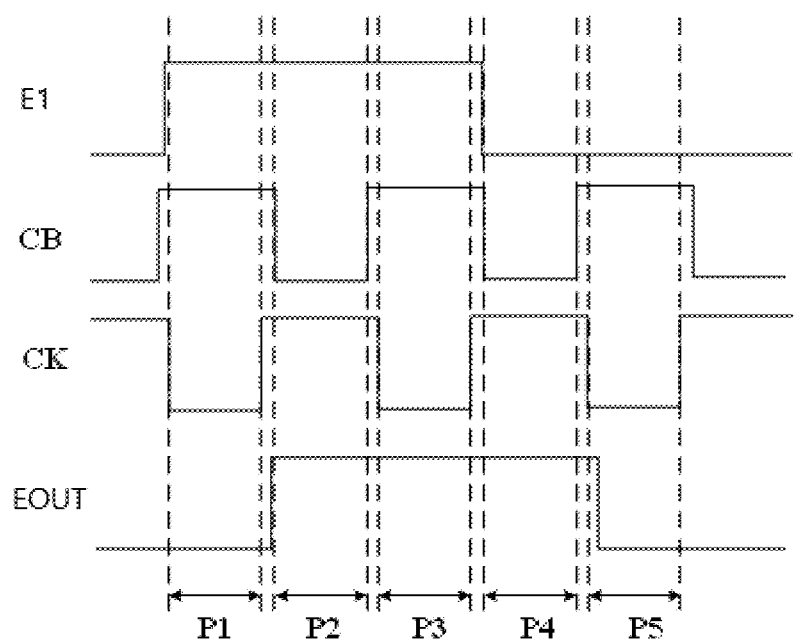
FIG. 2A is an operation timing diagram of at least one embodiment of the shift register unit shown in FIG. 1.

As shown in FIG. 2A, when at least one embodiment of the shift register unit shown in FIG. 1 of the present disclosure is in operation, in a first phase P1, a low level is input from the second clock signal line CK, and the input transistor T1 and the second node control transistor T3 are turned on. The turned-on T1 transmits a high-level input signal provided by the input signal terminal E1 to the first node N1, so that a potential of the first node N1 becomes at a high level so as to turn off the transistors T2, T8, and T10. In addition, the turned-on T3 transmits the low voltage signal Vgl to the second node N2, so that a level of the second node N2 becomes a low level, and the second capacitor connecting transistor T5 and the first capacitor connecting transistor T6 are therefore turned on. Since a high level is input from the first clock signal line CB, the second transistor T7 is turned off. In addition, due to the energy storage effect of the output capacitor C3, a potential of a fourth node N4 can be maintained at a high level, so that the output reset transistor T9 is turned off. In the first phase P1, since the output reset transistor T9 and the output transistor T10 are both turned off, the signal output line EOUT remains outputting the low level.

In a second phase P2, a low level is input from the first clock signal line CB, and the third node control transistor T4 and the second transistor T7 are turned on. Since a high level is input from the second clock signal line CK, the input transistor T1 and the second node control transistor T3 are turned off. Due to the energy storage effect of the first capacitor C1, a potential of the second node N2 can continue to be maintained at the low level of the previous phase, and the second capacitor connecting transistor T5 and the first capacitor connecting transistor T6 are turned on. Moreover, the high voltage signal Vgh is transmitted to the first node N1 through the turned-on T5 and the third node control transistor T4, so that the potential of the first node N1 continues to be maintained at the high level of the previous phase, and the transistors T2, T8, and T10 are therefore turned off. In addition, the low level provided by the first clock signal line CB is transmitted to the fourth node N4 through the turned-on T6 and the second transistor T7, so that the potential of the fourth node N4 becomes at a low level. Consequently, the output reset transistor T9 is turned on and the signal output line EOUT outputs the high voltage signal Vgh.

In a third phase P3, a low level is input from the second clock signal line CK, and the input transistor T1 and the second node control transistor T3 are turned on. The first clock signal line CB provides a high level, so that the third node control transistor T4 and the second transistor T7 are turned off. Due to the energy storage effect of the output capacitor C3, the potential of the fourth node N4 can be maintained at the low level of the previous phase, so that the output reset transistor T9 remains on, and the signal output line EOUT outputs the high voltage signal Vgh.

In a fourth phase P4, a high level is input from the second clock signal line CK, and the input transistor T1 and the second node control transistor T3 are turned off. A low level is input from the first clock signal line CB, and the third node control transistor T4 and the second transistor T7 are turned on. Due to the energy storage effect of the second capacitor C2, the potential of the first node N1 is maintained at the high level of the previous phase, so that the transistors T2, T8 and T10 are turned off. Due to the energy storage effect of the first capacitor C1, the potential of the second node N2 continues to be maintained at the low level of the previous phase, so that the second capacitor connecting transistor T5 and the first capacitor connecting transistor T6 are turned on. In addition, the low voltage signal input by the first clock signal line CB is transmitted to the fourth node N4 through the turned-on transistors T6 and T7, so that the level of the fourth node N4 becomes a low level, and the output reset transistor T9 is turned on. The turned-on T9 outputs the high voltage signal Vgh and the signal output line EOUT outputs the high voltage signal Vgh.

In a fifth phase P5, a low voltage signal is input from the second clock signal line CK, and the input transistor T1 and the second node control transistor T3 are turned on. A high voltage signal is input from the first clock signal line CB, and the third node control transistor T4 and the second transistor T7 are turned off. The turned-on transistor T1 transmits the low-level input signal provided by the input signal terminal E1 to the first node N1, so that the potential of the first node N1 becomes at a low level, and the transistors T2, T8 and T10 are thus turned on. The turned-on transistor T2 transmits a low-level second clock signal to the second node N2, so that the potential of the second node N2 can be further lowered, and the potential of the second node N2 thus continues to be maintained at the low level of the previous phase, and the second capacitor connecting transistor T5 and the first capacitor connecting transistor T6 are turned on. In addition, the turned-on transistor T8 transmits the high voltage signal Vgh to the fourth node N4, so that the potential of the fourth node N4 becomes at a high voltage, and the output reset transistor T9 is thus turned off. The turned-on transistor T10 outputs the low voltage signal Vgl, and the signal output line EOUT outputs the low voltage signal Vgl.

Figure 2B:
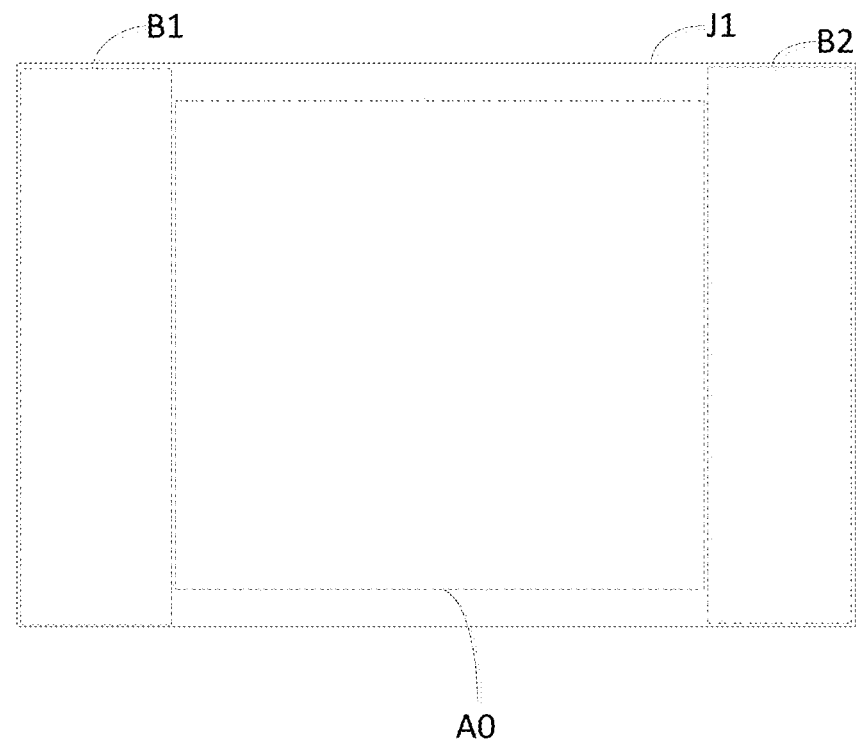
FIG. 2B is a schematic diagram of an area division of the display substrate according to at least one embodiment of the present disclosure.

As shown in FIG. 2B, a reference sign J1 represents a display substrate, a reference sign A0 represents a display area, a reference sign B1 represents a first edge area, and a reference sign B2 represents a second edge area.

The display area A0 of the display substrate J1 may be provided with a plurality of light emission control lines, a plurality of gate lines and a plurality of data lines, and a plurality of sub-pixels defined by the crossing of the plurality of gate lines and the plurality of data lines.

A scan driving circuit may be provided in the first edge area B1 and/or the second edge area B2, and the scan driving circuit includes a plurality of shift register units.

The plurality of shift register units included in the scan driving circuit corresponds to the plurality of light emission control lines in a one-to-one relationship, and a signal output line of each of the shift register units is coupled to a corresponding one of the light emission control lines for providing a light emission control signal to the corresponding light emission control line.

In a specific implementation, one of the light emission control lines is coupled to a light emission control terminal of a corresponding row pixel circuit.

Optionally, the display substrate further includes multi-row pixel circuits provided on the base substrate, and the pixel circuit includes a light emission control terminal.

The shift register units included in the scan driving circuit correspond to the row pixel circuits in a one-to-one relationship, and the signal output line of the shift register unit is coupled to the light emission control terminal of the corresponding-row pixel circuit for providing the light emission control signal to the light emission control terminal of the corresponding-row pixel circuit.

In at least one embodiment of the present disclosure, the pixel circuit may be provided in an effective display area of the display substrate, and the scan driving circuit may be provided in the edge area of the display substrate.

Figure 2C:
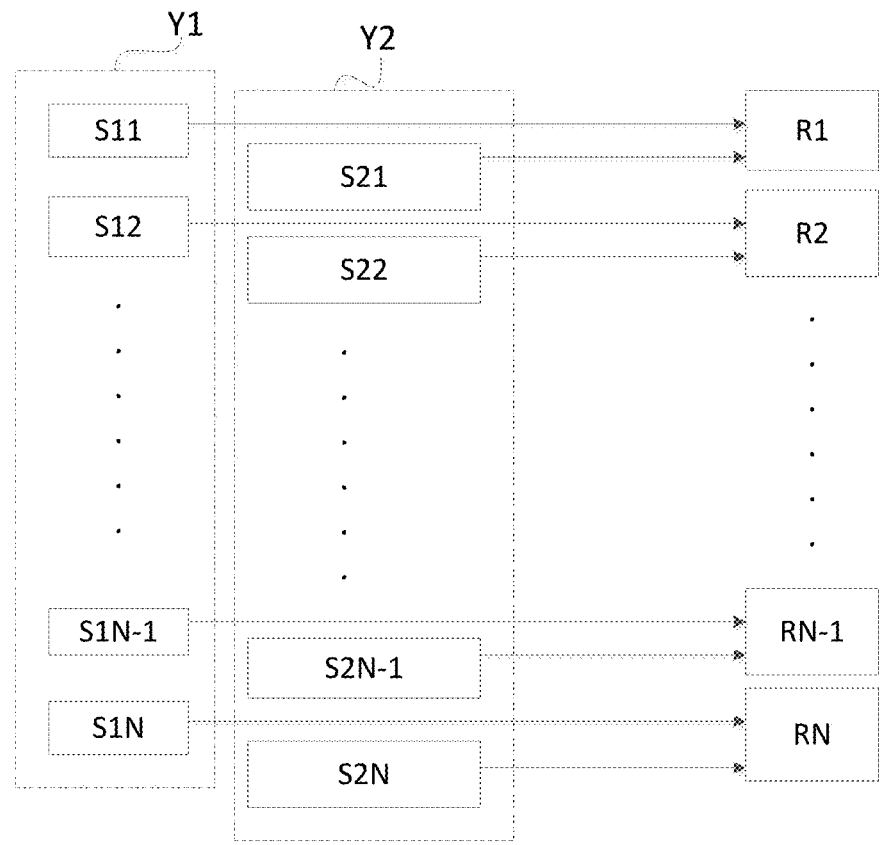
FIG. 2C is a schematic diagram showing a connection relationship between a scan driving circuit and pixel circuits included in the display substrate according to at least one embodiment of the present disclosure.

As shown in FIG. 2C, a reference sign Y1 represents a scan driving circuit, a reference sign S11 represents a first-stage shift register unit included in the scan driving circuit S1, and a reference sign S12 represents a second-stage shift register unit included in the scan driving circuit S1, a reference sign S1N-1 represents a $(N-1)^{th}$-stage shift register unit included in the scan driving circuit S1, and a reference sign S1N represents a $N^{th}$-stage shift register unit included in the scan driving circuit S1, where N is an integer greater than 3.

In FIG. 2C, a reference sign R1 represents a first-row pixel circuit, a reference sign R2 represents a second-row pixel circuit, a reference sign RN-1 represents a $(N-1)^{th}$-row pixel circuit, and a reference sign RN represents a $N^{th}$-row pixel circuit.

The first-stage shift register unit S11 corresponds to the first-row pixel circuit R1, the second-stage shift register unit S12 corresponds to the second-row pixel circuit R2, the $(N-1)^{th}$-stage shift register unit S1N-1 corresponds to the $(N-1)^{th}$-row pixel circuit RN-1, and the $N^{th}$-stage shift register unit S1N corresponds to the $N^{th}$-row pixel circuit RN.

The first-stage shift register unit S11 provides a first row light emission control signal for the first-row pixel circuit R1, the second-stage shift register unit S12 provides a second row light emission control signal for the second-row pixel circuit R2, the $(N-1)^{th}$-stage shift register unit S1N-1 provides a $(N-1)^{th}$ row light emission control signal for the $(N-1)^{th}$-row pixel circuit RN-1, and the $N^{th}$-stage shift register unit S1N provides a $N^{th}$ row light emission control signal for the $N^{th}$-row pixel circuit RN.

As shown in FIG. 2C, in the edge area, the display substrate may further include a gate driving circuit, which includes multi-stage gate driving units, and the gate driving units also correspond to rows of pixels in a one-to-one relationship to provide a corresponding gate drive signal for a corresponding row of pixels.

In FIG. 2C, a reference sign Y2 represents a gate driving circuit, a reference sign S21 represents a first-row gate driving unit included in the gate driving circuit, a reference sign S22 represents a second-row gate driving unit included in the gate driving circuit, a reference sign S2N-1 represents a $(N-1)^{th}$-row gate driving unit included in the gate driving circuit, and a reference sign S2N represents a $N^{th}$-row gate driving unit included in the gate driving circuit.

Figure 2D:
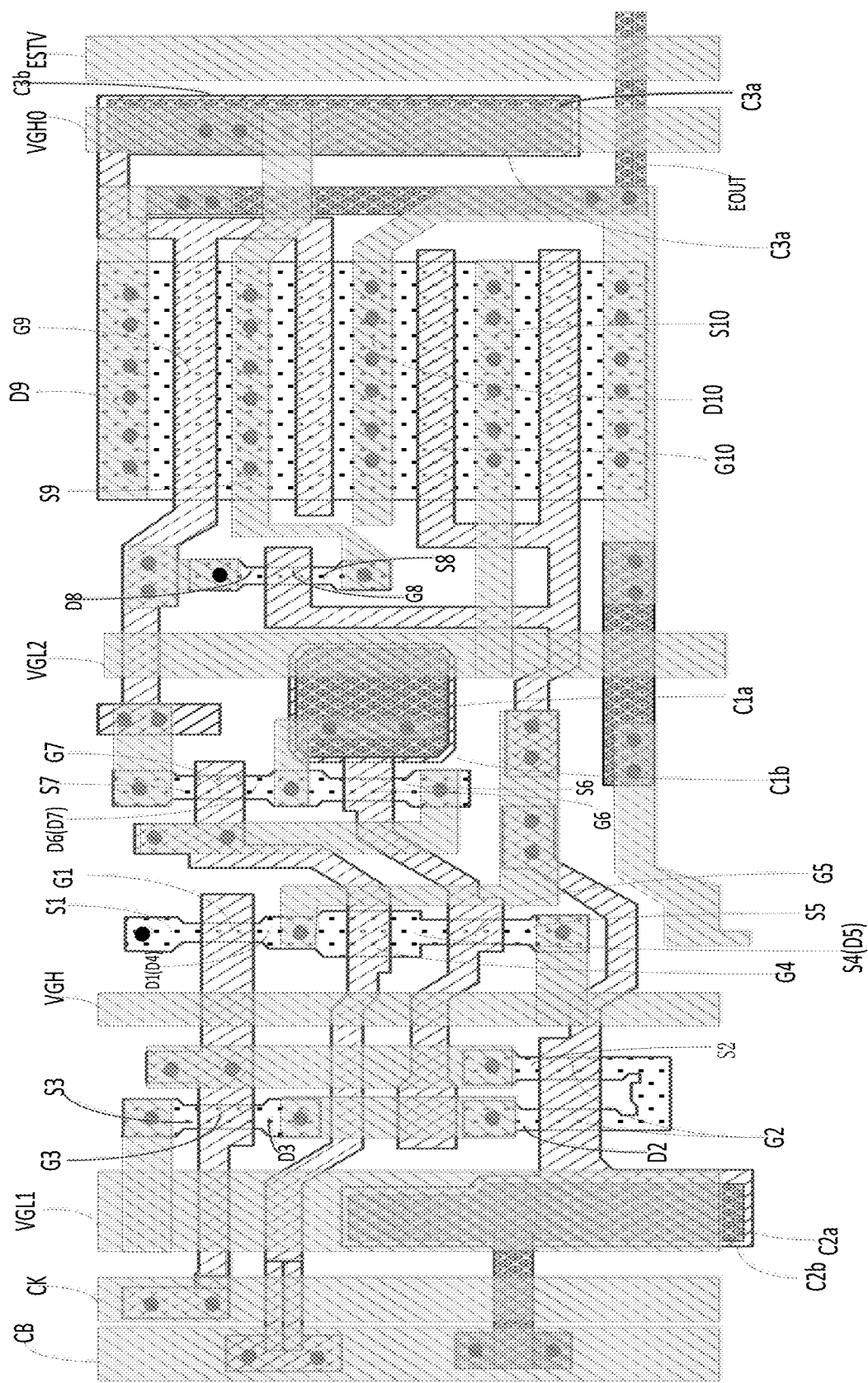
FIG. 2D is a schematic diagram showing a layout of shift register units provided by at least one embodiment of the present disclosure.

As shown in FIG. 2D, a first voltage signal line VGH provides a high voltage signal Vgh, a second voltage signal line VGL1 and a third voltage signal line VGL2 each provide a low voltage signal Vgl, and a fourth voltage signal line VGH0 provides the high voltage signal Vgh.

As shown in FIG. 2D, ESTV, VGH0, VGL2, VGH, VGL1, CK and CB are arranged in a direction getting away from the display area, and ESTV, VGH0, VGL2, VGH, VGL1, CK and CB extend in a first direction.

T8, T9 and T10 are provided between VGL2 and VGH0, T9 and T10 are arranged along the first direction, and T8 is provided between T9 and VGL2.

T6, T7, C1, T1, T4 and T5 are provided between VGH and VGL2.

C1 is provided between VGL2 and T6, and T4 is provided between VGL2 and T6.

T7 and T6 are arranged in order along the first direction, and T1, T4 and T5 are arranged in order along the first direction.

T2 and T3 are provided between VGL1 and VGH, and T3 and T2 are arranged in order along the first direction.

An orthogonal projection of C3 on a base substrate partially overlaps an orthogonal projection of VGH0 on the base substrate, and an orthogonal projection of C2 on the base substrate partially overlaps an orthogonal projection of VGL1 on the base substrate.

In FIG. 2D, a reference sign ESTV represents a starting signal line.

As shown in FIG. 2D, D1 is multiplexed as D4, S4 is multiplexed as D5, and D6 is multiplexed as D7.

Figure 3:
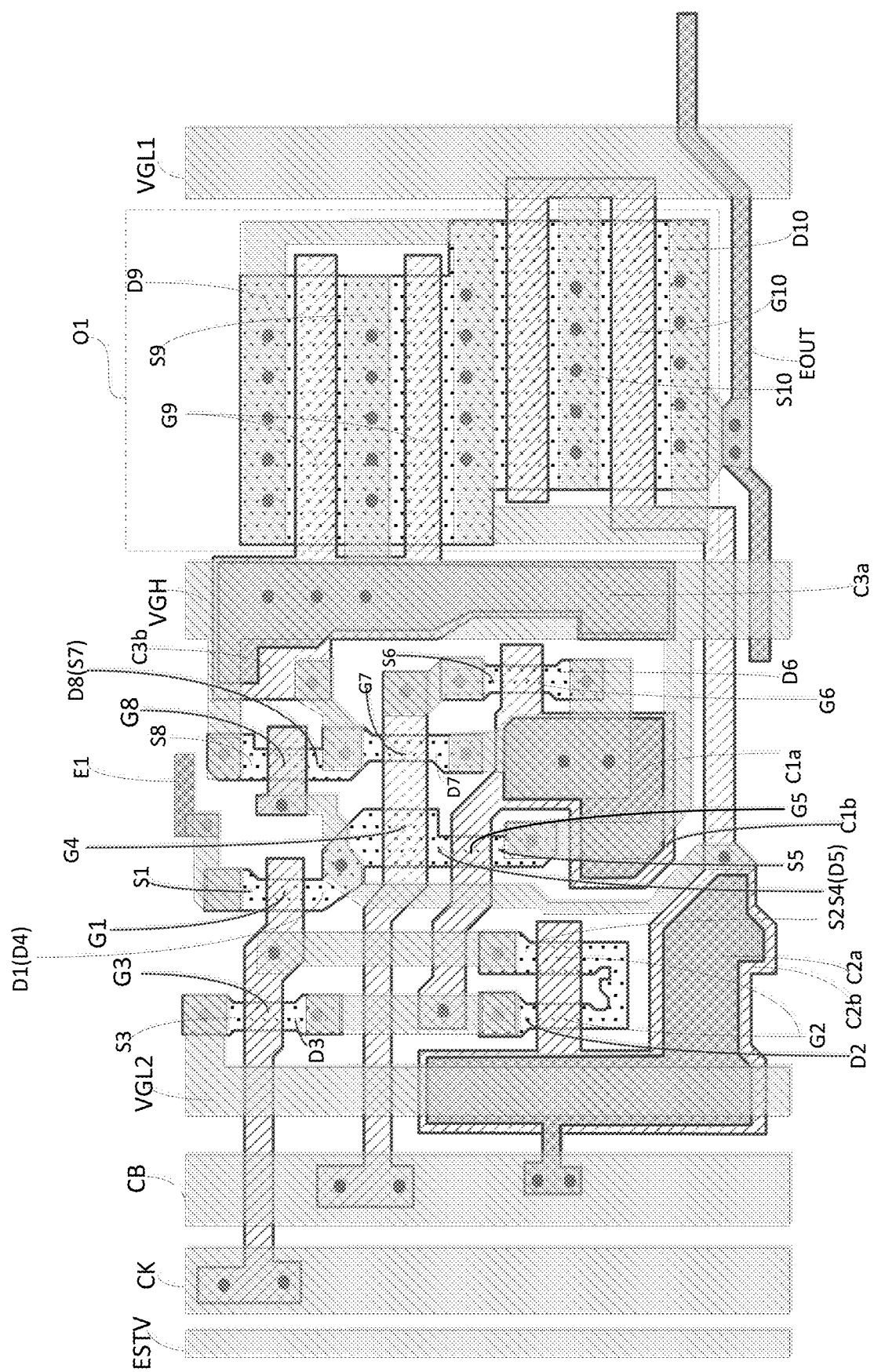
FIG. 3 is a schematic diagram showing another layout of the shift register units provided by at least one embodiment of the present disclosure.

In FIGS. 2D and 3, a reference sign G1 represents a gate electrode of T1, a reference sign S1 represents a first electrode of T1, and a reference sign D1 represents a second electrode of T1. A reference sign G2 represents a gate electrode of T2, a reference sign S2 represents a first electrode of T2, and a reference sign D2 represents a second electrode of T2. A reference sign G3 represents a gate electrode of T3, a reference sign S3 represents a first electrode of T3, and a reference sign D3 represents a second electrode of T3. A reference sign G4 represents a gate electrode of G4, a reference sign S4 represents a first electrode of T4, and a reference sign D4 represents a second electrode of T4. A reference sign G5 represents a gate electrode of T5, a reference sign S5 represents a first electrode of T5, and a reference sign D5 represents a second electrode of T5. A reference sign G6 represents a gate electrode of T6, a reference sign S6 represents a first electrode of T6, and a reference sign D6 represents a second electrode of T6. A reference sign G7 represents a gate electrode of T7, a reference sign S7 represents a first electrode of T7, and a reference sign D7 represents a second electrode of T7. A reference sign G8 represents a gate electrode of T8, a reference sign S8 represents a first electrode of T8, and a reference sign D8 represents a second electrode of T8. A reference sign G9 represents a gate electrode of T9, a reference sign S9 represents a first electrode of T9, and a reference sign D9 represents a second electrode of T9. A reference sign G10 represents a gate electrode of T10, a reference sign S10 represents a first electrode of T10, and a reference sign D10 represents a second electrode of T10.

In FIG. 2D, the reference sign ESTV represents a starting signal line.

In a layout of the gate driving circuit as shown in FIG. 2D, since two signal lines that provide the high-voltage signals are used, the signal lines are connected in a messy way, a space between the output transistor T10 in the $n^{th}$-stage shift register unit and the output reset transistor in the $(n+1)^{th}$-stage shift register unit is not fully utilized for the arrangement of the signal output line EOUT, the first capacitor C1 does not fully utilize a space between the gate electrode of T5 and the second conductive connection portion, and the second capacitor C2 does not fully utilize a space between the first node control transistor T2 and an adjacent next stage shift register unit, which results in a larger transverse width of the shift register unit and is thus not conducive to the development of a narrow bezel of the display substrate.

The shift register unit shown in FIG. 2D may be an $n^{th}$-stage shift register unit included in the scan driving circuit, where n is a positive integer.

In view of the existence of the above problems, the inventors of the present disclosure have discovered through research that the layout of the respective transistors in the shift register unit can be adjusted to reduce an area occupied by the shift register unit and thus reduce the bezel width of the display substrate.

In the layout shown in FIG. 3, the first voltage signal line VGH provides a high voltage signal Vgh, and the second voltage signal line VGL1 and the third voltage signal line VGL2 provide a low voltage signal Vgl. In at least one embodiment of the present disclosure, one signal line that provides the high voltage signal Vgh is removed, and VGH is provided between the second voltage signal line VGL1 and the third voltage signal line VGL2 to facilitate the layout.

As compared with FIG. 2D, in the at least one embodiment shown in FIG. 3, a fourth voltage signal line VGH0 is removed, only the first voltage signal line VGH, the second voltage signal line VGL1, and the third voltage signal line VGL2 are used, and the first voltage signal line VGH is provided between the second voltage signal line VGL1 and the third voltage signal line VGL2.

As shown in FIG. 3, the first electrode S9 of the output reset transistor T9 is coupled to the first voltage signal line VGH, the first electrode S10 of the output transistor T10 is coupled to the second voltage signal line VGL1, the first electrode S8 of the first transistor T8 is coupled to the first voltage signal line VGH, the first electrode S5 of the second capacitor connecting transistor T5 is coupled to the first voltage signal line VGH, the first electrode S3 of the second node control transistor T3 is coupled to the third voltage signal line VGL2, and the first plate C3a of the output capacitor C3 is coupled to the first voltage signal line VGH.

As shown in FIG. 3, when the shift register units of the above structure are laid out in the edge area of the display substrate, the second voltage signal line VGL1, the first voltage signal line VGH, and the three voltage signal lines VGL2 are arranged in order along the direction getting away from the display area of the display substrate, and the second voltage signal line VGL1, the first voltage signal line VGH, and the third voltage signal line VGL2 all extend in the first direction.

Further, a first clock signal line CB, a second clock signal line CK, and a starting voltage signal line ESTV are provided on a side of the third voltage signal line VGL2 distal to the first voltage signal line VGH. The first clock signal line CB, the second clock signal line CK, and the starting voltage signal line ESTV are arranged in order along a second direction getting away from the display area, and the first clock signal line CB, the second clock signal line CK, and the starting voltage signal line ESTV all extend in the first direction.

The output reset transistor T9 and the output transistor T10 are provided between the first voltage signal line VGH and the second voltage signal line VGL1. The output reset transistor T9, the output transistor T10 and the signal output line EOUT are arranged in order along the first direction.

The first capacitor C1, the first transistor T8, the second transistor T7, the first capacitor connecting transistor T6, the second capacitor connecting transistor T5, the first node control transistor T2, the second node control transistor T3, the input transistor T1 and the third node control transistor T4 are all provided between the first voltage signal line VGH and the third voltage signal line VGL2.

The first transistor T8, the second transistor T7, and the first capacitor C1 are arranged in order along the first direction. The input transistor T1, the third node control transistor T4, the second capacitor connecting transistor T5 and the first capacitor C1 are arranged in order along the first direction. The second node control transistor T3 and the first node control transistor T2 are arranged in order along the first direction.

The second transistor T7 and the third node control transistor T4 are arranged in order along the second direction.

The first capacitor connecting transistor T6 and the second capacitor connecting transistor T5 are arranged in order along the second direction.

The first transistor T8, the input transistor T1, and the second node control transistor T3 are arranged along the second direction.

In addition, an active pattern of the first node control transistor T2 is configured to have a U-shaped structure, so that the first node control transistor T2 is formed as a dual-gate structure.

In at least one embodiment of the present disclosure, an input signal terminal of the first-stage shift register unit included in the scan driving circuit is coupled to the starting signal line ESTV, and the input signal terminal is a terminal coupled to the first electrode S1 of the input transistor T1.

In at least one embodiment of the present disclosure, the first direction intersects the second direction. For example, the first direction may be perpendicular to the second direction, but it is not limited thereto.

Specifically, an angle at which the second direction intersects the first direction may be designed according to actual needs. Illustratively, the second direction is perpendicular to the first direction.

In at least one embodiment of the present disclosure, a position of the first clock signal line CB and a position of the second clock signal line CK can be exchanged, but it is limited thereto.

For example, in the layout shown in FIG. 3, the first direction may be a vertical direction from top to bottom, and the second direction may be a horizontal direction from right to left, but they are not limited thereto.

In an actual operation, a width of a signal line mainly affects the resistance, and a wider signal line has a lower resistance, which is beneficial to signal stability. What the first voltage signal line VGH, the second voltage signal line VGL1, and the third voltage signal line VGL2 provide are direct current voltages, which are less affected by the line widths. What the first clock signal line CB and the second clock signal line CK provide are clock signals, and when potentials of the clock signals are changed from a high voltage to a low voltage, the clock signal line of a lower resistance makes it easier for the potential of this clock signal to reach a low voltage faster. Therefore, in at least one embodiment of the present disclosure, the line widths of the first clock signal line CB and the second clock signal line are designed to be larger.

As shown in FIG. 3, an orthogonal projection of the first plate C3a of the output capacitor C3 on the base substrate has a signal line overlap area with an orthogonal projection of the first voltage signal line VGH on the base substrate, and an orthogonal projection of the second plate C3b of the output capacitor C3 on the base substrate partially overlaps an orthogonal projection of the first voltage signal line VGH on the base substrate.

An orthogonal projection of the first plate C2a of the second capacitor C2 on the base substrate falls inside an orthogonal projection of the second plate C2b of the second capacitor C2 on the base substrate, and the first plate C2a of the second capacitor C2 is L-shaped.

As can be seen from FIG. 3, a transverse portion of the first plate of the second capacitor C2 is provided between the first node control transistor T2 in the $n^{th}$-stage shift register unit and the second node control transistor in the $(n+1)^{th}$-stage shift register unit, and a space between them is thus fully utilized. Moreover, a transverse portion of the first plate of the first capacitor C1 is located between the gate electrode of the second capacitor connecting transistor T5 and a second conductive connection portion L2, and a space between them is thus fully utilized.

In the layout shown in FIG. 3 of the present disclosure, since the output reset transistor T9 is coupled to the first voltage signal line VGH and the output transistor T10 is coupled to the second voltage signal line VGL1, the output reset transistor T9 and the output transistor T10 are provided between the first voltage signal line VGH and the second voltage signal line VGL1, and a space between the output transistor T10 included in the $n^{th}$-stage shift register unit and the output reset transistor included in the $(n+1)^{th}$-stage shift register unit is fully utilized to arrange the signal output line EOUT, so that the output reset transistor T9 and the output transistor T10 are provided between the first voltage signal line VGH and the second voltage signal line VGL1. Moreover, no other signal lines or components included in the other transistors are provided between the first voltage signal line VGH and the output circuit (the output circuit includes the output reset transistor T9 and the output transistor T10), and no other signal lines or components included in the other transistors are provided between the second voltage signal line VGL1 and the output circuit (the output circuit includes the output reset transistor T9 and the output transistor T10). As a result, distances from the first voltage signal line VGH to the output reset transistor T9 and the output transistor T10 as well as distances from the second voltage signal line VGL1 to the output reset transistor T9 and the output transistor T10 are reduced, so that the transverse width of the shift register unit is reduced.

In at least one embodiment of the present disclosure, the shift register unit shown in FIG. 3 may be the $n^{th}$-stage shift register unit included in the scan driving circuit, where n is a positive integer.

Moreover, in the layout shown in FIG. 3 of the present disclosure, since the first electrode S8 of the first transistor T8 is coupled to the first voltage signal line VGH and the second electrode D8 of the first transistor T8 is coupled to the second plate C3b of the output capacitor C3, the closer the first transistor T8 is to the first voltage signal line VGH and the output capacitor C3, the more reasonable the corresponding layout will be. In at least one embodiment of the present disclosure, the first transistor T8 is provided on a side of the first voltage signal line VGH distal to the second voltage signal line VGL1, and positioned proximal to the adjacent previous stage shift register unit, so as to utilize a space between the first transistor T8 in the $n^{th}$-stage register unit and the first transistor included in the $(n+1)^{th}$-stage shift register unit, and to reduce a length of the signal line between a source electrode of the first transistor T8 and the first voltage signal line VGH, a length of the signal line between a drain electrode of the first transistor T8 and the output capacitor C3 and thus the transverse width of the shift register unit. As shown in FIG. 3, the second transistor T7, the first capacitor connecting transistor T6 and the first capacitor C1 are all provided in the space between the first transistor T8 in the $n^{th}$-stage shift register unit and the first transistor included in the $(n+1)^{th}$-stage shift register unit, thereby making full use of the space between the first transistor T8 in the $n^{th}$-stage shift register unit and the first transistor included in the $(n+1)^{th}$-stage shift register unit.

Further, the gate electrode G5 of the second capacitor connecting transistor T5 is coupled to the second plate C1b of the first capacitor C1, and the second electrode D6 of the first capacitor connecting transistor T6 is coupled to the first plate C1a of the first capacitor C1. Thus, the position of the second capacitor connecting transistor T5 and the position of the first capacitor connecting transistor T6 should be close to the first voltage signal line VGH, and a distance between the second capacitor connecting transistor T5 and the first capacitor connecting transistor T6 can be reduced to adjust the shape of the first capacitor C1. As shown in FIG. 3, in the at least one embodiment of the present disclosure, the plate of the first capacitor C1 is provided in an L shape. Moreover, as shown in FIG. 3, an extra space between the first node control transistor T2 in the $n^{th}$-stage shift register unit and the second node control transistor in the $(n+1)^{th}$-stage shift register unit is fully used by the second capacitor C2, and the plate of the second capacitor C2 is provided in the L shape. Through the arrangement as described above, the transverse width of the shift register unit can be reduced to a certain extent, and its vertical height can be optimized.

As shown in FIG. 3, the display substrate according to at least one embodiment of the present disclosure includes a scan driving circuit and a display area provided on the base substrate. The scan driving circuit includes a plurality of shift register units, and further includes a first voltage signal line VGH, a second voltage signal line VGL1, a first clock signal line CB, and a second clock signal line CK. The first voltage signal line VGH, the second voltage signal line VGL1, the first clock signal line CB and the second clock signal line CK extend in a first direction. The display area includes at least one driving transistor configured to drive a light-emitting element for display.

At least one of the plurality of shift register units includes an output circuit O1 and a signal output line EOUT. The output circuit O1 is coupled to each of the first voltage signal line VGH, the second voltage signal line VGL1, and the signal output line EOUT. The signal output line EOUT extends in a second direction, which intersects the first direction.

The output circuit O1 includes a transistor that is provided between the first voltage signal line VGH and the second voltage signal line VGL1.

In the display substrate according to the at least one embodiment of the present disclosure, the output circuit O1 is provided between the first voltage signal line VGH and the second voltage signal line VGL1, so that in a spatial structure, the first voltage signal line VGH is provided on a side of the output circuit O1 distal to the display area, and no other signal lines or components included in the other transistors are provided between the first voltage signal line VGH and the output circuit O1. Furthermore, the second voltage signal line VGL1 is provided on a side of the output circuit O1 proximal to the display area, and no other signal lines or components included in the other transistors are provided between the second voltage signal line VGL1 and the output circuit O1. Therefore, it is possible to reduce a distance from the first voltage signal line VGH to the output circuit O1 as well as a distance from the second voltage signal line VGL1 to the output circuit O1, so that the transverse width of the shift register unit is reduced.

In a specific implementation, the first voltage signal line VGH is located on a side of the second voltage signal line VGL1 distal to the display area.

In at least one embodiment of the present disclosure, the first voltage signal line VGH provides a first voltage to the output circuit O1, and the second voltage signal line VGL1 provides a second voltage, which is lower than the first voltage, to the output circuit O1.

In a specific implementation, the first voltage may be a high voltage Vgh, and the second voltage may be a low voltage Vgl, but they are not limited thereto.

Optionally, the output circuit may include an output transistor and an output reset transistor, which are arranged along a first direction.

A first electrode of the output reset transistor is coupled to the first voltage signal line, and a first electrode of the output transistor is coupled to the second voltage signal line.

As shown in FIG. 3, the output circuit O1 includes an output reset transistor T9 and an output transistor T10.

The output reset transistor T9 and the output transistor T10 are arranged in order from top to bottom, a first electrode S9 of the output reset transistor T9 is coupled to the first voltage signal line VGH, and a first electrode S10 of the output transistor T10 is coupled to the second voltage signal line VGL1.

In at least one embodiment of the present disclosure, a second electrode of the output transistor and a second electrode of the output reset transistor are both coupled to the signal output line. The signal output line is located between the output circuits in adjacent ones of the shift register units.

In a specific implementation, the output transistor and the output reset transistor are both coupled to the signal output line. Thus, the output transistor and the output reset transistor should be closer to the signal output line, and in the at least one embodiment of the present disclosure, the signal output line is moved down between the output circuits in adjacent ones of the shift register units to result in a reduced transverse width of the shift register unit.

In at least one embodiment of the present disclosure, the output reset transistor T9 is configured to provide an invalid light emission control signal, and the output transistor T10 is configured to provide a valid light emission control signal.

In at least one embodiment of the present disclosure, the valid light emission control signal may be a voltage signal capable of turning on a light emission control transistor in the pixel circuit (the gate electrode of the light emission control transistor is coupled to the light emission control line), and the invalid light emission control signal may be a voltage signal capable of turning off the light emission control transistor.

Specifically, the display area of the display substrate includes a plurality of sub-pixels. At least one of the plurality of sub-pixels includes a pixel driving circuit, which includes a driving transistor configured to drive the light-emitting element for display, a gate line, a light emission control line, and a data line. The plurality of shift register units included in the scan driving circuit corresponds to the plurality of the light emission control lines in a one-to-one relationship, and the signal output line of each of the shift register units is coupled to a corresponding one of the light emission control lines to provide a light emission control signal for the corresponding light emission control line.

In at least one embodiment of the present disclosure, active layers of the output transistor and the output reset transistor are formed by one continuous first semiconductor layer. The first semiconductor layer and the signal output line are arranged along the first direction.

In a specific implementation, active layers of the output transistor and the output reset transistor are formed by one continuous first semiconductor layer, but it is not limited thereto.

In at least one embodiment of the present disclosure, active layers of the output transistor and of the output reset transistor may be formed by one continuous first semiconductor layer.

The active layer of the output reset transistor includes at least two first conductive portions which are spaced apart along the first direction, and at least one first channel portion each provided between two adjacent ones of the first conductive portions.

The active layer of the output transistor may include at least two second conductive portions which are spaced apart along the first direction, and at least one first channel portion each provided between two adjacent ones of the second conductive portions.

A first conductive portion of the active layer of the output reset transistor that is closest to the active layer of the output transistor can be multiplexed as a second conductive portion of the output transistor, which can further reduce the layout space of the output transistor and the output reset transistor, and is thus beneficial to the realization of the narrow bezel of the display substrate.

Figure 4:
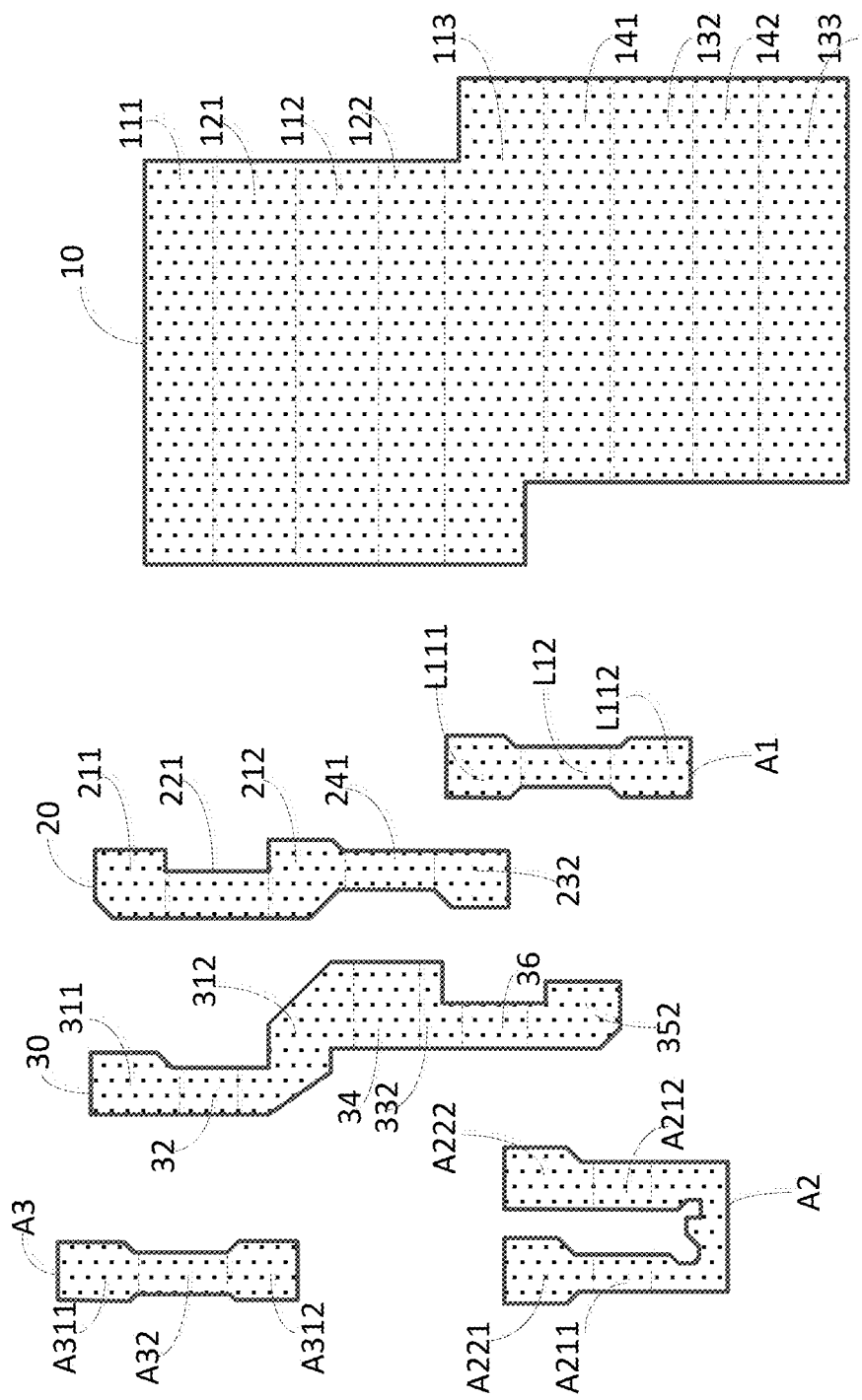
FIG. 4 is a schematic diagram of an active layer in the shift register unit provided by at least one embodiment of the present disclosure.

As shown in FIG. 4, the active layers of the output reset transistor T9 and the output transistor T10 may be formed by one continuous first semiconductor layer 10.

The active layer of the output reset transistor T9 includes a first first conductive portion 111, a second first conductive portion 112, and a third first conductive portion 113 that are spaced apart along a first direction. The active layer of the output reset transistor T9 further includes a first first channel portion 121 and a second first channel portion 122.

The first first channel portion 121 is provided between the first first conductive portion 111 and the second first conductive portion 112, and the second first channel portion 122 is provided between the second first conductive portion 112 and the third first conductive portion 113.

The first conductive portion 113 is multiplexed as the first second conductive portion included in the active layer of the output transistor T10.

The active layer of the output transistor T10 further includes a second second conductive portion 132 and a third second conductive portion 133 that are spaced apart along the first direction, and the active layer of the output transistor T10 further includes a first second channel portion 141 and a second second channel portion 142.

The first second channel portion 141 is provided between the first second conductive portion and the second second conductive portion 132, and the second second channel portion 142 is provided between the second second conductive portion 132 and the third second conductive portion 133.

In the output reset transistor T9 and the output transistor T10, the conductive portions on both sides of the channel portion of each transistor may serve as the first electrode and the second electrode of the transistor, respectively, or may be coupled to the first electrode and the second electrode of the transistor, respectively, so that the output reset transistor T9 and the output transistor T10 can be electrically connected via the third first conductive portion 113.

When making the first semiconductor layer 11, for example, a first semiconductor material layer may be first formed, and after the gate electrode G9 of the output reset transistor T9 and the gate electrode G10 of the output transistor T10 have been formed, a portion of the first semiconductor material layer that is not covered by the gate electrodes of the transistors is then doped by using the gate electrode G9 of the output reset transistor T9 and the gate electrode G10 of the output transistor T10 as a mask, so that the portion of the first semiconductor material layer that is not covered by the gate electrodes of the transistors forms the conductive portion, and a portion of the first semiconductor material layer that is covered by the gate electrodes of the transistors forms the channel portion.

According to a specific structure of the display substrate as described above, in the display substrate according to at least one embodiment of the present disclosure, the output reset transistor T9 and the output transistor T10 in the shift register unit can be arranged along the first direction, which reduces an area occupied by the shift register unit in the second direction, so that the display substrate meets more development requirements of a narrowed bezel.

Specifically, the gate electrode of the output reset transistor may include at least one output reset gate pattern, and a first electrode of the output reset transistor includes at least one first electrode pattern, and a second electrode of the output reset transistor includes at least one second electrode pattern. The output reset gate pattern is located between the first electrode pattern and the second electrode pattern which are adjacent to each other. The second electrode pattern, the output reset gate pattern, and the first electrode pattern all extend in the second direction which intersects the first direction.

Specifically, the gate electrode of the output transistor may include at least two output gate patterns arranged in the first direction, the first electrode of the output transistor includes at least one third electrode pattern, and the second electrode of the output transistor includes at least one fourth electrode pattern. The output gate pattern is located between the third electrode pattern and the fourth electrode pattern, which are adjacent to each other. The fourth electrode pattern, the output gate pattern, and the third electrode pattern all extend in the second direction which intersects the first direction. The second electrode pattern of the output reset transistor that is closest to the gate electrode of the output transistor is multiplexed as the fourth electrode pattern of the output transistor.

In a specific implementation, numbers of the output reset gate patterns, the first electrode patterns, the second electrode patterns, the output gate patterns, the third electrode patterns and the fourth electrode patterns can be designed according to actual needs. Exemplarily, as shown in FIGS. 5 and 8, the number of the output gate patterns and that of the output reset gate patterns may be two, and the number of the first electrode patterns and that of the third electrode patterns may each be one, the number of the second electrode pattern and that of the fourth electrode pattern may be two.

In addition, since the second electrode of the output transistor and the second electrode of the output reset transistor are both coupled to the signal output line, when the output transistor and the output reset transistor are laid out, the second electrode pattern of the output reset transistor that is closest to the gate electrode of the output transistor is multiplexed as the fourth electrode pattern of the output transistor, which can further reduce the layout space of the output transistor and the output reset transistor, and thus is beneficial to the realization of the narrowed bezel of the display substrate.

Figure 5:
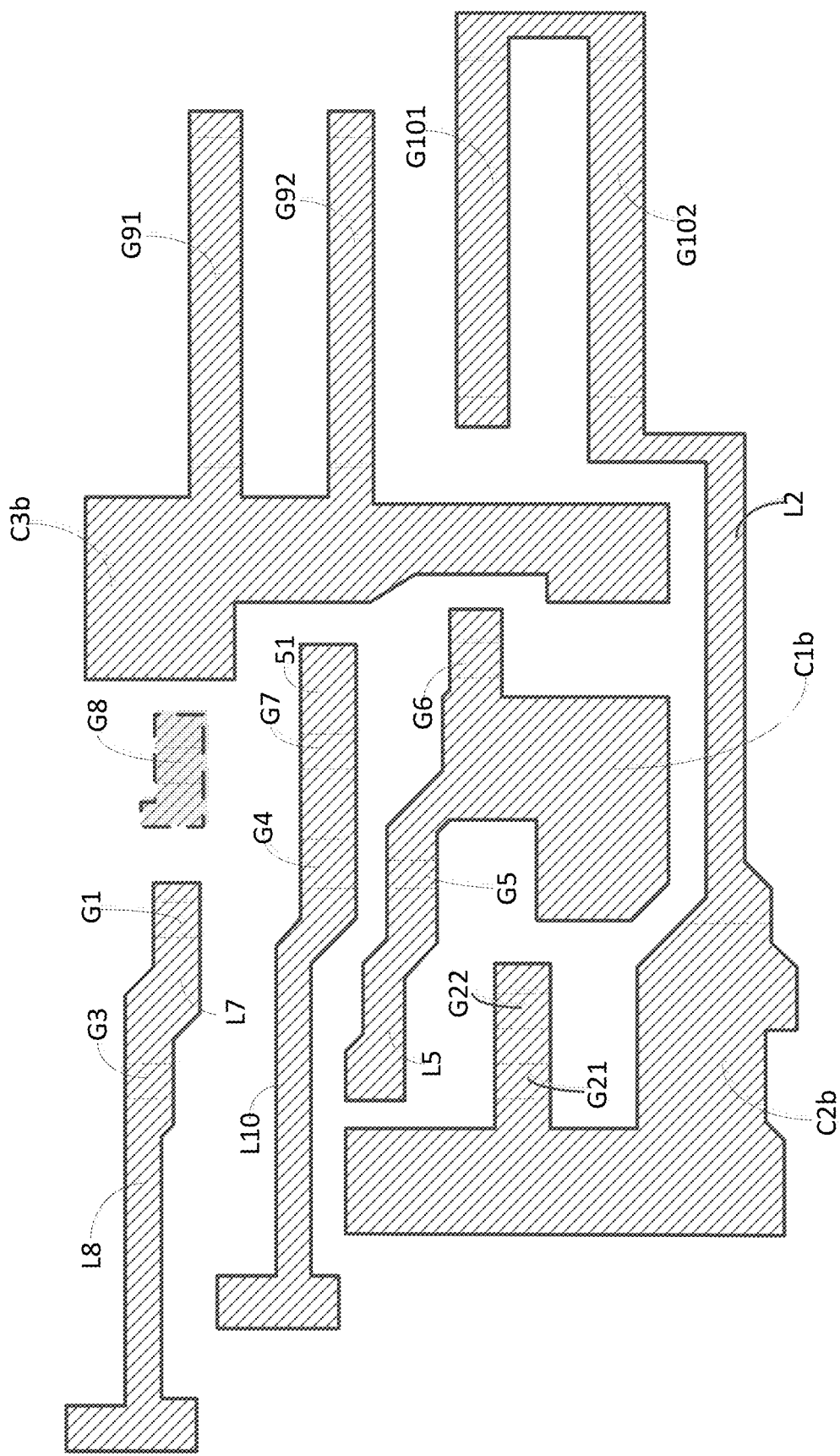
FIG. 5 is a schematic diagram of a first gate metal layer in the shift register unit provided by at least one embodiment of the present disclosure.

As shown in FIGS. 3 and 5, in some embodiments, the gate electrode G9 of the output reset transistor T9 may include a first output reset gate pattern G91 and a second output reset gate pattern G92. The gate electrode G10 of the output transistor T10 may include a first output gate pattern G101 and a second output gate pattern G102. The first output reset gate pattern G91, the second output reset gate pattern G92, the first output gate pattern G101, and the second output gate pattern G102 are arranged in order along the first direction. The first output reset gate pattern G91, the second output reset gate pattern G92, the first output gate pattern G101, and the second output gate pattern G102 all extend in a second direction which intersects the first direction. The first output reset gate pattern G91 and the second output reset gate pattern G92 are coupled to each other, and the first output gate pattern G101 and the second output gate pattern G102 are coupled to each other.

Figure 8:
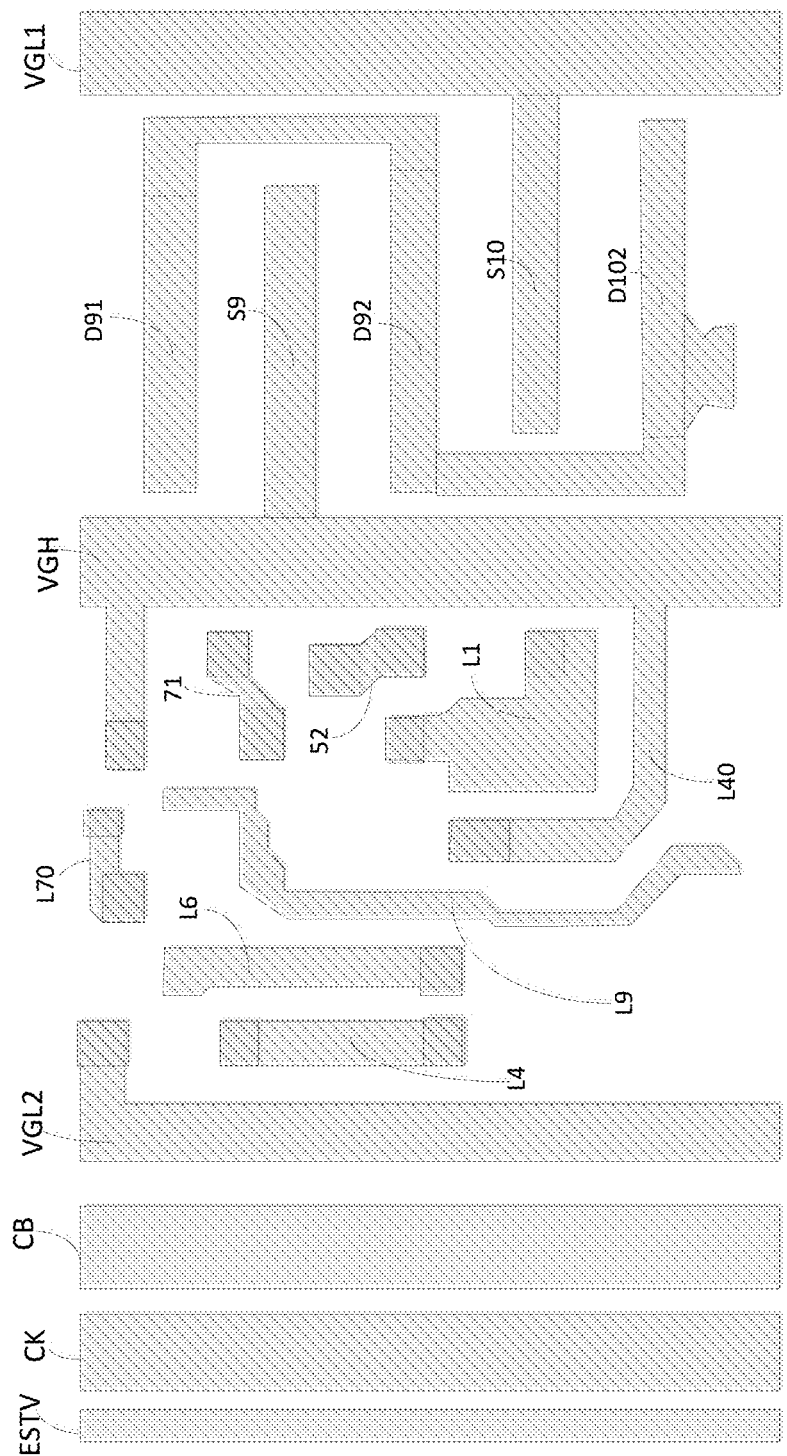
FIG. 8 is a schematic diagram of a source-drain metal layer in the shift register unit provided by at least one embodiment of the present disclosure.

As shown in FIG. 8, the second electrode D9 of the output reset transistor T9 includes a first second electrode pattern D91 and a second second electrode pattern D92. The first second electrode pattern D91, the first electrode S9, and the second second electrode pattern D92 are arranged in order along the first direction, and they all extend in the second direction, and the first electrode S9 is coupled to the first voltage signal line VGH. The second second electrode pattern D92 is multiplexed as a first fourth electrode pattern in the second electrode D10 of the output transistor T10. The second electrode D10 of the output transistor T10 further includes a second fourth electrode pattern D102. The second second electrode pattern D92, the first electrode S10 and the second fourth electrode pattern D102 are arranged in order along the first direction. The first electrode S10 is coupled to the second voltage signal line VGL1.

As shown in FIGS. 3, 5, and 8, an orthogonal projection of the first output reset gate pattern G91 on the base substrate is located between an orthogonal projection of the first second electrode pattern D91 on the base substrate and an orthogonal projection of the first electrode S9 on the base substrate, an orthogonal projection of the second output reset gate pattern G92 on the base substrate is located between the orthogonal projection of the first electrode S9 on the base substrate and an orthogonal projection of the second second electrode pattern D92 on the base substrate, an orthogonal projection of the first output gate pattern G101 on the base substrate is located between the orthogonal projection of the second second electrode pattern D92 on the base substrate and the orthogonal projection of the first electrode S10 on the base substrate, and an orthogonal projection of the second output gate pattern G102 is located between the orthogonal projection of the first electrode S10 on the base substrate and an orthogonal projection of the second fourth electrode pattern D102 on the base substrate.

In at least one embodiment of the present disclosure, when at least one shift register unit included in the scan driving circuit is in operation, if the output transistor T10 is turned on, the shift register unit continues to output a low voltage signal, and the gate electrode G10 of the output transistor T10 should be prevented from overlapping the clock signal line in order to keep a stable voltage signal input into the gate electrode of the output transistor T10. Here, the provision of the gate electrode G10 to overlap the second voltage signal line VGL1 (which is a DC voltage signal line) has a minimal impact on the voltage signal input into the gate electrode G10 of the output transistor T10.

In a specific implementation, the active layer of the output reset transistor includes at least two first conductive portions which are spaced apart along the first direction, and at least one first channel portion each provided between two adjacent ones of the first conductive portions.

The first channel portion(s) corresponds to the output reset gate pattern(s) in a one-to-one relationship, and an orthogonal projection of each of the first channel portions on the base substrate falls inside an orthogonal projection of a corresponding one of the output reset gate patterns on the base substrate.

A part of the first conductive portions in the output reset transistor corresponds to the first electrode patterns in a one-to-one relationship, and an orthogonal projection of the first electrode pattern on the base substrate has a first overlap area with an orthogonal projection of a corresponding one of the first conductive portions on the base substrate, and the first electrode pattern is coupled to the corresponding first conductive portion through at least one first via hole provided in the first overlap area.

The other part of the first conductive portions in the output reset transistor corresponds to the second electrode patterns in a one-to-one relationship, and an orthogonal projection of the second electrode pattern on the base substrate has a second overlap area with an orthogonal projection of a corresponding one of the first conductive portions on the base substrate, and the second electrode pattern is coupled to the corresponding first conductive portion through at least one second via hole provided in the second overlap area.

In a specific implementation, an active layer of the output transistor may include at least two second conductive portions which are spaced apart along the first direction, and at least one second channel portion each provided between two adjacent ones of the second conductive portions.

The second channel portion(s) corresponds to the output gate pattern(s) in a one-to-one relationship, and an orthogonal projection of each of the second channel portions on the base substrate falls inside an orthogonal projection of a corresponding one of the output gate patterns on the base substrate.

A part of the second conductive portions in the output transistor corresponds to the third electrode patterns in a one-to-one relationship, and an orthogonal projection of the third electrode pattern on the base substrate has a third overlap area with an orthogonal projection of a corresponding one of the second conductive portions on the base substrate, and the third electrode pattern is coupled to the corresponding second conductive portion through at least one third via hole provided in the third overlap area.

The other part of the second conductive portions in the output transistor corresponds to the fourth electrode patterns in a one-to-one relationship, and an orthogonal projection of the fourth electrode pattern on the base substrate has a fourth overlap area with an orthogonal projection of a corresponding one of the second conductive portions on the base substrate, and the fourth electrode pattern is coupled to the corresponding second conductive portion through at least one fourth via hole in the fourth overlap area.

As shown in FIGS. 4, 5, 7 and 8, a first first channel portion 121 corresponds to a first output reset gate pattern G91, and a second first channel portion 122 corresponds to a second output reset gate pattern G92. An orthogonal projection of the first first channel portion 121 on the base substrate falls inside an orthogonal projection of the first output reset gate pattern G91 on the base substrate. An orthogonal projection of the second first channel portion 122 on the base substrate falls inside an orthogonal projection of the second output reset gate pattern G92 on the base substrate.

A first first conductive portion 111 corresponds to the first second electrode pattern D91, a second first conductive portion 112 corresponds to the first electrode S9 of the output reset transistor, and a third first conductive portion 113 corresponds to the second second electrode pattern D92. An orthogonal projection of the first electrode S9 on the base substrate has a first overlap area with an orthogonal projection of the second first conductive portion 112 on the base substrate, and the first electrode S9 is coupled to the second first conductive portion 112 through at least one first via hole H1 provided in the first overlap area. An orthogonal projection of the first second electrode pattern D91 on the base substrate has a first second overlap area with an orthogonal projection of the first first conductive portion 111 on the base substrate, and the first second electrode pattern D91 is coupled to the first first conductive portion 111 through at least one second via hole H2 provided in the first second overlap area. An orthogonal projection of the second second electrode pattern D92 on the base substrate has a second second overlap area with an orthogonal projection of the third first conductive portion 113 on the base substrate, and the second second electrode pattern D92 is coupled to the third first conductive portion 113 through at least one second via hole H2 provided in the second second overlap area.

A first second channel portion 141 corresponds to a first output gate pattern G101, and a second second channel portion 142 corresponds to a second output gate pattern G102. An orthogonal projection of the first second channel portion 141 on the base substrate falls inside an orthogonal projection of the first output gate pattern G101 on the base substrate. An orthogonal projection of the second second channel portion 142 on the base substrate falls inside an orthogonal projection of the second output gate pattern G102 on the base substrate.

The second second electrode pattern D92 is multiplexed as the first fourth electrode pattern, and the third first channel portion 113 is multiplexed as the first second conductive portion. The first second channel portion corresponds to a first fourth electrode pattern.

A second second conductive portion 132 corresponds to the first electrode S10 of the output transistor, and a third second conductive portion 133 corresponds to the second fourth electrode pattern D102.

An orthogonal projection of the first electrode S10 on the base substrate has a third overlap area with an orthogonal projection of the second second conductive portion 132 on the base substrate, and the first electrode S10 is coupled to the second second conductive portion 132 through at least one third via hole H3 provided in the third overlap area.

An orthogonal projection of the second fourth electrode pattern D102 on the base substrate has a fourth overlap area with an orthogonal projection of the third second conductive portion 133 on the base substrate, and the second fourth electrode pattern D102 is coupled to the third second conductive portion 133 through at least one fourth via hole H4 provided in the fourth overlap area.

In at least one embodiment of the present disclosure, the numbers of the first via holes, the second via holes, the third via holes, and the fourth via holes can be designed according to actual needs.

In the display substrate provided by the above embodiment, by using the first semiconductor layer 10 to form the active layer of the output reset transistor T9 and the active layer of the output transistor T10, it is possible not only to result in a smaller space occupied by the output reset transistor T9 and the output transistor T10 in the second direction, but also to enable an increased size of the active layer of the output reset transistor T9 and the active layer of the output transistor T10 in the first direction so as to ensure the channel width of the output reset transistor T9 and the channel width of the output transistor T10, thereby realizing the narrow bezel width of the display substrate while ensuring operation performances of the output reset transistor T9 and the output transistor T10.

Figure 6:
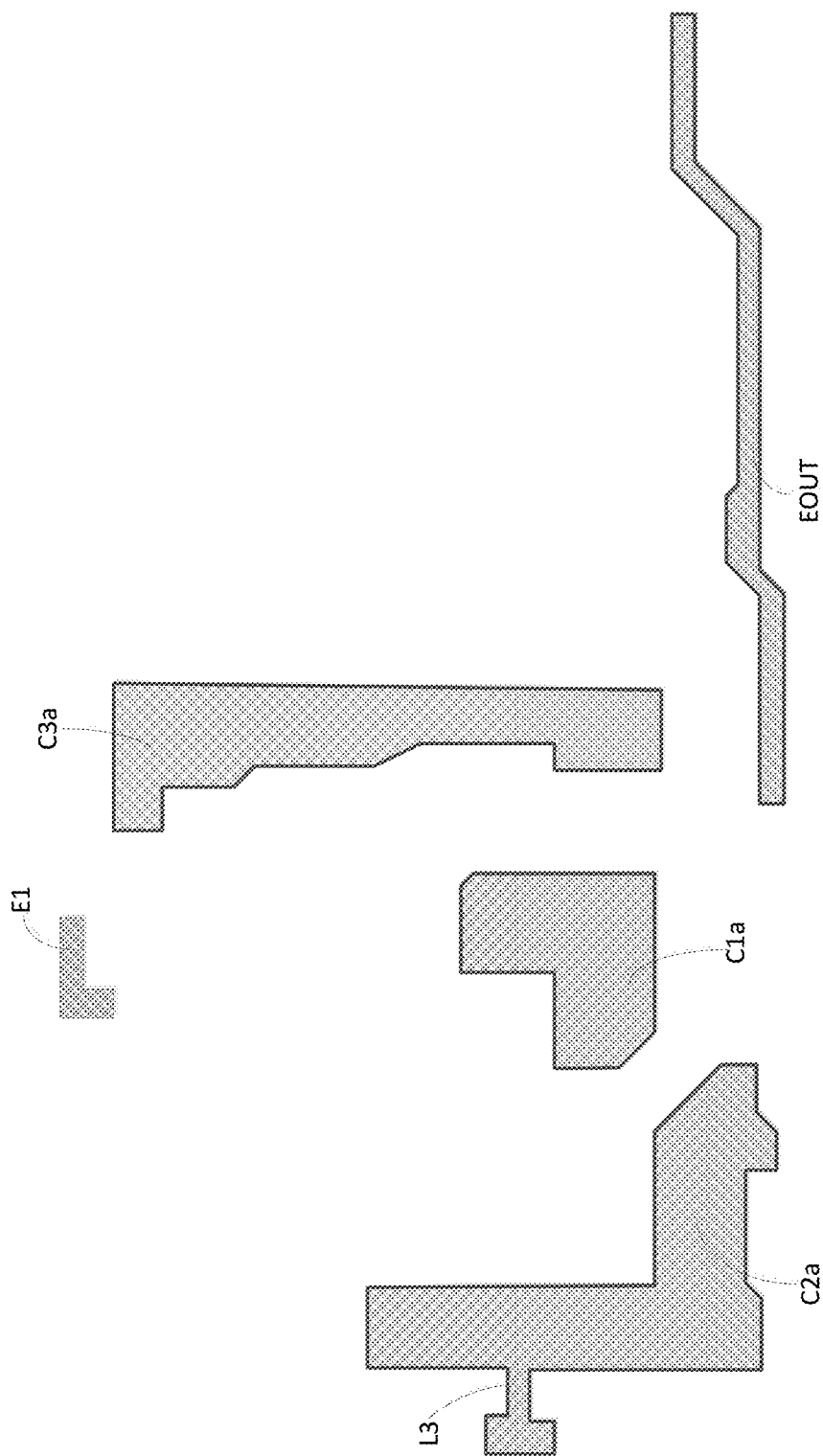
FIG. 6 is a schematic diagram of a second gate metal layer in the shift register unit provided by at least one embodiment of the present disclosure.

As shown in FIGS. 3, 4 and 6, an orthogonal projection of the signal output line EOUT on the base substrate is located between an orthogonal projection of the first semiconductor layer 10 in the $n^{th}$-stage shift register unit on the base substrate and an orthogonal projection of the first semiconductor layer in the $(n+1)^{th}$-stage shift register unit on the base substrate, and the first semiconductor layer 10 and the signal output line EOUT are arranged along the first direction, which can reduce the transverse width of the shift register unit.

Figure 7:
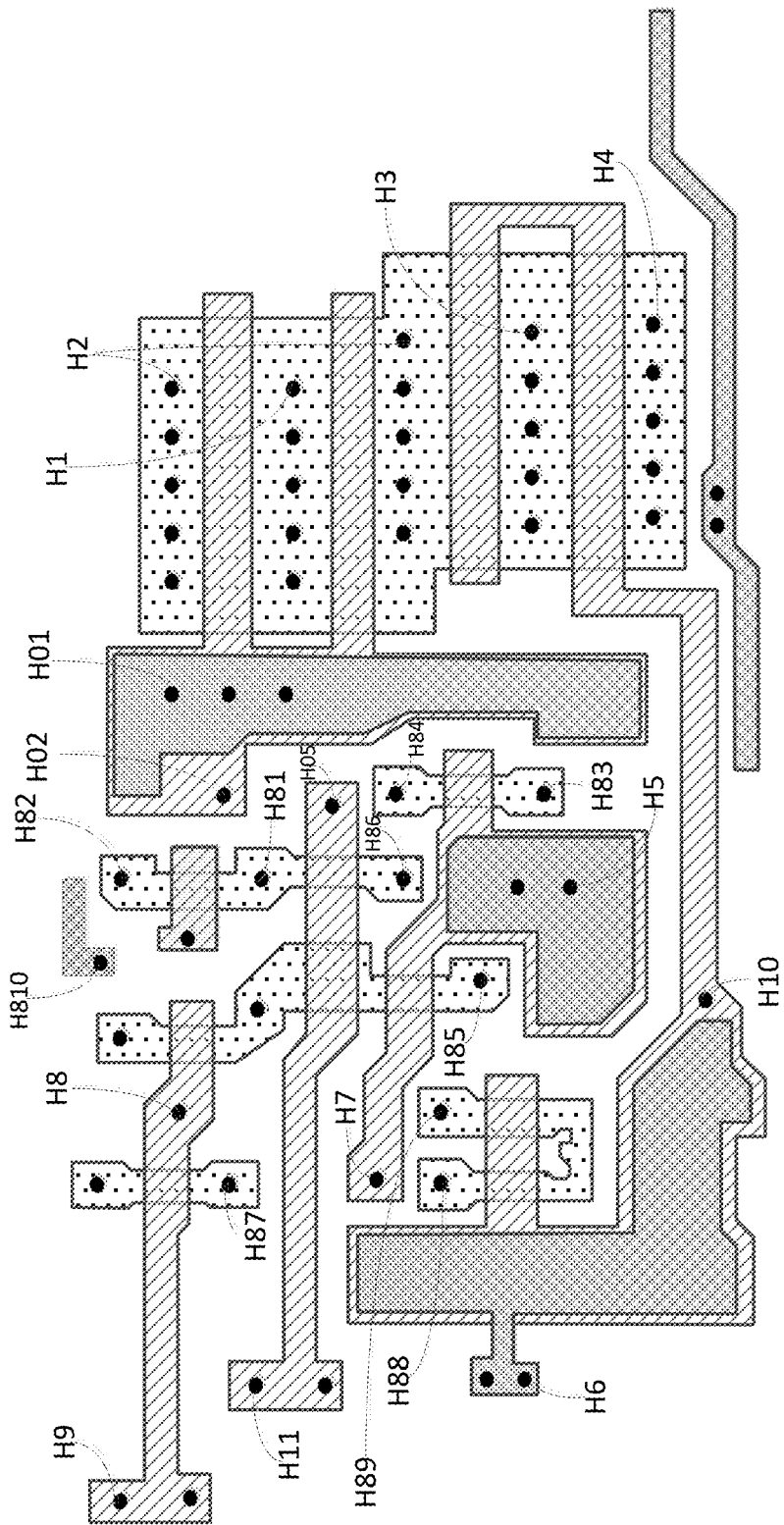
FIG. 7 is a schematic diagram of a via hole used in the shift register unit provided by at least one embodiment of the present disclosure.

In at least one embodiment of the present disclosure, FIG. 4 is a schematic diagram of the active layer in FIG. 3, FIG. 5 is a schematic diagram of a first gate metal layer in FIG. 3, FIG. 6 is a schematic diagram of a second gate metal layer in FIG. 3, FIG. 7 is a schematic diagram of the via holes made after the active layer, the first gate metal layer and the second gate metal layer have been arranged in order, and FIG. 8 is a schematic diagram of the source-drain metal layer in FIG. 3.

In a specific implementation, an active layer, a first gate metal layer, a second gate metal layer, a via hole, and a source-drain metal layer are arranged in order on the base substrate to form a display substrate.

In at least one embodiment of the present disclosure, the at least one shift register unit may include a plurality of transistors, in addition to the output transistor and the output reset transistor. The conductive portions on both sides of the channel portion of each transistor may serve as a first electrode and a second electrode of the transistor, respectively, or may be coupled to the first electrode and the second electrode of the transistor, respectively.

In at least one embodiment of the present disclosure, as shown in FIG. 3, the number of the first voltage signal line VGH may be one.

As shown in FIGS. 1 and 3, the output circuit includes an output reset transistor T9, and the at least one shift register unit further includes an output capacitor C3, a first transistor T8, and a second capacitor connecting transistor T5.

A first electrode of the output reset transistor T9, a first plate of the output capacitor C3, a first electrode of the first transistor T8, and a first electrode of the second capacitor connecting transistor T5 are all coupled to the first voltage signal line VGH, so that the transistors included in the shift register units are coupled to the same first voltage signal line VGH, reducing the number of the signal lines used.

In at least one embodiment of the present disclosure, by arranging the first voltage signal line VGH between the second voltage signal line VGL1 and the third voltage signal line VGL2, the first voltage signal line VGH can simultaneously supply a first voltage signal to the first electrode of the second capacitor connecting transistor T5 and the first electrode of the first transistor T8, and the first voltage signal line VGH can charge the first plate of the output capacitor C3.

As shown in FIG. 3, the display substrate further includes the third voltage signal line VGL2, and the first voltage signal line VGH is located between the second voltage signal line VGL1 and the third voltage signal line VGL2.

As shown in FIGS. 3, 4, 7 and 8, a first electrode S5 of the second capacitor connecting transistor T5 is coupled to a signal line conductive connection portion L40 through a fifth connection via hole H85, and the signal line conductive connection portion L40 is coupled to the first voltage signal line VGH, so that the first electrode S5 of the second capacitor connecting transistor T5 is coupled to the first voltage signal line VGH.

The signal line conductive connection portion L40 and the first voltage signal line VGH are contained in the source-drain metal layer, and the first electrode S5 of the second capacitor connecting transistor T5 is contained in the active layer.

As shown in FIGS. 3, 4, 7 and 8, the at least one shift register unit further includes a first capacitor C1. An orthogonal projection of the signal line conductive connection portion L40 on the base substrate partially overlaps an orthogonal projection of a first plate C1a of the first capacitor C1 on the base substrate.

As shown in FIGS. 3, 6 and 7, an orthogonal projection of the first plate C3a of the output capacitor C3 on the base substrate has a signal line overlap area with the orthogonal projection of the first voltage signal line VGH on the base substrate, and the first plate C3a of the output capacitor C3 is coupled to the first voltage signal line VGH through at least one signal line via hole H01 provided in the signal line overlap area. In at least one embodiment of the present disclosure, as shown in FIG. 2, the at least one shift register unit may further include an output capacitor C3 and a first transistor T8.

As shown in FIGS. 3, 6 and 7, the orthogonal projection of the first plate C3a of the output capacitor C3 on the base substrate has a signal line overlap area with the orthogonal projection of the first voltage signal line VGH on the base substrate, and the first plate C3a of the output capacitor C3 is coupled to the first voltage signal line VGH through at least one signal line via hole H01 provided in the signal line overlap area.

The first transistor T8 is located on a side of the first voltage signal line VGH distal to the output reset transistor T9.

As shown in FIG. 8, the at least one shift register unit further includes a plate conductive connection portion 71 coupled to a second electrode D8 of the first transistor T8.

As shown in FIGS. 3, 4, 7 and 8, the second electrode D8 of the first transistor T8 is coupled to the plate conductive connection portion 71 through a first connection via hole H81.

As shown in FIGS. 3, 5, 7 and 8, an orthogonal projection of the plate conductive connection portion 71 on the base substrate has a plate overlap area with an orthogonal projection of a second plate C3b of the output capacitor C3 on the base substrate, and the plate conductive connection portion 71 is coupled to the second plate C3b of the output capacitor C3 through at least one plate via hole H02 provided in the plate overlap area.

The first electrode S8 of the first transistor T8 is coupled to the first voltage signal line VGH.

In a specific implementation, as shown in FIG. 7, the first electrode S8 of the first transistor T8 is coupled to the first voltage signal line VGH through the second connection via hole H82.

In at least one embodiment of the present disclosure, the first transistor T8 is moved to a side of the first voltage signal line VGH distal to the second voltage signal line VGL1, and an orthogonal projection of the plate of the output capacitor C3 on the base substrate is designed to partially overlap an orthogonal projection of the first voltage signal line VGH on the base substrate, so as to reduce a distance between the first electrode S8 of the first transistor T8 and the first voltage signal line VGH as well as a distance between the second electrode D8 of the first transistor T8 and the second plate C3b of the output capacitor C3, so that the first transistor T8 can be easily coupled to the first voltage signal line VGH and the second plate C3b of the output capacitor C3, making the space compact and the layout more reasonable.

Preferably, a maximum distance in the second direction between the orthogonal projection of the first electrode S8 of the first transistor T8 on the base substrate and the orthogonal projection of the first voltage signal line VGH on the base substrate is smaller than a first predetermined distance, and a maximum distance in the second direction between the orthogonal projection of the second electrode D8 of the first transistor T8 on the base substrate and the orthogonal projection of the second plate C3b of the output capacitor C3 on the base substrate is smaller than a second predetermined distance, so that the first transistor T8 is close to the first voltage signal line VGH and the output capacitor C3, which reduces the transverse width of the shift register unit and facilitates the realization of a narrowed bezel.

In at least one embodiment of the present disclosure, the first predetermined distance and the second predetermined distance may be selected according to actual conditions. For example, the first predetermined distance may be greater than or equal to 20 μm (micrometers) and less than or equal to 30 μm, and the second predetermined distance may be greater than or equal to 25 μm (micrometers) and less than or equal to 35 μm.

In at least one embodiment of the present disclosure, the first electrode S8 and the second electrode D8 are provided on the active layer. As shown in FIG. 4, the first third conductive portion 211 serves as the first electrode S8 of the first transistor T8, and the second third conductive portion 212 serves as the second electrode D8 of the first transistor T8.

In at least one embodiment of the present disclosure, the maximum distance in the second direction between the orthogonal projection of the first electrode S8 of the first transistor T8 on the base substrate and the orthogonal projection of the first voltage signal line VGH on the base substrate refers to a maximum distance in the second direction between any point on an edge line of the orthogonal projection of the first electrode S8 of the first transistor T8 on the base substrate and an edge line of the orthogonal projection of the first voltage signal line VGH on the base substrate.

The maximum distance in the second direction between the orthogonal projection of the second electrode D8 of the first transistor T8 on the base substrate and the orthogonal projection of the second plate C3b of the output capacitor C3 on the base substrate refers to a maximum distance in the second direction between any point on an edge line of the orthogonal projection of the second electrode D8 of the first transistor T8 on the base substrate and an edge line of the orthogonal projection of the second plate C3b of the output capacitor C3 on the base substrate.

Figure 10A:
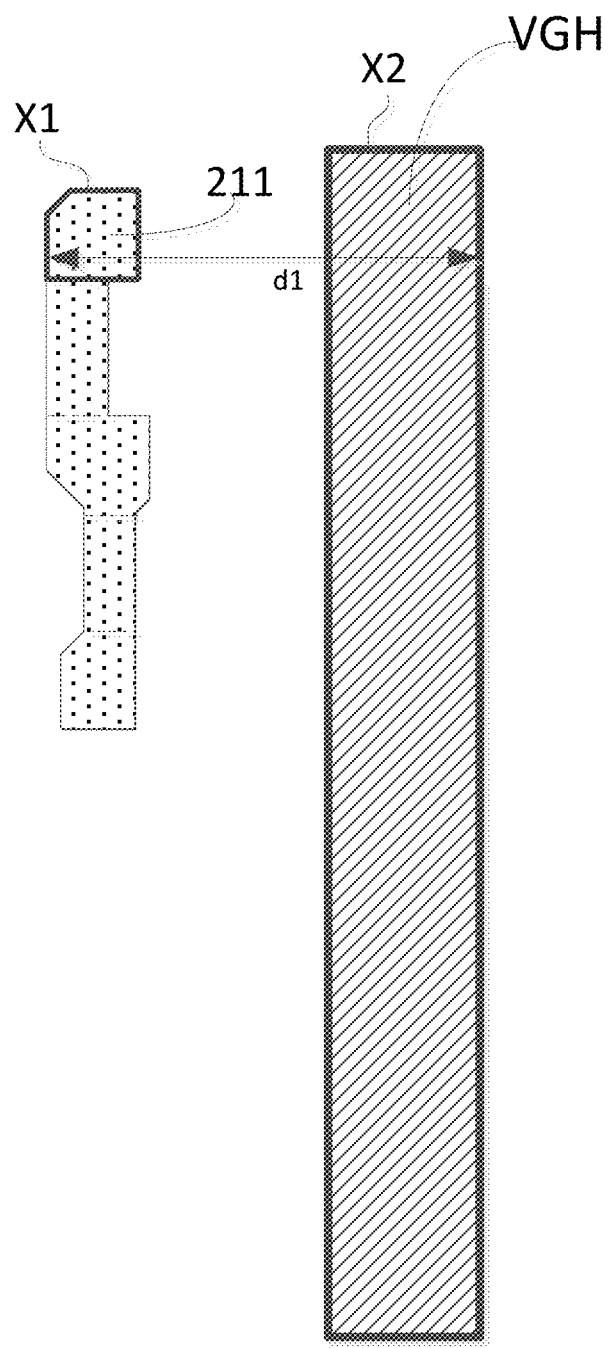
FIG. 10A is a schematic diagram showing a distance between an orthogonal projection of a first voltage signal line VGH on a base substrate and an orthogonal projection of a first third conductive portion 211 serving as a first electrode S8 of a first transistor T8 included in a second semiconductor layer on the base substrate.

In FIG. 10A, only the orthogonal projection of the second semiconductor layer (the second semiconductor layer including the first third conductive portion 211 and the second third conductive portion 212) on the base substrate and the orthogonal projection of the first voltage signal line VGH on the base substrate in FIG. 4 are drawn.

Figure 10B:
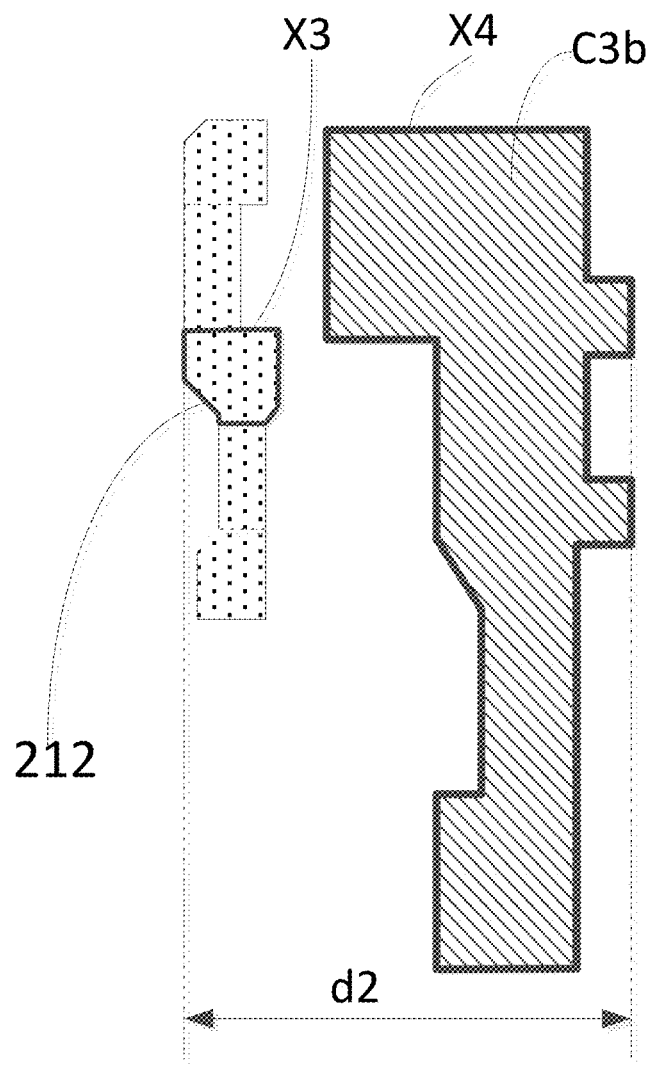
FIG. 10B is a schematic diagram showing a distance between the orthogonal projection of the first voltage signal line VGH on the base substrate and an orthographic projection of a second third conductive portion 212 serving as a second electrode D8 of the first transistor T8 included in the second semiconductor layer on the base substrate.

In FIG. 10B, only the orthogonal projection of the second semiconductor layer (the second semiconductor layer including the first third conductive portion 211 and the second third conductive portion 212) on the base substrate and the orthogonal projection of the second plate of the output capacitor C3 on the base substrate in FIG. 4 are drawn.

In FIGS. 10A and 10B, a reference sign X1 represents the edge line of the orthogonal projection of the first electrode S8 of the first transistor T8 on the base substrate, a reference sign X2 represents the edge line of the orthogonal projection of the first voltage signal line VGH on the base substrate, a reference sign X3 represents the edge line of the orthogonal projection of the second electrode D8 of the first transistor T8 on the base substrate, and a reference sign X4 represents the edge line of the orthogonal projection of the second plate C3b of the output capacitor C3 on the base substrate.

In FIG. 10A, a reference sign d1 represents the maximum distance in the second direction between the orthogonal projection of the first electrode S8 of the first transistor T8 on the base substrate and the orthogonal projection of the first voltage signal line VGH on the base substrate.

In FIG. 10B, a reference sign d2 represents the maximum distance in the second direction between the orthogonal projection of the second electrode D8 of the first transistor T8 on the base substrate and the orthogonal projection of the second plate C3b of the output capacitor C3 on the base substrate.

Specifically, as shown in FIG. 5, the first output reset gate pattern G91 and the second output reset gate pattern G92 included in the gate electrode G9 of the output reset transistor T9 are coupled to the second plate C3b of the output capacitor C3.

As shown in FIGS. 3 and 6, the orthogonal projection of the first plate C3a of the output capacitor C3 on the base substrate at least partially overlaps the orthogonal projection of the second plate C3b of the output capacitor C3 on the base substrate.

In a specific implementation, the display substrate may further include a third voltage signal line, which is located on a side of the first transistor distal to the first voltage signal line and which extends in the first direction.

In at least one embodiment of the present disclosure, the third voltage signal line may be a low voltage signal line, and a low voltage provided by the third voltage signal line may be identical to a low voltage provided by the first voltage signal line, but it is not limited thereto.

Specifically, the first transistor may be provided between the first voltage signal line and the third voltage signal line.

In at least one embodiment of the present disclosure, as shown in FIG. 3, the at least one shift register unit may further include a second transistor T7.

As shown in FIG. 4, an active layer of the first transistor T8 and an active layer of the second transistor T7 are formed by one continuous second semiconductor layer 20, which extends in the first direction.

The active layer of the first transistor T8 includes a first third conductive portion 211, a third channel portion 221, and a second third conductive portion 212 arranged in order along the first direction.

The second third conductive portion 212 is multiplexed into a first fourth conductive portion.

The active layer of the second transistor T7 includes the first fourth conductive portion, a fourth channel portion 241, and a second fourth conductive portion 232 arranged in order along the first direction.

As shown in FIGS. 3 and 8, a second electrode D8 of the first transistor T8 is multiplexed as a first electrode S7 of the second transistor T7.

In at least one embodiment of the present disclosure, the first third conductive portion 211 serves as the first electrode S8 of the first transistor T8, the second third conductive portion 212 serves as the second electrode D8 of the first transistor T8, and the second fourth conductive portion 232 serves as the second electrode D7 of the second transistor T7.

In at least one embodiment of the present disclosure, the second transistor T7 is provided between the first transistor T8 and the first capacitor C1, and the second electrode S8 of the first transistor T8 is multiplexed as the second electrode D7 of the second transistor T7 to reduce the transverse width of the shift register unit while reducing a vertical height of shift register unit.

Optionally, the at least one shift register unit may further include a first capacitor, and a transistor coupled to the second plate of the first capacitor.

The first capacitor and the transistor coupled to the second plate of the first capacitor are both provided on a side of the first voltage signal line distal to the second voltage signal line.

A maximum distance in the second direction between the orthogonal projection of the gate electrode of the transistor coupled to the second plate of the first capacitor on the base substrate and the orthogonal projection of the first voltage signal line on the base substrate is less than a third predetermined distance.

In a specific implementation, since the transistor coupled to the second plate of the first capacitor is also coupled to the first voltage signal line, it is better that the position of the transistor coupled to the second plate of the first capacitor is close to the first voltage signal line. In at least one embodiment of the present disclosure, a maximum distance in the second direction between an orthogonal projection of a gate electrode of the transistor coupled to the second plate of the first capacitor on the base substrate and the orthogonal projection of the first voltage signal line on the base substrate is designed to be smaller than the third predetermined distance to reduce the transverse width of the shift register unit.

In at least one embodiment of the present disclosure, the third predetermined distance may be selected according to actual conditions. For example, the third predetermined distance is greater than or equal to 30 μm (micrometers) and less than or equal to 40 μm.

In at least one embodiment of the present disclosure, the maximum distance in the second direction between the orthogonal projection of the gate electrode of the transistor coupled to the second plate of the first capacitor on the base substrate and the orthogonal projection of the first voltage signal line on the base substrate refers to a distance in the second direction between any point on an edge line of the orthogonal projection of the gate electrode of the transistor coupled to the second plate of the first capacitor on the base substrate, and an edge line of the orthogonal projection of the first voltage signal line on the base substrate.

Specifically, as shown in FIGS. 1 and 3, the transistor coupled to the second plate C1b of the first capacitor C1 may include a first capacitor connecting transistor T6 and a second capacitor connecting transistor T5.

As shown in FIGS. 3 and 5, a gate electrode G6 of the first capacitor connecting transistor T6 and a gate electrode G5 of the second capacitor connecting transistor T5 are coupled to the second plate C1b of the first capacitor C1.

As shown in FIGS. 3, 7 and 8, the at least one shift register unit further includes a first conductive connection portion L1 coupled to the second electrode D6 of the first capacitor connecting transistor T6, an orthogonal projection of the first conductive connection portion L1 on the base substrate has a fifth overlap area with an orthogonal projection of the first plate C1a of the first capacitor C1 on the base substrate, and the first conductive connecting portion L1 is coupled to the first plate C1a of the first capacitor C1 through at least one fifth via hole H5 provided in the fifth overlap area.

In at least one embodiment of the present disclosure, the second electrode S6 of the first capacitor connecting transistor T6 is coupled to the first conductive connection portion L1 through a third connection via hole H83.

Optionally, the first conductive connection portion L1 may be L-shaped, but it is not limited thereto.

Figure 10C:
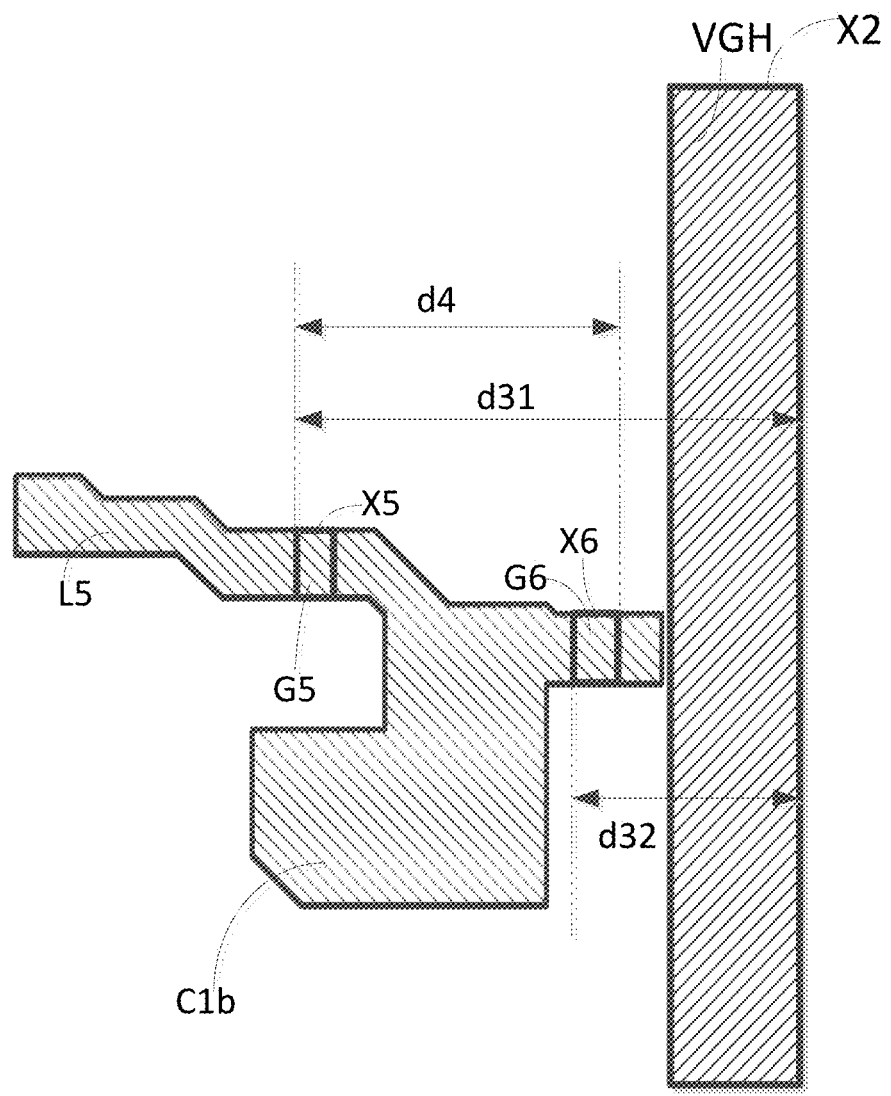
FIG. 10C is a schematic diagram showing distances between an orthogonal projection of a gate electrode G5 of a second capacitor connecting transistor T5 on the base substrate, an orthogonal projection of a gate electrode G6 of a first capacitor connecting transistor T6 on the base substrate, and the orthogonal projection of the first voltage signal line VGH on the base substrate.

In FIG. 10C, only the orthogonal projections of the gate electrode G5 of the second capacitor connecting transistor T5, the gate electrode G6 of the first capacitor connecting transistor T6, the second plate C1b of the first capacitor C1, and the fifth conductive connection portion L5 on the base substrate, and the orthogonal projection of the first voltage signal line VGH on the base substrate are shown.

In FIG. 10C, a reference sign X2 represents an edge line of the orthogonal projection of the first voltage signal line VGH on the base substrate, a reference sign X5 represents an edge line of the orthogonal projection of the gate electrode G5 on the base substrate, and reference X6 represents an edge line of the orthogonal projection of the gate electrode G6 on the base substrate.

As shown in FIG. 10C, a reference sign d3 represents a maximum distance in the second direction between the orthogonal projection of the gate electrode G5 of the second capacitor connecting transistor T5 on the base substrate and the orthogonal projection of the first voltage signal line VGH on the base substrate.

A reference sign d4 represents a maximum distance in the second direction between the orthogonal projection of the gate electrode G6 of the first capacitor connecting transistor T6 on the base substrate and the orthogonal projection of the first voltage signal line VGH on the base substrate.

In at least one embodiment of the present disclosure, as shown in FIGS. 1 and 3, the at least one shift register unit may further include a second transistor T7.

As shown in FIGS. 3, 5, 7 and 8, the at least one shift register unit further includes a gate connection conductive portion 51 coupled to the gate electrode G7 of the second transistor T7, and a first electrode connection conductive portion 52 coupled to the first electrode S6 of the first capacitor connecting transistor T6.

There is a connection overlap area between the gate connection conductive portion 51 and the first electrode connection conductive portion 52.

The gate connection conductive portion 51 is coupled to the first electrode connection conductive portion 52 through an electrode connection via hole H05 provided in the connection overlap area, so that the gate electrode G7 of the second transistor T7 is coupled to the first electrode S6 of the first capacitor connecting transistor T6.

In at least one embodiment of the present disclosure, the first electrode S6 of the first capacitor connecting transistor T6 is coupled to the first electrode connection conductive portion 52 through a fourth connection via hole H84.

The second electrode D7 of the second transistor T7 is coupled to the first conductive connection portion L1.

Specifically, as shown in FIG. 3, the first electrode S5 of the second capacitor connecting transistor T5 may be coupled to the first voltage signal line VGH.

As shown in FIGS. 3 and 10C, a maximum distance d32 in the second direction between the orthogonal projection of the gate electrode G6 of the first capacitor connecting transistor T6 on the base substrate and the orthogonal projection of the first voltage signal line VGH on the base substrate is smaller than a maximum distance d31 in the second direction between the orthogonal projection of the gate electrode of the second capacitor connecting transistor T5 on the base substrate and the orthogonal projection of the first voltage signal line VGH on the base substrate. That is, the second capacitor connecting transistor T5 is provided on a side of the first capacitor connecting transistor T6 distal to the first voltage signal line VGH.

In at least one embodiment of the present disclosure, as shown in FIGS. 3, 4, 7 and 8, the first electrode S5 of the second capacitor connecting transistor T5 is coupled to the signal line conductive connection portion L40 through the fifth connection via hole H85, and the signal line conductive connection portion L40 is coupled to the first voltage signal line VGH, so that the first electrode S5 of the second capacitor connecting transistor T5 is coupled to the first voltage signal line VGH.

Optionally, the signal line conductive connection portion L40 may be L-shaped.

In at least one embodiment of the present disclosure, the orthogonal projection of the signal line conductive connection portion L40 on the base substrate partially overlaps the orthogonal projection of the first plate C1a of the first capacitor C1 on the base substrate.

Preferably, as shown in FIG. 5, a longest distance in the second direction between the gate electrode G6 of the first capacitor connecting transistor T6 and the gate electrode G5 of the second capacitor connecting transistor T5 is less than a fourth predetermined distance.

As shown in FIG. 3, the orthogonal projection of the first plate C1a of the first capacitor C1 on the base substrate falls inside the orthogonal projection of the second plate C1b of the first capacitor C1 on the base substrate.

As shown in FIG. 6, the first plate C1a of the first capacitor C1 is L-shaped.

In at least one embodiment of the present disclosure, the second capacitor connecting transistor T5 and the first capacitor connecting transistor T6 are located at a distance relatively close to each other so as to enable the adjustment of the shape of the plate of the first capacitor C1, and the arrangement of the first plate C1a of the first capacitor C1 to an L shape makes full use of a wiring space between the gate electrode of the second capacitor connecting transistor T5 and the second conductive connection portion, so that the layout is more reasonable, and the transverse width of the shift register unit is effectively reduced and the vertical height of the shift register unit is also reduced.

In at least one embodiment of the present disclosure, the fourth predetermined distance may be selected according to actual conditions. For example, the fourth predetermined distance is greater than or equal to 20 μm (micrometers) and less than or equal to 30 μm.

In at least one embodiment of the present disclosure, the longest distance in the second direction between the gate electrode G6 of the first capacitor connecting transistor T6 and the gate electrode G5 of the second capacitor connecting transistor T5 refers to a maximum distance in the second direction between any point on an edge line of the gate electrode G5 and an edge line of the gate electrode G6. As shown in FIG. 10C, a reference sign d4 refers to a maximum distance in the second direction between any point on the edge line of the gate electrode G5 and the edge line of the gate electrode G6.

In a specific implementation, as shown in FIG. 1, the shift register unit may include a first transistor T8 and a second transistor T7.

Figure 9:
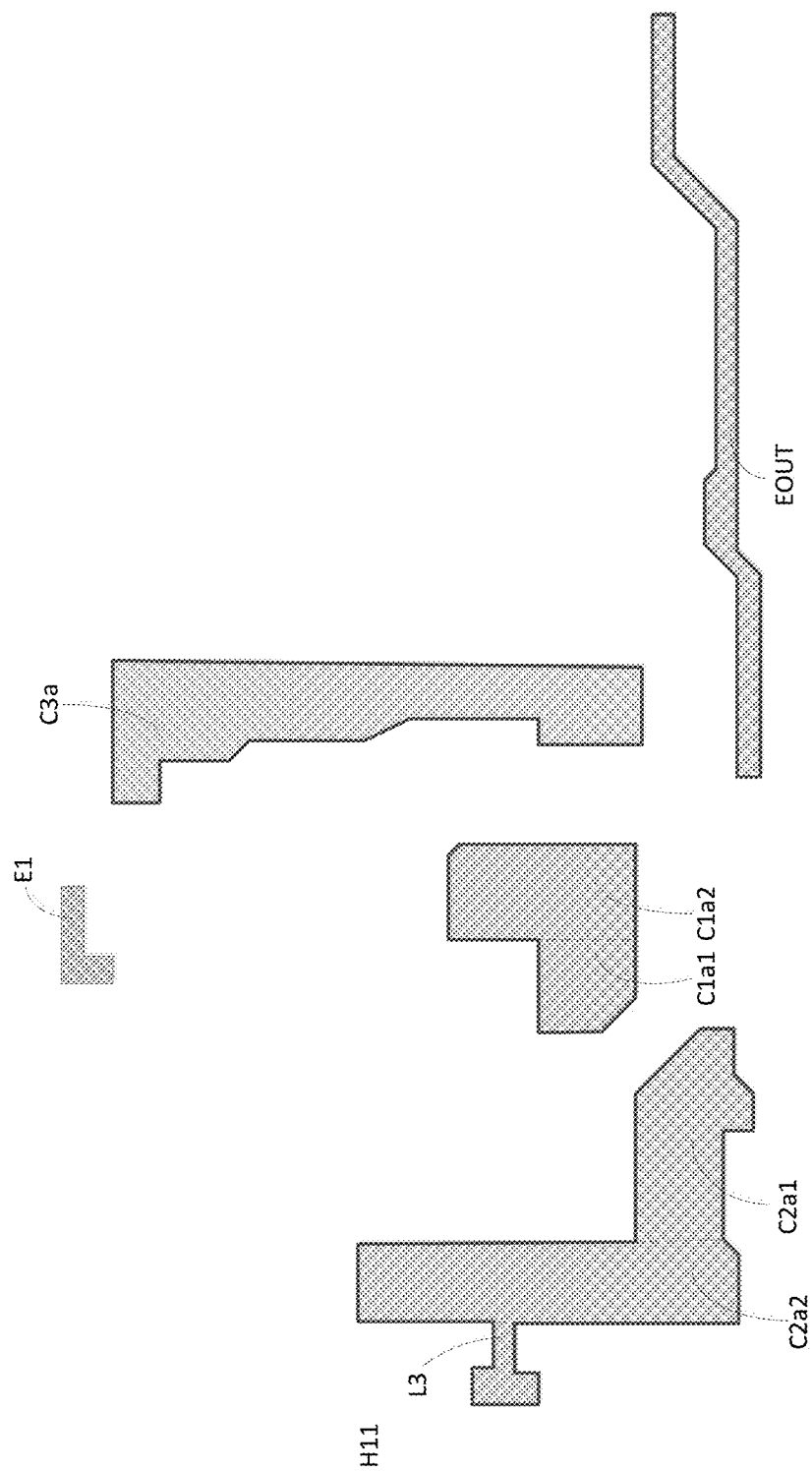
FIG. 9 is a schematic diagram showing the division of plates of a capacitor on the basis of FIG. 6.

As shown in FIG. 9, and based on FIG. 6, the first plate C1a of the first capacitor C1 includes a first horizontal plate portion C1a1 and a first vertical plate portion C1a2.

As shown in FIGS. 3 and 9, the orthogonal projection of the gate electrode G5 of the second capacitor connecting transistor T5 on the base substrate and an orthogonal projection of the first horizontal plate portion C1a1 on the base substrate are arranged along the first direction.

An orthogonal projection of a gate electrode G8 of the first transistor T8 on the base substrate, an orthogonal projection of a gate electrode G7 of the second transistor T7 on the base substrate, and an orthogonal projection of the first vertical plate portion C1a2 on the base substrate are arranged along the first direction.

The orthogonal projection of the first vertical plate portion C1a2 on the base substrate is located between the orthogonal projection of the second electrode D6 of the first capacitor connecting transistor T6 on the base substrate and the orthogonal projection of the first electrode S5 of the second capacitor connecting transistor T5 on the base substrate.

The first electrode S7 of the second transistor T7 is coupled to the second plate C3b of the output capacitor C3.

In at least one embodiment of the present disclosure, a space between the second capacitor connecting transistor T5 and the first capacitor connecting transistor T6 and a space between the gate electrode of the second capacitor connecting transistor T5 and the second conductive connection portion are used for the provision of the first capacitor C1, and the plate of C1 is arranged in an L shape so as to result in a reasonable layout.

In at least one embodiment of the present disclosure, the second electrode D7 of the second transistor T7 is coupled to the first conductive connection portion L1 through a sixth connection via hole H86, so that the second electrode D7 of the second transistor T7 is coupled to the second electrode D6 of the first capacitor connecting transistor T6.

Optionally, as shown in FIG. 1, the at least one shift register unit may further include a first node control transistor T2 and a second capacitor C2.

As shown in FIG. 5, a first gate pattern G21 and a second gate pattern G22 included in the gate electrode of the first node control transistor T2 are each coupled to the second plate C2b of the second capacitor C2.

As shown in FIGS. 3, 5, and 6, the orthogonal projection of the first plate C2a of the second capacitor C2 on the base substrate falls inside an orthogonal projection of the second plate C2b of the second capacitor C2 on the base substrate.

The first plate C2a of the second capacitor C2 is L-shaped.

As shown in FIG. 9, and based on FIG. 6, the first plate C2a of the second capacitor C2 includes a second horizontal plate portion C2a1.

An orthogonal projection of the gate electrode G2 of the first node control transistor T2 on the base substrate, and an orthogonal projection of the second horizontal plate portion C2a1 on the base substrate are arranged along the first direction.

In at least one embodiment of the present disclosure, the plate of the second capacitor C2 is designed to be L-shaped, and a space between the first node control transistor T2 in the $n^{th}$-stage shift register unit and a second node control transistor in the $(n+1)^{th}$-stage shift register unit is used for the placement of the horizontal plate portion included in the plate of the second capacitor C2, so as to reduce the transverse width of the shift register unit.

In at least one embodiment of the present disclosure, as shown in FIGS. 3 and 8, the scan driving circuit further includes a third voltage signal line VGL2, which extends in the first direction.

The first node control transistor T2 is located on a side of the second capacitor connecting transistor T5 distal to the first voltage signal line VGH, and also between the third voltage signal line VGL2 and the first voltage signal line VGH.

As shown in FIG. 9, the first plate C2a of the second capacitor C2 further includes a second vertical plate portion C2a2 coupled to the second horizontal plate portion C2a1, and an orthogonal projection of the second vertical plate portion C2a2 on the base substrate partially overlaps an orthogonal projection of the third voltage signal line VGL2 on the base substrate.

Specifically, the plate of the second capacitor C2 is provided in an L shape, and an orthogonal projection of the second vertical plate portion C2a2 of the second capacitor C2 on the base substrate partially overlaps an orthogonal projection of the third voltage signal line VGL2 on the base substrate, so as to reduce the vertical height of the shift register unit.

As shown in FIGS. 3, 4 and 9, an orthogonal projection of a second active pattern A2 of the first node control transistor T2 on the base substrate and an orthogonal projection of the second horizontal plate portion C2a1 on the base substrate are arranged in order along the first direction, and a space between the second active pattern A2 in the $n^{th}$-stage shift register unit and the $(n+1)^{th}$-stage shift register unit is used for the arrangement of the horizontal plate portion of the second capacitor C2.

As shown in FIGS. 1 and 3, the first clock signal line CB is located on a side of the third voltage signal line VGL2 distal to the first voltage signal line VGH.

The output circuit includes an output transistor T10. As shown in FIG. 5, the at least one shift register unit further includes a second conductive connection portion L2 located between the gate electrode G10 of the output transistor T10 and the second plate C2b of the second capacitor C2. The second conductive connection portion L2 is coupled to the gate electrode G10 of the output transistor T10 and the second plate C2b of the second capacitor C2.

The at least one shift register unit further includes a third conductive connection portion L3 coupled to the first plate C2a of the second capacitor C2.

As shown in FIGS. 3 and 7, an orthogonal projection of the third conductive connection portion L3 on the base substrate has a sixth overlap area between an orthogonal projection of the first clock signal line CB on the base substrate. The first clock signal line CB is coupled to the first plate C2a of the second capacitor C2 through at least one sixth via hole H6 provided in the sixth overlap area.

Optionally, the second conductive connection portion L2 may extend in the second direction for coupling the gate electrode G10 of the output transistor T10 and the second plate C2b of the second capacitor C2.

The third conductive connection portion L3 may extend in the second direction, and is coupled to the first plate C2a of the second capacitor C2 through the sixth via hole H6.

Specifically, as shown in FIGS. 3 and 4, the first capacitor connecting transistor T6 includes a first active pattern A1 which extends in the first direction.

The first active pattern A1 includes a first first capacitor connection conductive portion L111 and a second first capacitor connection conductive portion L112 which are spaced apart along the first direction A1, and a first capacitor connection channel portion L12 located between the first capacitor connection conductive portion L111 and the second first capacitor connection conductive portion L112.

In at least one embodiment of the present disclosure, the first first capacitor connection conductive portion L111 serves as the first electrode S6 of the first capacitor connecting transistor T6, and the second first capacitor connection conductive portion L112 serves as the second electrode D6 of the first capacitor connecting transistor T6.

Optionally, the first active pattern A1 of the first capacitor connecting transistor T6 extends in the first direction, and the first capacitor connecting transistor T6 is provided between the second capacitor connecting transistor T5 and the first voltage signal line VGH to enable a reduction in the transverse width of the shift register unit.

In a specific implementation, as shown in FIGS. 1 and 3, the at least one shift register unit may include a second transistor T7.

The second electrode D7 of the second transistor T7 is coupled to the first conductive connection portion L1.

As shown in FIGS. 3, 7 and 8, the second electrode D7 of the second transistor T7 is coupled to the first conductive connection portion L1 through the sixth connection via hole H86.

Specifically, as shown in FIG. 4, the first node control transistor T2 may include a second active pattern A2, which may be U-shaped.

The second active pattern A2 includes a first first node control channel portion A211, a second first node control channel portion A212, a first first node control conductive portion A221, and a second first node control conductive portion A222.

As shown in FIG. 5, the gate electrode of the first node control transistor T2 includes a first gate pattern G21 and a second gate pattern G22 that are coupled to each other.

The first gate pattern G21 corresponds to the first first node control channel portion A211, and the second gate pattern G22 corresponds to the second first node control channel portion A212.

As shown in FIGS. 3 and 4, the first first node control conductive portion A221 serves as the second electrode D2 of the first node control transistor T2, and the second first node control conductive portion A222 serves as the first electrode S2 of the first node control transistor T2.

As shown in FIGS. 3 and 4, the active pattern of the first node control transistor T2 is configured to have a U-shaped structure, so that the first node control transistor T2 is formed as a dual-gate structure. The dual-gate structure is designed for the purpose as follows: in a second phase P2, when the shift register unit included in the scan driving circuit outputs a high voltage signal Vgh, the output transistor T10 should be completely turned off, and a high level input into the gate electrode of the output transistor T10 is input by a source electrode of the second capacitor connecting transistor T5. Therefore, in the second phase P2, it is necessary to ensure that the second capacitor connecting transistor T5 is turned on, that is, the potential of the second node N2 needs to be at a low voltage. Moreover, in the second phase P2, the potential of the gate electrode of the first node control transistor T2 is at a high voltage, so as to ensure that no current leakage occurs in the first node control transistor T2, which causes a rise in the potential of the second node N2. Therefore, the first node control transistor T2 is configured to adopt a dual-gate design, which makes it easier to turn off the first node control transistor T2.

In an exposure of an actual production, if the active pattern of the first node control transistor T2 is configured in a U shape without missing corners, a metal will be deposited after the exposure, which will cause the U-shaped active pattern to become a V shape. Therefore, in actual products, considering the exposure process of the actual production, a small part of the U-shaped active pattern in two right-angled portions inside the U-shaped active pattern is removed for compensation, so that the actual pattern is formed to be U-shaped as much as possible, and does not affect a ratio of width to length of the first node control transistor T2.

In at least one embodiment of the present disclosure, as shown in FIGS. 1 and 3, the at least one shift register unit may further include a second node control transistor T3, and a second capacitor connecting transistor T5.

As shown in FIGS. 4 and 8, a second electrode D3 of the second node control transistor T3 and the second electrode D2 of the first node control transistor T2 are coupled through a fourth conductive connection portion L4.

As shown in FIGS. 3, 4, 5 and 8, the at least one shift register unit further includes a fifth conductive connection portion L5 coupled to the gate electrode G5 of the second capacitor connecting transistor T5, and there is a seventh overlap area between an orthogonal projection of the fifth conductive connection portion L5 on the base substrate and an orthogonal projection of the fourth conductive connection portion L4 on the base substrate.

The fifth conductive connection portion L5 is coupled to the fourth conductive connection portion L4 through a seventh via hole H7 provided in the seventh overlap area.

In a specific implementation, as shown in FIGS. 3, 4, 7 and 8, the second electrode D3 of the second node control transistor T3 is coupled to the fourth conductive connection portion L4 through a seventh connection via hole H87, and the second electrode D2 of the first node control transistor T2 is coupled to the fourth conductive connection portion L4 through an eighth connection via hole H88, so that the second electrode D3 of the second node control transistor T3 is coupled to the second electrode D2 of the first node control transistor T2.

In at least one embodiment of the present disclosure, the fourth conductive connection portion L4 may extend in the first direction to reduce the transverse width of the shift register unit.

In a specific implementation, as shown in FIGS. 1 and 3, the display substrate may further include a third voltage signal line VGL2, which is provided on a side of the second node control transistor T3 distal to the first voltage signal line VGH.

As shown in FIGS. 3, 4, and 5, the first electrode S2 of the first node control transistor T2 is coupled to a sixth conductive connection portion L6, and the gate electrode G3 of the second node control transistor T3 is coupled to the seventh conductive connection portion L7.

There is an eighth overlap area between an orthogonal projection of the sixth conductive connection portion L6 on the base substrate and an orthogonal projection of the seventh conductive connection portion L7 on the base substrate, and the sixth conductive connection portion L6 is coupled to the seventh conductive connection portion L7 through an eighth via hole H8 provided in the eighth overlap area.

The first electrode S3 of the second node control transistor T3 is coupled to the third voltage signal line VGL2.

As shown in FIGS. 3 and 7, the first electrode S2 of the first node control transistor T2 is coupled to the sixth conductive connection portion L6 through a ninth connection via hole H89, and the sixth conductive connection portion L6 may extend in the first direction to reduce the transverse width of the shift register unit.

As shown in FIG. 5, the gate electrode G3 of the second node control transistor T3 is coupled to the seventh conductive connection portion L7, and the sixth conductive connection portion L6 is coupled to the conductive connection portion L7 through the eighth via hole H8 provided in the eighth overlap area, so that the first electrode S2 of the first node control transistor T2 is coupled to the gate electrode G3 of the second node control transistor T3.

As shown in FIG. 4, the second node control transistor T3 includes a third active pattern A3, which includes a first control conductive portion A311, a control channel portion A32, and a second control conductive portion A312.

The first control conductive portion A311 serves as the first electrode S3 of the second node control transistor T3, and the second control conductive portion A312 serves as the second electrode D3 of the second node control transistor T3.

As shown in FIG. 5, the gate electrode G3 of the second node control transistor T3 is also coupled to the eighth conductive connection portion L8. As shown in FIG. 3, there is a ninth overlap area between an orthogonal projection of the eighth conductive connection portion L8 on the base substrate and an orthogonal projection of the second clock signal line CK on the base substrate. As shown in FIG. 7, the eighth conductive connection portion L8 is coupled to the second clock signal line CK through a ninth via hole H9 provided in the ninth overlap area.

Since the gate electrode of the second node control transistor T3 is coupled to the second clock signal line CK, the gate electrode of the second node control transistor T3 can be configured close to the second clock signal line CK for a reasonable layout.

Specifically, as shown in FIGS. 1 and 3, the scan driving circuit may include a first clock signal line CB and a third voltage signal line VGL2, which are extend in the first direction.

The second clock signal line CK is provided between the first clock signal line CB and the third voltage signal line VGL2.

Optionally, the first clock signal line may also be provided between the second clock signal line and the third voltage signal line.

In a specific implementation, as shown in FIGS. 1 and 3, the at least one shift register unit may further include an input transistor T1.

As shown in FIG. 5, a gate electrode G1 of the input transistor T1 is coupled to the seventh conductive connection portion L7. As shown in FIG. 3, the first electrode S1 of the input transistor T1 is coupled to an input signal terminal E1.

A second electrode D1 of the input transistor T1 is coupled to a ninth conductive connection portion L9, and there is a tenth overlap area between an orthogonal projection of the ninth conductive connection portion L9 on the base substrate and an orthogonal projection of the second plate C2b of the second capacitor C2 on the base substrate, and the ninth conductive connection portion L9 is coupled to the second plate C2b of the second capacitor C2 through the tenth via hole H10 provided in the tenth overlap area.

As shown in FIGS. 3, 4, 6, 7 and 8, a first electrode S1 of the input transistor T1 is coupled to an input conductive connection portion L70 through the ninth connection via hole H89, and the input conductive connection portion L70 is coupled to the input signal terminal E1 through the tenth connection via hole H810, so that the first electrode S1 of the input transistor T1 is coupled to the input signal terminal E1.

As shown in FIGS. 3, 4, 6, 7 and 8, the second electrode D1 of the input transistor T1 is coupled to a ninth conductive connection portion L9, and the ninth conductive connection portion L9 is coupled to the second plate C2b of the second capacitor C2 through the tenth via hole H10 of the tenth overlap area, so that the second electrode D1 of the input transistor T1 is coupled to the second plate C2b of the second capacitor C2.

In at least one embodiment of the present disclosure, the ninth conductive connection portion L9 may extend in the first direction to reduce the transverse width of the shift register unit.

In at least one embodiment of the present disclosure, as shown in FIGS. 1 and 3, the at least one shift register unit may further include a third node control transistor T4.

As shown in FIG. 5, a gate electrode G4 of the third node control transistor T4 is coupled to a tenth conductive connection portion L10.

As shown in FIGS. 3 and 7, there is an eleventh overlap area between an orthogonal projection of the tenth conductive connection portion L10 on the base substrate and an orthogonal projection of the first clock signal line CB on the base substrate, and the tenth conductive connecting portion L10 is coupled to the first clock signal line CB through an eleventh via hole H11 provided in the eleventh overlap area.

Optionally, the tenth conductive connection portion L10 may be arranged along the second direction, but it is not limited thereto.

Specifically, as shown in FIGS. 1 and 3, the at least one shift register includes a second transistor T7.

As shown in FIG. 5, a gate electrode G4 of the third node control transistor T4 is coupled to a gate electrode G7 of the second transistor T7.

Since the gate electrode G4 of the third node control transistor T4 and the gate electrode G7 of the second transistor T7 need to be coupled, the third node control transistor T4 and the second transistor T7 can be configured close to each other during the layout.

In at least one embodiment of the present disclosure, as shown in FIGS. 1 and 3, the at least one shift register unit may include a second capacitor connecting transistor T5.

As shown in FIG. 4, an active layer of the input transistor T1, an active layer of the third node control transistor T4, and an active layer of the second capacitor connecting transistor T5 may be formed by one continuous third semiconductor layer 30.

The active layer of the input transistor T1 includes a first fifth conductive portion 311, a fifth channel portion 32, and a second fifth conductive portion 312 arranged in order along the first direction.

The second fifth conductive portion 312 is multiplexed as a first sixth conductive portion.

The active layer of the third node control transistor T4 includes a first sixth conductive portion, a sixth channel portion 34, and a second sixth conductive portion 332 arranged in order along the first direction.

The second sixth conductive portion 332 is multiplexed as the first seventh conductive portion.

The active layer of the second capacitor connecting transistor T5 includes a first seventh conductive portion, a seventh channel portion 36, and a second seventh conductive portion 352 that are arranged in order along the first direction.

In at least one embodiment of the present disclosure, as shown in FIGS. 3 and 4, the first fifth conductive portion 311 serves as the first electrode S1 of the input transistor T1, the second fifth conductive portion 312 serves as the second electrode D1 of the input transistor T1, the second sixth conductive portion 332 serves as the first electrode S4 of the third node control transistor T4, and the second seventh conductive portion 352 serves as the first electrode S5 of the second capacitor connecting transistor T5.

Moreover, as shown in FIG. 3, the second electrode D1 of the input transistor T1 is multiplexed as the second electrode D4 of the third node control transistor T4, and the first electrode S4 of the third node control transistor T4 is multiplexed as the second electrode D5 of the second capacitor connecting transistor T5. That is, in the display substrate according to at least one embodiment of the present disclosure, in the input transistor T1, the third node control transistor T4, and the second capacitor connecting transistor T5, the transistors which are adjacent to each other can be directly coupled to each other through the conductive portion included in the third semiconductor layer 30, which reduces the area occupied by the input transistor T1, the third node control transistor T4, and the second capacitor connecting transistor T5 in the first direction.

Specifically, the scan driving circuit may further include a third voltage signal line.

The third voltage signal line, the first clock signal line, and the second clock signal line all extend in the first direction.

An orthogonal projection of the third voltage signal line on the base substrate, an orthogonal projection of the first clock signal line on the base substrate, and an orthogonal projection of the second clock signal line on the base substrate are all located on a side of the orthogonal projection of the shift register unit on the base substrate distal to the display area of the display substrate.

The signal output line extends in a second direction, which intersects the first direction.

Specifically, specific positions of the first clock signal line, the second clock signal line, and the third voltage signal line can be designed according to actual needs. For example, the first clock signal line, the second clock signal line and the third voltage signal line are all arranged at an edge of the display substrate, so that an orthogonal projection of the third voltage signal line on the base substrate, an orthogonal projection of the first clock signal line on the base substrate and an orthogonal projection of the second clock signal line on the base substrate are all located on a side of an orthogonal projection of the shift register unit on the base substrate distal to the display area of the display substrate. In this way, when the shift register unit is laid out, the transistors in the shift register unit can be prevented from excessively overlapping the first clock signal line, the second clock signal line, and the third voltage signal line, which is more conducive to the improvement in the operation performance of the shift register unit.

In addition, by arranging the first clock signal line, the second clock signal line, and the third voltage signal line to extend in the first direction, it is more conducive to the narrowed bezel of the display substrate.

In a specific implementation, a first clock signal output by the first clock signal line may have an opposite phase to a second clock signal output by the second clock signal line, but it is not limited thereto.

In a specific implementation, as shown in FIGS. 1 and 3, the scan driving circuit may include a first voltage signal line VGH, a second voltage signal line VGL1, a third voltage signal line VGL2, a first clock signal line CB, and a second clock signal line CK. The at least one shift register unit may further include a signal output line EOUT, an output capacitor C3, a first capacitor C1, a second capacitor C2, an output reset transistor T9, an output transistor T10, a first transistor T8, a second transistor T7, a first capacitor connecting transistor T6, a second capacitor connecting transistor T5, a first node control transistor T2, a second node control transistor T3, the input transistor T1, and the third node control transistor T4.

The output reset transistor T9 and the output transistor T10 are arranged along a first direction.

A first electrode S9 of the output reset transistor T9 is coupled to the first voltage signal line VGH, and a first electrode S10 of the output transistor T10 is coupled to the second voltage signal line VGL1.

The output transistor T10 and the signal output line EOUT are arranged along the first direction, and a second electrode D9 of the output reset transistor T9 and a second electrode D10 of the output transistor T10 are both coupled to the signal output line EOUT.

The signal output line EOUT extends in a second direction, which intersects the first direction.

A second electrode D8 of the first transistor T8 is coupled to a second plate C3b of the output capacitor C3, a first electrode S8 of the first transistor T8 is coupled to the first voltage signal line VGH, and a gate electrode G8 of the first transistor T8 is coupled to a second electrode D4 of the third node control transistor T4.

A second electrode D7 of the second transistor T7 is coupled to a first plate C1a of the first capacitor C1, a first electrode S7 of the second transistor T7 is coupled to the second plate C3b of the output capacitor C3, and a gate electrode G7 of the second transistor T7 is coupled to a gate electrode G4 of the third node control transistor T4.

A gate electrode G6 of the first capacitor connecting transistor T6 and a gate electrode G5 of the second capacitor connecting transistor T5 are coupled to a second plate C1b of the first capacitor C1, a second electrode D6 of the first capacitor connecting transistor T6 is coupled to the first plate C1a of the first capacitor C1, and a first electrode S6 of the first capacitor connecting transistor T6 is coupled to the gate electrode G7 of the second transistor T7.

A first electrode S5 of the second capacitor connecting transistor T5 is coupled to the first voltage signal line VGH, the gate electrode G5 of the second capacitor connecting transistor T5 is coupled to a second electrode D3 of the second node control transistor T3, and a second electrode D5 of the second capacitor connecting transistor T5 is coupled to the first electrode S4 of the third node control transistor T4.

A first electrode S2 of the first node control transistor T2 is coupled to a gate electrode G3 of the second node control transistor T3, and a gate electrode G2 of the first node control transistor T2 is coupled to a second plate C2b of the second capacitor C2.

The second electrode D3 of the second node control transistor T3 is coupled to a second electrode D2 of the first node control transistor T2, the gate electrode G3 of the second node control transistor T3 is coupled to the second clock signal line CK, and a first electrode S3 of the second node control transistor T3 is coupled to the third voltage signal line VGL2.

A gate electrode G1 of the input transistor T1 is coupled to the gate electrode G3 of the second node control transistor T3, a first electrode S1 of the input transistor T1 is coupled to an input signal terminal E1, and a second electrode D1 of the input transistor T1 is coupled to the second plate C2b of the second capacitor C2.

The gate electrode G4 of the third node control transistor T4 is coupled to the first clock signal line CB.

A first plate C3a of the output capacitor C3 is coupled to the first voltage signal line VGH, and the second plate C3b of the output capacitor C3 is coupled to a gate electrode G9 of the output reset transistor T9.

The second plate C2b of the second capacitor C2 is coupled to a gate electrode G10 of the output transistor T10, and the first plate C2a of the second capacitor C2 is coupled to the first clock signal line CB.

The second electrode D9 of the output reset transistor T9 and the second electrode D10 of the output transistor T10 are both coupled to the signal output line EOUT.

In at least one embodiment of the present disclosure, the first clock signal line, the second clock signal line, and the third voltage signal line are arranged in order along a direction getting closer to the display area; or alternatively, the second clock signal line, the first clock signal line, and the third voltage signal line are arranged in order along the direction getting closer to the display area.

As shown in FIG. 9 and based on FIG. 6, the first plate C1a of the first capacitor C1 may include a first horizontal plate portion C1a1 and a first vertical plate portion C1a2.

As shown in FIG. 3, the output reset transistor T9 and the output transistor T10 are provided between the first voltage signal line VGH and the second voltage signal line VGL1. The output reset transistor T9, the output transistor T10, and the signal output line EOUT are arranged in order along the first direction.

The third voltage signal line VGL2 is provided on a side of the first voltage signal line VGH distal to the second voltage signal line VGL1, and the first capacitor C1, the first transistor T8, the second transistor T7, the first capacitor connecting transistor T6, the second capacitor connecting transistor T5, the first node control transistor T2, the second node control transistor T3, the input transistor T1 and the third node control transistor T4 are all provided between the first voltage signal line VGH and the third voltage signal line VGL2.

The first transistor T8, the second transistor T7, and the first vertical plate portion C1a2 are arranged in order along the first direction. The input transistor T1, the third node control transistor T4, the second capacitor connecting transistor T5 and the first horizontal plate portion C1a1 are arranged in order along the first direction, and the second node control transistor T3 and the first node control transistor T2 are arranged in order along the first direction.

An orthogonal projection of the gate electrode G6 of the first capacitor connecting transistor T6 on the base substrate is located between an orthogonal projection of the second plate C1b of the first capacitor C1 on the base substrate and an orthogonal projection of the first voltage signal line VGH on the base substrate.

An orthogonal projection of the gate electrode G7 of the second transistor T7 on the base substrate is located between an orthogonal projection of the gate electrode G4 of the third node control transistor T4 on the base substrate and an orthogonal projection of the first voltage signal line VGH on the base substrate.

An orthogonal projection of the gate electrode G2 of the first node control transistor T2 on the base substrate is located between an orthogonal projection of the third voltage signal line VGL2 on the base substrate and an orthogonal projection of the first plate C1a of the first capacitor C1 on the base substrate.

A minimum distance in the second direction between the orthogonal projection of the gate electrode G2 of the first node control transistor T2 on the base substrate and the orthogonal projection of the third voltage signal line VGL2 on the base substrate is greater than a minimum distance in the second direction between an orthogonal projection of the gate electrode G5 of the second capacitor connecting transistor T5 on the base substrate and the orthogonal projection of the third voltage signal line VGL2 on the base substrate.

In the layout shown in FIG. 3 of the present disclosure, since the output reset transistor T9 is coupled to the first voltage signal line VGH, and the output transistor T10 is coupled to the second voltage signal line VGL1, the output reset transistor T9 and the output transistor T10 are located between the first voltage signal line VGH and the second voltage signal line VGL1, and a space between the output transistor T10 in the $n^{th}$-stage shift register unit and the output reset transistor in the $(n+1)^{th}$-stage shift register unit is utilized for the provision of the signal output line EOUT, so that the first voltage signal line VGH is provided on a side of the output circuit O1 distal to the display area, no other signal lines or components included in the other transistors are provided between the first voltage signal line VGH and the output circuit O1, the second voltage signal line VGL1 is provided on a side of the output circuit O1 proximal to the display area, and no other signal lines or components included in the other transistors are provided between the second voltage signal line VGL1 and the output circuit O1, which reduces distances from the first voltage signal line VGH to the output reset transistor T9 and the output transistor T10 as well as distances from the second voltage signal line VGL1 to the output reset transistor T9 and the output transistor T10. Thus, the transverse width of the shift register unit is reduced.

In the layout shown in FIG. 3 of the present disclosure, the first transistor T8 is moved to the side of the first voltage signal line VGH distal to the second voltage signal line VGL1, and an orthogonal projection of the plate of the output capacitor C3 on the base substrate is designed to partially overlap the orthogonal projection of the first voltage signal line VGH on the base substrate so as to reduce the distance between the first electrode S8 of the first transistor T8 and the first voltage signal line VGH, as well as the distance between the second electrode D8 of the first transistor T8 and the second plate C3b of the output capacitor C3, so that the first transistor T8 can be easily coupled to the first voltage signal line VGH and the second plate C3b of the output capacitor C3. Thus, the space is compact and the layout is more reasonable.

In the layout shown in FIG. 3 of the present disclosure, the second capacitor connecting transistor T5 and the first capacitor connecting transistor T6 are located at a distance close to each other so that the shape of the plate of the first capacitor C1 can be adjusted, and the first plate C1a of the first capacitor C1 is configured in an L shape, which makes full use of a wiring space between the gate electrode of the second capacitor connecting transistor T5 and the second conductive connection portion so as to make the layout more reasonable, effectively reduce the transverse width of the shift register unit, and reduce the vertical height of the shift register unit.

In at least one embodiment of the present disclosure, the minimum distance in the second direction between the orthogonal projection of the gate electrode G2 of the first node control transistor T2 on the base substrate and the orthogonal projection of the third voltage signal line VGL2 on the base substrate refers to a minimum distance in the second direction between any point on an edge line of the orthogonal projection of G2 on the base substrate and an edge line of the orthogonal projection of VGL2 on the base substrate.

The minimum distance in the second direction between the orthogonal projection of the gate electrode G5 of the second capacitor connecting transistor T5 on the base substrate and the orthogonal projection of the third voltage signal line VGL2 on the base substrate refers to a minimum distance in the second direction between any point on an edge line of the orthogonal projection of the gate electrode G5 on the base substrate and the edge line of the orthogonal projection of VGL2 on the base substrate. In a specific implementation, the orthogonal projection of the first plate C3a of the output capacitor C3 on the base substrate has a signal line overlap area with the orthogonal projection of the first voltage signal line VGH on the base substrate, and the orthogonal projection of the second plate C3b of the output capacitor C3 partially overlaps the orthogonal projection of the first voltage signal line VGH on the base substrate.

The orthogonal projection of the first plate C2a of the second capacitor C2 on the base substrate falls inside the orthogonal projection of the second plate C2b of the second capacitor C2 on the base substrate, and the first plate C2a of the second capacitor C2 is L-shaped.

As shown in FIG. 9, the first plate C2a of the second capacitor C2 includes a second horizontal plate portion C2a1 and a second vertical plate portion C2a2.

The gate electrode G2 of the first node control transistor T2 and the second horizontal plate portion C2a1 are arranged along the first direction.

The orthogonal projection of the second vertical plate portion C2a2 on the base substrate partially overlaps the orthogonal projection of the third voltage signal line VGL2 on the base substrate.

In the layout shown in FIG. 3 of the present disclosure, the plate of C2 is configured in an L shape, and a space between the first node control transistor T2 in the $n^{th}$-stage shift register unit and the $(n+1)^{th}$-stage shift register unit is utilized for the placement of the horizontal plate portion of the plate of C2 to reduce the transverse width of the shift register unit.

In at least one embodiment of the present disclosure, a first gate insulating layer may be further provided between a semiconductor layer shown in FIG. 4 and a first gate metal layer shown in FIG. 5, a second gate insulating layer may be further provided between the first gate metal layer shown in FIG. 5 and a second gate metal layer shown in FIG. 6, and an insulating layer may be further contained between the second gate metal layer shown in FIG. 6 and a source-drain metal layer shown in FIG. 8.

When manufacturing the display substrate described in at least one embodiment of the present disclosure, a semiconductor material layer is first provided on a base substrate, and subjected to a patterning process to form active layers of the respective transistors. As shown in FIG. 4, the first semiconductor layer 10, the second semiconductor layer 20, the third semiconductor layer 30, a first active pattern A1 included in the first capacitor connecting transistor T6, a second active pattern A2 included in the first node control transistor T2 and a third active pattern A3 included in the second node control transistor T3 are formed.

A first gate insulating layer is made on a side of the active layer facing away from the base substrate.

A first gate metal layer is made on a side of the first gate insulating layer facing away from the active layer, and subjected to a patterning process to form gate electrodes of the transistors, the second plate of the output capacitor C3, the second plate of the first capacitor C1 and the second plate of the second capacitor C2 included in the shift register unit, as shown in FIG. 5.

A portion of the active layer that is not covered by the gate electrodes by using the gate electrodes of the transistors as a mask is doped, so that the portion of the active layer that is not covered by the gate electrodes is formed as a conductive portion, and a portion of the active layer that is covered by the gate electrodes is formed as a channel portion. The conductive portion serves as a first electrode or a second electrode; or, the conductive portion is coupled to the first electrode or the second electrode.

A second gate insulating layer is provided on a side of the first gate metal layer facing away from the first gate metal layer.

A second gate metal layer is provided on a side of the second gate insulating layer facing away from the first gate metal layer, and subjected to a patterning process to form a signal output line EOUT, an input signal terminal R1, a first plate of an output capacitor C3, a first plate of a first capacitor C1 and a first plate of a second capacitor C2 as shown in FIG. 6.

An insulating layer is provided on a side of the second gate metal layer facing away from the second gate insulating layer.

A plurality of via holes is provided in the base substrate where the active layer, the first gate insulating layer, the first gate metal layer, the second gate insulating layer, the second gate metal layer and the insulating layer have been provided, as shown in FIG. 7.

A source-drain metal layer is provided on a side of the insulating layer facing away from the second gate metal layer, and subjected to a patterning process to form a first voltage signal line VGH, a second voltage signal line VGL1, a third voltage signal line VGL2, a first clock signal line CB, a second clock signal line CB, a starting signal line ESTV, a second electrode of the output reset transistor T9, a first electrode S9 of the output reset transistor T9, a second electrode D10 of the output transistor T10, and a first electrode S10 of the output transistor T10, as shown in FIG. 8.

The manufacturing method of the display substrate according to at least one embodiment of the present disclosure includes making a scan driving circuit on a base substrate, and making at least one driving transistor in a display area included in the display substrate, and the driving transistor is configured to drive a light-emitting element for display.

The scan driving circuit includes a plurality of shift register units, a first voltage signal line, a second voltage signal line, a first clock signal line, and a second clock signal line, and at least one of the plurality of shift register units includes an output circuit and a signal output line.

The manufacturing method of the display substrate further includes: making a transistor included in the output circuit between the first voltage signal line and the second voltage signal line; and providing the first voltage signal line, the second voltage signal line, the first clock signal line, and the second clock signal line to extend in a first direction, and providing the signal output line to extend in a second direction which intersects the first direction.

In the manufacturing method of the display substrate according to at least one embodiment of the present disclosure, the output circuit is provided between the first voltage signal line and the second voltage signal line, so that in a spatial structure, the first voltage signal line is provided on a side of the output circuit distal to the display area, and no other signal lines or components included in the other transistors are provided between the first voltage signal line and the output circuit. Furthermore, the second voltage signal line is provided on a side of the output circuit proximal to the display area, and no other signal lines or components included in the other transistors are provided between the second voltage signal line and the output circuit. Therefore, it is possible to reduce a distance from the first voltage signal line to the output circuit as well as a distance from the second voltage signal line to the output circuit, so that the transverse width of the shift register unit is reduced.

In at least one embodiment of the present disclosure, the first voltage signal line may be located on a side of the second voltage signal line distal to the display area.

Optionally, the manufacturing method of the display substrate according to at least one embodiment of the present disclosure may further include arranging the signal output line between output circuits in adjacent ones of the shift register units.

In a specific implementation, if the output circuit is coupled to the signal output line, the output circuit should be closer to the signal output line. In at least one embodiment of the present disclosure, the signal output line is moved down between the output circuits of the adjacent shift register units to reduce the transverse width of the shift register unit.

Optionally, the output circuit may include an output transistor and an output reset transistor, and the making the transistor included in the output circuit specifically includes:

i. forming a first semiconductor layer extending in a first direction between the first voltage signal line and the second voltage signal line;
ii. making a first gate metal layer on a side of the first semiconductor layer facing away from the base substrate, and subjecting the first gate metal layer to a patterning process to form a gate electrode of the output transistor and a gate electrode of the output reset transistor; and
iii. doping a portion of the first semiconductor layer that is not covered by the gate electrodes by using the gate electrode of the output transistor and the gate electrode of the output reset transistor as a mask so that the portion of the first semiconductor layer that is not covered by the gate electrodes forms a conductive portion, and a portion of the first semiconductor layer that is covered by the gate electrodes forms a channel portion.

In a specific implementation, an active layer of the output transistor and an active layer of the output reset transistor may be formed by one continuous first semiconductor layer, but it is not limited thereto.

In at least one embodiment of the present disclosure, the active layer of the output transistor and the active layer of the output reset transistor may be formed by one continuous first semiconductor layer which extends in the first direction. The active layer of the output reset transistor includes at least two first conductive portions which are spaced apart along a first direction, and at least one first channel portion each provided between two adjacent ones of the first conductive portions. The active layer of the output transistor may include at least two second conductive portions which are spaced apart along the first direction, and at least one second channel portion each provided between two adjacent ones of the second conductive portions. A first conductive portion of the active layer of the output reset transistor that is closest to the active layer of the output transistor can be multiplexed as a second conductive portion of the output transistor, which can further reduce the layout space of the output transistor and the output reset transistor and is thus beneficial to the realization of the narrow bezel of the display substrate.

In a specific implementation, the manufacturing method of the display substrate may further include: providing a second gate metal layer on a side of the first gate metal layer facing away from the first semiconductor layer, and subjecting the second gate metal layer to a patterning process to form a signal output line extending in the second direction. An orthogonal projection of the first semiconductor layer on the base substrate and an orthogonal projection of the signal output line on the base substrate are arranged along the first direction, which intersects the second direction.

In at least one embodiment of the present disclosure, the orthogonal projection of the first semiconductor layer on the base substrate and the orthogonal projection of the signal output line on the base substrate are arranged along the first direction, which can reduce the transverse width of the shift register unit.

In at least one embodiment of the present disclosure, making the first voltage signal line, the second voltage signal line, the first clock signal line, and the second clock signal line may include: making a source-drain metal layer on a side of the second gate metal layer facing away from the first gate metal layer, and subjecting the source-drain metal layer to a patterning process to form the first voltage signal line, the second voltage signal line, the first clock signal line, and the second clock signal line.

Optionally, the at least one shift register unit may further include an output capacitor and a first transistor, and the manufacturing method of the display substrate may further include: making the output capacitor, and forming a first transistor on a side of the first voltage signal line distal to the second voltage signal line so as to allow a first electrode of the first transistor to be coupled to the first voltage signal line, and a second electrode of the first transistor to be coupled to a plate of the output capacitor.

Preferably, a maximum distance in the second direction between an orthogonal projection of the first electrode of the first transistor on the base substrate and an orthogonal projection of the first voltage signal line on the base substrate is smaller than a first predetermined distance, and a maximum distance in the second direction between an orthogonal projection of the second electrode of the first transistor on the base substrate and an orthogonal projection of the plate of the output capacitor on the base substrate is smaller than a second predetermined distance.

In at least one embodiment of the present disclosure, since the first electrode of the first transistor is coupled to the first voltage signal line and the second electrode of the first transistor is coupled to a second plate of the output capacitor, when manufacturing the display substrate, the closer the first transistor is to the first voltage signal line and the output capacitor, the more reasonable the corresponding layout will be. In at least one embodiment of the present disclosure, the first transistor is provided on a side of the first voltage signal line distal to the second voltage signal line, and a maximum distance in the second direction between the orthogonal projection of the first electrode of the first transistor on the base substrate and the orthogonal projection of the first voltage signal line on the base substrate is smaller than a first predetermined distance, and a maximum distance in the second direction between the orthogonal projection of the second electrode of the first transistor on the base substrate and the orthogonal projection of the plate of the output capacitor on the base substrate is smaller than a second predetermined distance, so as to result in a reasonable layout.

Optionally, the at least one shift register unit may further include a second transistor, and the making the first transistor and the second transistor specifically includes:
  forming a second semiconductor layer extending in the first direction on the side of the first voltage signal line distal to the second voltage signal line;
  making a first gate metal layer on a side of the second semiconductor layer facing away from the base substrate, and subjecting the first gate metal layer to a patterning process to form a gate electrode of the first transistor and a gate electrode of the second transistor; and
  doping a portion of the second semiconductor layer that is not covered by the gate electrodes by using the gate electrode of the output transistor and the gate electrode of the output reset transistor as a mask so that the portion of the first semiconductor layer that is not covered by the gate electrodes forms a conductive portion, and a portion of the first semiconductor layer that is covered by the gate electrodes forms a channel portion.

The second semiconductor layer includes a third conductive portion, a third channel portion, a second third conductive portion, a fourth channel portion, and a second fourth conductive portion arranged in order along the first direction.

The second third conductive portion is multiplexed as the first fourth conductive portion.

The first third conductive portion serves as the first electrode of the first transistor, the second third conductive portion serves as the second electrode of the first transistor, and the second fourth conductive portion serves as the second electrode of the second transistor.

In a specific implementation, a plate of the output capacitor coupled to the second electrode of the first transistor may be the second plate of the output capacitor, and specific steps of making the output capacitor include:

subjecting the first gate metal layer to a patterning process to form the second plate of the output transistor;

making a second gate metal layer on a side of the first gate metal layer facing away from the second semiconductor layer, and subjecting the second gate metal layer to a patterning process to form a first plate of the output capacitor; and making a source-drain metal layer on a side of the second gate metal layer facing away from the first gate metal layer, and subjecting the source-drain metal layer to a patterning process to form a plate conductive connection portion, the first voltage signal Line and the second voltage signal line.

An orthogonal projection of the first plate of the output capacitor on the base substrate has a signal line overlap area with an orthogonal projection of the first voltage signal line on the base substrate, and the first plate of the output capacitor is coupled to the first voltage signal line through at least one signal line via hole provided in the signal line overlap area.

An orthogonal projection of the plate conductive connection portion on the base substrate has a plate overlap area with an orthogonal projection of the second plate of the output capacitor on the base substrate, and the plate conductive connection portion is coupled to the second plate of the output capacitor through at least one plate via hole in the plate overlap area.

In at least one embodiment of the present disclosure, the active layer of the first transistor and the active layer of the second transistor may be formed by one continuous second semiconductor layer which extends in the first direction. The active layer of the first transistor includes a first third conductive portion, a third channel portion, and a second third conductive portion arranged in order along the first direction. The second third conductive portion is multiplexed as a first fourth conductive portion. The active layer of the second transistor includes the first fourth conductive portion, a fourth channel portion, and a second fourth conductive portion arranged in order along the first direction. The first third conductive portion serves as the first electrode of the first transistor, the second third conductive portion serves as the second electrode of the first transistor, and the second fourth conductive portion serves as the second electrode of the second transistor. In at least one embodiment of the present disclosure, the second transistor is provided between the first transistor and the first capacitor, and the second electrode of the first transistor is multiplexed as the second electrode of the second transistor to reduce the vertical height of the shift register unit while reducing the transverse width of the shift register unit.

Optionally, the at least one shift register unit may further include a first capacitor, and at least two transistors coupled to a second plate of the first capacitor. The manufacturing method of the display substrate may further include: making the first capacitor and the at least two transistors on a side of the first voltage signal line distal to the second voltage signal line.

Maximum distances in the second direction between orthogonal projections of gate electrodes of the at least two transistors on the base substrate and the orthogonal projection of the first voltage signal line on the base substrate are smaller than a third predetermined distance.

In a specific implementation, since the transistor coupled to the second plate of the first capacitor is also coupled to the first voltage signal line, it is better for the transistor coupled to the second plate of the first capacitor to be positioned close to the first voltage signal line. In at least one embodiment of the present disclosure, a maximum distance in the second direction between an orthogonal projection of a gate electrode of the transistor coupled to the second plate of the first capacitor on the base substrate and the orthogonal projection of the first voltage signal line on the base substrate is designed to be smaller than the third predetermined distance to reduce the transverse width of the shift register unit.

In a specific implementation, the at least two transistors include a first capacitor connecting transistor and a second capacitor connecting transistor.

Specific steps of making the first capacitor connecting transistor and the second capacitor connecting transistor include:

forming active layers of the first capacitor connecting transistor and the second capacitor connecting transistor on the base substrate;

making a first gate metal layer on a side of the active layers facing away from the base substrate, and subjecting the first gate metal layer to a patterning process to form a gate electrode of the first capacitor connecting transistor, a gate electrode of the second capacitor connecting transistor, and the second plate of the first capacitor in such a manner that the gate electrode of the first capacitor connecting transistor and the gate electrode of the second capacitor connecting transistor are coupled to the second plate of the first capacitor;

doping portions of the active layers that are not covered by the gate electrodes by using the gate electrode of the first capacitor connecting transistor and the gate electrode of the second capacitor connecting transistor as a mask, so that the portions of the active layers that are not covered by the gate electrodes are formed as conductive portions, and portions of the active layer that are covered by the gate electrodes are formed as channel portions, wherein the active layer of the first capacitor connecting transistor includes a first first capacitor connection conductive portion, a first capacitor connection channel portion, and a second first capacitor connection conductive portion that are arranged in order along a first direction; the active layer of the second capacitor connecting transistor includes a first seventh conductive portion, a seventh channel portion and a second seventh conductive portion that are arranged in order along the first direction; the first first capacitor connection conductive portion serves as the first electrode of the first capacitor connecting transistor, and the second first capacitor connection conductive portion serves as the second electrode of the first capacitor connecting transistor;

making a second gate metal layer on the side of the first gate metal layer facing away from the active layer, and subjecting the second gate metal layer to a patterning process to form the first plate of the first capacitor; and making a source-drain metal layer on a side of the second gate metal layer facing away from the first gate metal layer, and subjecting the source-drain metal layer to a patterning process to form the first voltage signal line, the second voltage signal line, and a first conductive connection portion.

There is a fifth overlap area between an orthogonal projection of the first conductive connection portion on the base substrate and an orthogonal projection of the first plate of the first capacitor on the base substrate, and the first conductive connection portion passes is coupled to the first plate of the first capacitor through at least one fifth via hole provided in the fifth overlap area.

In at least one embodiment of the present disclosure, the first seventh conductive part may serve as the second electrode of the second capacitor connecting transistor, the second seventh conductive part may serve as the first electrode of the second capacitor connecting transistor, and the second capacitor of the second capacitor connecting transistor is coupled to the first voltage signal line. A distance in the second direction between an orthogonal projection of the gate electrode of the first capacitor connecting transistor on the base substrate and the orthogonal projection of the first voltage signal line on the base substrate is smaller than a distance in the second direction between an orthogonal projection of the gate electrode of the second capacitor connecting transistor on the base substrate and the orthogonal projection of the first voltage signal line on the base substrate.

In a specific implementation, the distance in the second direction between the orthogonal projection of the gate electrode of the first capacitor connecting transistor on the base substrate and the orthogonal projection of the first voltage signal line on the base substrate is smaller than the distance in the second direction between the orthogonal projection of the gate electrode of the second capacitor connecting transistor on the base substrate and the orthogonal projection of the first voltage signal line on the base substrate, that is, the second capacitor connecting transistor is provided on a side of the first capacitor connecting transistor distal to the first voltage signal line.

Preferably, a longest distance in the second direction between the gate electrode of the first capacitor connecting transistor and the gate electrode of the second capacitor connecting transistor is smaller than a fourth predetermined distance.

An orthogonal projection of the first plate of the first capacitor on the base substrate falls inside an orthogonal projection of the second plate of the first capacitor on the base substrate, and the first plate of the first capacitor is L-shaped.

In at least one embodiment of the present disclosure, the first capacitor connecting transistor and the second capacitor connecting transistor are located at a distance close to each other so that the shape of the plate of the first capacitor can be adjusted, and the first plate of the first capacitor is configured in an L shape, which makes full use of a wiring space between the gate electrode of the second capacitor connecting transistor and the second conductive connection portion, so as to make the layout more reasonable, effectively reduce the transverse width of the shift register unit, and reduce the vertical height of the shift register unit.

Optionally, the at least one shift register unit may further include a first node control transistor and a second capacitor.

The step of making the first node control transistor and the second capacitor may include:
  forming an active layer of the first node control transistor on the base substrate while forming the active layer of the first capacitor connecting transistor and the active layer of the second capacitor connecting transistor on the base substrate;
  subjecting the first gate metal layer to a patterning process to form a gate electrode of the first node control transistor and a second plate of the second capacitor in such a manner that the gate electrode of the first node control transistor is coupled to the second plate of the second capacitor;
  doping a portion of the active layer of the first node control transistor that is not covered by the gate electrode of the first node control transistor by using the gate electrode of the first node control transistor as a mask;
  subjecting the second gate metal layer to a patterning process to form a first plate of the second capacitor in such a manner that an orthogonal projection of the first plate of the second capacitor on the base substrate falls inside an orthogonal projection of the second plate of the second capacitor on the base substrate, and the first plate of the second capacitor is L-shaped.

The first plate of the second capacitor includes a second horizontal plate portion, and an orthogonal projection of the gate electrode of the first node control transistor on the base substrate and an orthogonal projection of the second horizontal plate portion on the base substrate are arranged along the first direction.

In at least one embodiment of the present disclosure, the first plate of the second capacitor is provided in an L shape, and a space between the first node control transistor and a next adjacent stage shift register unit is used for the placement the horizontal plate portion included in the first plate of the second capacitor so as to reduce the transverse width of the shift register unit.

Optionally, the manufacturing method of the display substrate described in at least one embodiment of the present disclosure may further include: subjecting the source-drain metal layer to a patterning process to form a third voltage signal line extending in the first direction.

The first node control transistor is located on a side of the second capacitor connecting transistor distal to the first voltage signal line, and the first node control transistor is located between the third voltage signal line and the first voltage signal line.

The first plate of the second capacitor further includes a second vertical plate portion coupled to the second horizontal plate portion, and an orthogonal projection of the second vertical plate portion on the base substrate partially overlaps an orthogonal projection of the third voltage signal line on the base substrate.

Specifically, the first plate of the second capacitor is provided in an L shape, and the orthogonal projection of the second vertical plate portion of the second capacitor on the base substrate overlaps the orthogonal projection of the third voltage signal line on the base substrate to reduce the vertical height of the shift register unit.

Optionally, the number of the first voltage signal line is one, the output circuit includes an output reset transistor, and the at least one shift register unit further includes an output capacitor, a first plate, and a second capacitor connecting transistor. The manufacturing method of the display substrate further includes: providing a first electrode of the output reset transistor, a first plate of the output capacitor, the first electrode of the first transistor, and a first electrode of the second capacitor connecting transistor to be all coupled to the first voltage signal lines to reduce the number of voltage signal lines used and facilitate the layout.

The display device according to at least one embodiment of the present disclosure includes the display substrate as described above.

Since the display substrate provided by the foregoing embodiment can realize a narrow bezel, the display device provided by at least one embodiment of the present disclosure can also achieve the beneficial effect of having a narrow bezel when it includes the foregoing display substrate, and this will not be repeated here.

The display device provided by at least one embodiment of the present disclosure may be any product or component having a display function, such as a mobile phone, a tablet computer, a television, a monitor, a notebook computer, a digital photo frame, a navigator, etc.

Unless otherwise defined, technical or scientific terms used in the present disclosure should have the same meaning as commonly understood by those having ordinary skills in the art to which the present disclosure pertains. Terms such as "first" and "second" used in the present disclosure are used merely to distinguish different constituent components rather than to indicate any sequence, number or importance. The terms "comprising", "including" or other variants thereof are intended to means that the element or item stated before such terms encompasses elements, items and equivalents thereof listed after these terms without excluding other elements or items not expressly listed. The terms "connected to", "coupled to" "coupled with" or the like are not intended to be limited to physical or mechanical connection, but may include an electrical connection, either direct or indirect. Such words as "up", "down", "left" and "right" are merely used to represent a relative positional relationship, and when an absolute position of the described object is changed, the relative position relationship will be changed accordingly.

It will be understood that when an element such as a layer, a film, an area or a substrate is referred to as being "on" or "under" another element, it can be directly "on" or "under" the other element, or intervening elements may be present.

In the description of the foregoing embodiments, specific features, structures, materials, or characteristics may be combined in any one or more embodiments or examples in an appropriate manner.

The above are the preferred embodiments of the present disclosure. It should be pointed out that for those of ordinary skill in the art, several improvements and modifications can be made without departing from the principle of the present disclosure, and these improvements and modifications should also be regarded as falling within the protection scope of this disclosure.

What is claimed is:

1. A display substrate, comprising a scan driving circuit and a display area provided on a base substrate, the scan driving circuit comprising a plurality of shift register units and further comprising a first voltage signal line, a second voltage signal line, a first clock signal line, and a second clock signal line, all of which extend in a first direction, and the display area comprising at least one driving transistor configured to drive a light-emitting element for display;

wherein at least one of the plurality of shift register units comprises an output circuit and a signal output line, wherein the output circuit is coupled to the first voltage signal line, the second voltage signal line, and the signal output line, and the signal output line extends in a second direction intersecting the first direction;

wherein an orthogonal projection of one or more transistors included in the output circuit on the base substrate is provided between an orthogonal projection of the first voltage signal line on the base substrate and an orthogonal projection of the second voltage signal line on the base substrate;

wherein the at least one of the plurality of shift register units further comprises an output capacitor, a first transistor, a first node control transistor, a second node control transistor, and a third node control transistor;

wherein a second electrode of the first transistor is coupled to one of a first plate and a second plate of the output capacitor, a first electrode of the first transistor is coupled to the first voltage signal line that is configured to provide a high-level signal, and a gate electrode of the first transistor is coupled to one of a first electrode and a second electrode of the third node control transistor;

wherein the output circuit comprises an output transistor and an output reset transistor, which are arranged along the first direction;

a first electrode of the output reset transistor is coupled to the first voltage signal line, and a first electrode of the output transistor is coupled to the second voltage signal line;

a second electrode of the output transistor and a second electrode of the output reset transistor are both coupled to the signal output line;

wherein active layers of the output transistor and the output reset transistor are formed by one continuous first semiconductor layer; and the first semiconductor layer and the signal output line are arranged along the first direction, wherein a gate electrode of the output reset transistor comprises at least one output reset gate pattern, the first electrode of the output reset transistor comprises at least one first electrode pattern, and the second electrode of the output reset transistor comprises at least one second electrode pattern;

the output reset gate pattern is located between the first electrode pattern and the second electrode pattern, which are adjacent to each other; and the second electrode pattern, the output reset gate pattern, and the first electrode pattern all extend in the second direction intersecting the first direction, or wherein a gate electrode of the output transistor comprises at least one output gate pattern, the first electrode of the output transistor comprises at least one third electrode pattern, and the second electrode of the output transistor comprises at least one fourth electrode pattern;

the output gate pattern is located between the third electrode pattern and the fourth electrode pattern, which are adjacent to each other;

the fourth electrode pattern, the output gate pattern, and the third electrode pattern all extend in the second direction intersecting the first direction; and the second electrode pattern in the output reset transistor that is closest to the gate electrode of the output transistor is multiplexed as the fourth electrode pattern of the output transistor.

2. The display substrate according to claim 1, wherein the active layer of the output reset transistor comprises at least two first conductive portions which are spaced apart along the first direction, and at least one first channel portion each provided between two adjacent ones of the first conductive portions;

the first channel portion(s) corresponds to the output reset gate pattern(s) in a one-to-one relationship, and an orthogonal projection of each of the first channel portions on the base substrate falls inside an orthogonal projection of a corresponding one of the output reset gate patterns on the base substrate;

a part of the first conductive portions in the output reset transistor corresponds to the first electrode patterns in a one-to-one relationship, and an orthogonal projection of the first electrode pattern on the base substrate has a first overlap area with an orthogonal projection of a corresponding one of the first conductive portions on the base substrate, and the first electrode pattern is coupled to the corresponding first conductive portion through at least one first via hole provided in the first overlap area;

the other part of the first conductive portions in the output reset transistor corresponds to the second electrode patterns in a one-to-one relationship, and an orthogonal projection of the second electrode pattern on the base substrate has a second overlap area with an orthogonal projection of a corresponding one of the first conductive portions on the base substrate, and the second electrode pattern is coupled to the corresponding first conductive portion through at least one second via hole provided in the second overlap area, or wherein:

an active layer of the output transistor comprises at least two second conductive portions which are spaced apart along the first direction, and at least one second channel portion each provided between two adjacent ones of the second conductive portions;

the second channel portion(s) corresponds to the output gate pattern(s) in a one-to-one relationship, and an orthogonal projection of each of the second channel portions on the base substrate falls inside an orthogonal projection of a corresponding one of the output gate patterns on the base substrate;

a part of the second conductive portions in the output transistor corresponds to the third electrode patterns in a one-to-one relationship, and an orthogonal projection of the third electrode pattern on the base substrate has a third overlap area with an orthogonal projection of a corresponding one of the second conductive portions on the base substrate, and the third electrode pattern is coupled to the corresponding second conductive portion through at least one third via hole provided in the third overlap area;

the other part of the second conductive portions in the output transistor corresponds to the fourth electrode patterns in a one-to-one relationship, and an orthogonal projection of the fourth electrode pattern on the base substrate has a fourth overlap area with an orthogonal projection of a corresponding one of the second conductive portions on the base substrate, and the fourth electrode pattern is coupled to the corresponding second conductive portion through at least one fourth via hole in the fourth overlap area.

3. The display substrate according to claim 2, wherein a number of the first voltage signal line is one;

the output circuit comprises an output reset transistor, and the at least one shift register unit further comprises an output capacitor, a first transistor, and a capacitor connecting transistor for connecting a second capacitor; and a first electrode of the output reset transistor, a first plate of the output capacitor, a first electrode of the first transistor, and a first electrode of the capacitor connecting transistor are all coupled to the first voltage signal line.

4. The display substrate according to claim 3, further comprising a third voltage signal line, wherein the first voltage signal line is located between the second voltage signal line and the third voltage signal line.

5. The display substrate according to claim 3, wherein the first electrode of the capacitor connecting transistor is coupled to a signal line conductive connection portion through a fifth via hole, and the signal line conductive connection portion is coupled to the first voltage signal line so as to allow the first electrode of the capacitor connecting transistor to be coupled to the first voltage signal line; and the signal line conductive connection portion and the first voltage signal line are contained in a source-drain metal layer, and the first electrode of the capacitor connecting transistor is contained in an active layer.

6. The display substrate according to claim 5, wherein the at least one shift register unit further comprises a first capacitor; and an orthogonal projection of the signal line conductive connection portion on the base substrate partially overlaps an orthogonal projection of a first plate of the first capacitor on the base substrate.

7. The display substrate according to claim 5, wherein the at least one shift register unit further comprises a first node control transistor and the second capacitor;

a gate electrode of the first node control transistor is coupled to a second plate of the second capacitor;

an orthogonal projection of a first plate of the second capacitor on the base substrate falls inside an orthogonal projection of the second plate of the second capacitor on the base substrate;

the first plate of the second capacitor is L-shaped;

the first plate of the second capacitor comprises a horizontal plate portion; and an orthogonal projection of the gate electrode of the first node control transistor on the base substrate and an orthogonal projection of the horizontal plate portion on the base substrate are arranged in the first direction.

8. The display substrate according to claim 7, wherein the scan driving circuit further comprises a third voltage signal line, which extends in the first direction and located on a side of the first voltage signal line distal to the second voltage signal line; and the first node control transistor is located between the third voltage signal line and the first voltage signal line;

the first plate of the second capacitor further comprises a vertical plate portion coupled with the horizontal plate portion, and an orthogonal projection of the vertical plate portion on the base substrate partially overlaps an orthogonal projection of the third voltage signal line on the base substrate.

9. The display substrate according to claim 8, wherein the first clock signal line is located on a side of the third voltage signal line distal to the first voltage signal line;

the output circuit comprises an output transistor, and the at least one shift register unit further comprises a first conductive connection portion, which is provided between a gate electrode of the output transistor and the second plate of the second capacitor, and which is coupled to the gate electrode of the output transistor and the second plate of the second capacitor;

the at least one shift register unit further comprises a second conductive connection portion coupled with the second plate of the second capacitor;

an orthogonal projection of the second conductive connection portion on the base substrate has an overlap area where an orthogonal projection of the first clock signal line on the base substrate exists, and the first clock signal line is coupled to the first plate of the second capacitor through at least one via hole provided in the overlap area where the orthogonal projection of the first clock signal line on the base substrate exists.

10. The display substrate according to claim 7, wherein the first node control transistor comprises an active pattern, which is U-shaped;
the active pattern comprises a first first node control channel portion, a second first node control channel portion, a first first node control conductive portion coupled to the first first node control channel portion, and a second first node control conductive portion coupled to the second first node control channel portion;
the gate electrode of the first node control transistor comprises a first gate pattern and a second gate pattern that are coupled to each other;
the first gate pattern corresponds to the first first node control channel portion, and the second gate pattern corresponds to the second first node control channel portion;
the first first node control conductive portion corresponds to a second electrode of the first node control transistor, and the second first node control conductive portion corresponds to a first electrode of the first node control transistor.

11. The display substrate according to claim 7, wherein the at least one shift register unit further comprises a second node control transistor and the capacitor connecting transistor;
a second electrode of the second node control transistor and a second electrode of the first node control transistor are coupled through a conductive connection portion;
the at least one shift register unit further comprises a second conductive connection portion coupled to a gate electrode of the capacitor connecting transistor, and an orthogonal projection of the second conductive connection portion on the base substrate has an overlap area where an orthogonal projection of the conductive connection portion on the base substrate exists;
the second conductive connection portion is coupled to the conductive connection portion through a via hole provided in the overlap area where the orthogonal projection of the conductive connection portion on the base substrate exists.

12. The display substrate according to claim 11, wherein the scan driving circuit further comprises a third voltage signal line, which is located on a side of the first voltage signal line distal to the second voltage signal line;
a first electrode of the first node control transistor is coupled to a third conductive connection portion, and a gate electrode of the second node control transistor is coupled to a fourth conductive connection portion;
there is an overlap area located between an orthogonal projection of the third conductive connection portion on the base substrate and an orthogonal projection of the fourth conductive connection portion on the base substrate, and the third conductive connection portion is coupled to the fourth conductive connection portion through a via hole provided in the overlap area located between the orthogonal projection of the third conductive connection portion on the base substrate and the orthogonal projection of the fourth conductive connection portion on the base substrate; and a first electrode of the second node control transistor is coupled to the third voltage signal line.

13. The display substrate according to claim 12, wherein a gate electrode of the second node control transistor is further coupled to a fifth conductive connection portion, and there is an overlap area located between an orthogonal projection of the fifth conductive connection portion on the base substrate and an orthogonal projection of the second clock signal line on the base substrate, and the fifth conductive connection portion is coupled to the second clock signal line through a via hole provided in the overlap area located between the orthogonal projection of the fifth conductive connection portion on the base substrate and the orthogonal projection of the second clock signal line on the base substrate.

14. The display substrate according to claim 13, wherein the at least one shift register unit further comprises an input transistor;
a first electrode of the input transistor is coupled to an input signal terminal;
a second electrode of the input transistor is coupled to a sixth conductive connection portion, and there is an overlap area located between an orthogonal projection of the sixth conductive connection portion on the base substrate and an orthogonal projection of the second plate of the second capacitor on the base substrate, and the sixth conductive connection portion is coupled to the second plate of the second capacitor through a via hole provided in the overlap area located between the orthogonal projection of the sixth conductive connection portion on the base substrate and the orthogonal projection of the second plate of the second capacitor on the base substrate.

15. The display substrate according to claim 7, wherein the at least one shift register unit further comprises a node control transistor, a second capacitor connecting transistor and an input transistor;
a gate electrode of the node control transistor is coupled to the first clock signal line;
an active layer of the input transistor, an active layer of the node control transistor, and an active layer of the second capacitor connecting transistor are formed by one continuous semiconductor layer;
the active layer of the input transistor comprises a first conductive portion of the active layer of the input transistor, a channel portion of the active layer of the input transistor, and a second conductive portion of the active layer of the input transistor arranged in order along the first direction;
the second conductive portion of the active layer of the input transistor is multiplexed as a first conductive portion of the active layer of the node control transistor;
the active layer of the node control transistor comprises the first conductive portion of the active layer of the node control transistor, a channel portion of the active layer of the node control transistor, and a second conductive portion of the active layer of the node control transistor arranged in order along the first direction;
the second conductive portion of the active layer of the node control transistor is multiplexed as a first conductive portion of the active layer of the second capacitor connecting transistor;
the active layer of the second capacitor connecting transistor comprises the first conductive portion of the active layer of the second capacitor connecting transistor, a channel portion of the active layer of the second capacitor connecting transistor, and a second conductive portion of the active layer of the second capacitor connecting transistor arranged in order along the first direction.

16. The display substrate according to claim 3, wherein an orthogonal projection of the first plate of the output capacitor on the base substrate has a signal line overlap area with an orthogonal projection of the first voltage signal line on the base substrate, and the first plate of the output capacitor is coupled to the first voltage signal line through at least one signal line via hole provided in the signal line overlap area.

17. A display substrate, comprising a scan driving circuit and a display area provided on a base substrate, the scan driving circuit comprising a plurality of shift register units and further comprising a first voltage signal line, a second voltage signal line, a first clock signal line, and a second clock signal line, all of which extend in a first direction, and the display area comprising at least one driving transistor configured to drive a light-emitting element for display;
   wherein at least one of the plurality of shift register units comprises an output circuit and a signal output line, wherein the output circuit is coupled to the first voltage signal line, the second voltage signal line, and the signal output line, and the signal output line extends in a second direction intersecting the first direction;
   wherein an orthogonal projection of one or more transistors included in the output circuit on the base substrate is provided between an orthogonal projection of the first voltage signal line on the base substrate and an orthogonal projection of the second voltage signal line on the base substrate;
   wherein the at least one of the plurality of shift register units further comprises an output capacitor, a first transistor, a first node control transistor, a second node control transistor, and a third node control transistor;
   wherein a second electrode of the first transistor is coupled to one of a first plate and a second plate of the output capacitor, a first electrode of the first transistor is coupled to the first voltage signal line that is configured to provide a high-level signal, and a gate electrode of the first transistor is coupled to one of a first electrode and a second electrode of the third node control transistor;
   wherein the output circuit comprises an output transistor and an output reset transistor, which are arranged along the first direction;
   a first electrode of the output reset transistor is coupled to the first voltage signal line, and a first electrode of the output transistor is coupled to the second voltage signal line;
   a second electrode of the output transistor and a second electrode of the output reset transistor are both coupled to the signal output line;
   wherein the scan driving circuit further comprises a third voltage signal line, and the at least one shift register unit further comprises a first capacitor, a second capacitor, a second transistor, a first capacitor connecting transistor, a second capacitor connecting transistor, and an input transistor
   a first electrode of the second transistor is coupled to a first plate of the first capacitor, a second electrode of the second transistor is coupled to a second electrode of the first capacitor connecting transistor, and a gate electrode of the second transistor is coupled to a gate electrode of the third node control transistor;
   a gate electrode of the first capacitor connecting transistor and a gate electrode of the second capacitor connecting transistor are coupled to a second plate of the first capacitor, the second electrode of the first capacitor connecting transistor is coupled to the first plate of the first capacitor, and a first electrode of the first capacitor connecting transistor is coupled to the gate electrode of the second transistor;
   a first electrode of the second capacitor connecting transistor is coupled to the first voltage signal line, the gate electrode of the second capacitor connecting transistor is coupled to a second electrode of the second node control transistor, and a second electrode of the second capacitor connecting transistor is coupled to the other one of the first electrode and the second electrode of the third node control transistor;
   a first electrode of the first node control transistor is coupled to a gate electrode of the second node control transistor, and a gate electrode of the first node control transistor is coupled to a second plate of the second capacitor;
   a second electrode of the second node control transistor is coupled to a second electrode of the first node control transistor, the gate electrode of the second node control transistor is coupled to the second clock signal line, and a first electrode of the second node control transistor is coupled to the third voltage signal line;
   a gate electrode of the input transistor is coupled to a gate electrode of the second node control transistor, a first electrode of the input transistor is coupled to an input signal terminal, and a second electrode of the input transistor is coupled to the second plate of the second capacitor;
   the gate electrode of the third node control transistor is coupled to the first clock signal line;
   the other one of the first plate and the second plate of the output capacitor is coupled to the first voltage signal line, and the second plate of the output capacitor is coupled to a gate electrode of the output reset transistor;
   the second plate of the second capacitor is coupled to a gate electrode of the output transistor, and a first plate of the second capacitor is coupled to the first clock signal line;
   a second electrode of the output transistor and a second electrode of the output reset transistor are both coupled to the signal output line.

18. The display substrate according to claim 17, wherein the first clock signal line, the second clock signal line, and the third voltage signal line are arranged in order along a direction getting closer to the display area; or, the second clock signal line, the first clock signal line, and the third voltage signal line are arranged in order along the direction getting closer to the display area.

19. The display substrate according to claim 17, wherein the first plate of the first capacitor comprises a first horizontal plate portion and a first vertical plate portion;
   the output transistor and the output reset transistor are provided between the first voltage signal line and the second voltage signal line, and the output reset transistor, the output transistor and the signal output lines are arranged in order along the first direction;
   the third voltage signal line is provided on a side of the first voltage signal line distal to the second voltage signal line; and the first capacitor, the first transistor, the second transistor, the first capacitor connecting transistor, the second capacitor connecting transistor, the first node control transistor, the second node control transistor, the input transistor and the third node control transistor are all provided between the first voltage signal line and the third voltage signal line;

the first transistor, the second transistor, and the first vertical plate portion are arranged in order along the first direction, the input transistor, the third node control transistor, the second capacitor connecting transistor, and the first horizontal plate portion are arranged in order along the first direction, and the second node control transistor and the first node control transistor are arranged in order along the first direction;

an orthogonal projection of the gate electrode of the first capacitor connecting transistor on the base substrate is located between an orthogonal projection of the second plate of the first capacitor on the base substrate and an orthogonal projection of the first voltage signal line on the base substrate;

an orthogonal projection of the gate electrode of the second transistor on the base substrate is located between an orthogonal projection of the gate electrode of the third node control transistor on the base substrate and an orthogonal projection of the first voltage signal line on the base substrate;

an orthogonal projection of the gate electrode of the first node control transistor on the base substrate is located between an orthogonal projection of the third voltage signal line on the base substrate and an orthogonal projection of the first plate of the first capacitor on the base substrate;

a minimum distance in the second direction between the orthogonal projection of the gate electrode of the first node control transistor on the base substrate and the orthogonal projection of the third voltage signal line on the base substrate is greater than a minimum distance in the second direction between the orthogonal projection of the gate electrode of the second capacitor connecting transistor on the base substrate and the orthogonal projection of the third voltage signal line on the base substrate.

20. The display substrate according to claim 19, wherein:

an orthogonal projection of the first plate of the output capacitor on the base substrate has a signal line overlap area with the orthogonal projection of the first voltage signal line on the base substrate, and an orthogonal projection of the output capacitor on the base substrate partially overlaps the orthogonal projection of the first voltage signal line on the base substrate;

an orthogonal projection of the first plate of the second capacitor on the base substrate falls inside an orthogonal projection of the second plate of the second capacitor on the base substrate, and the first plate of the second capacitor is L-shaped;

the first plate of the second capacitor comprises a second horizontal plate portion and a second vertical plate portion;

the gate electrode of the first node control transistor and the second horizontal plate portion are arranged along the first direction; and an orthogonal projection of the second vertical plate portion on the base substrate partially overlaps the orthogonal projection of the third voltage signal line on the base substrate.

* * * * *